(12) United States Patent
Choi et al.

(10) Patent No.: US 11,757,015 B2
(45) Date of Patent: Sep. 12, 2023

(54) SEMICONDUCTOR DEVICES

(71) Applicant: SAMSUNG ELECTRONICS CO., LTD., Suwon-si (KR)

(72) Inventors: Seunghoon Choi, Yongin-si (KR); Ilyoung Yoon, Hwaseong-si (KR); Ilsu Park, Seoul (KR); Kiho Bae, Seoul (KR); Boun Yoon, Seoul (KR); Yooyong Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 60 days.

(21) Appl. No.: 17/196,321

(22) Filed: Mar. 9, 2021

(65) Prior Publication Data

US 2022/0069101 A1    Mar. 3, 2022

(30) Foreign Application Priority Data

Aug. 31, 2020    (KR) .................... 10-2020-0110056

(51) Int. Cl.
*H01L 29/423*    (2006.01)
*H01L 29/49*    (2006.01)
*H01L 21/8234*    (2006.01)

(52) U.S. Cl.
CPC .. *H01L 29/4966* (2013.01); *H01L 21/823443* (2013.01); *H01L 21/823475* (2013.01); *H01L 29/42372* (2013.01)

(58) Field of Classification Search
CPC ......... H01L 29/06; H01L 29/08; H01L 29/49; H01L 29/51; H01L 29/66; H01L 29/518; H01L 29/417; H01L 29/4983; H01L 29/66719; H01L 29/66689; H01L 29/6653; H01L 29/6656; H01L 29/66553; H01L 29/423; H01L 29/775; H01L 29/768; H01L 29/4966; H01L 29/42372; H01L 29/0847; H01L 29/0673; H01L 29/41766; H01L 29/42392; H01L 29/66439;

(Continued)

(56) References Cited

U.S. PATENT DOCUMENTS 6,376,351 B1    4/2002    Tsai
6,387,765 B2    5/2002    Chhagan et al.
(Continued)

FOREIGN PATENT DOCUMENTS

KR    10-2007-0097806 A    10/2007
KR    10-1751695 B1    6/2017
KR    10-2019-0053739 A    5/2019

*Primary Examiner* — Chuong A Luu
(74) *Attorney, Agent, or Firm* — Lee IP Law, P.C.

(57) ABSTRACT

A semiconductor device including a substrate; a gate structure on the substrate; a gate spacer on a sidewall of the gate structure; and a polishing stop pattern on the gate structure and the gate spacer, the polishing stop pattern including a first portion covering an upper surface of the gate structure and an upper surface of the gate spacer; and a second portion extending from the first portion in a vertical direction substantially perpendicular to an upper surface of the substrate, wherein an upper surface of a central portion of the first portion of the polishing stop pattern is higher than an upper surface of an edge portion of the first portion thereof, and the upper surface of the central portion of the first portion of the polishing stop pattern is substantially coplanar with an upper surface of the second portion thereof.

12 Claims, 48 Drawing Sheets

(58) Field of Classification Search
CPC . H01L 29/78696; H01L 27/088; H01L 21/28; H01L 21/768; H01L 21/8234; H01L 21/8238; H01L 21/823456; H01L 21/823468; H01L 21/823443; H01L 21/823475; H01L 21/823412; H01L 21/823431; H01L 21/7684; H01L 21/28141
USPC .......................................................... 257/412
See application file for complete search history.

(56) References Cited

U.S. PATENT DOCUMENTS

| | | | |
|---|---|---|---|
| 7,056,804 B1* | 6/2006 | Lyons | H01L 21/76224 |
| | | | 257/E21.546 |
| 8,809,174 B2 | 8/2014 | Seo et al. | |
| 9,653,356 B2 | 5/2017 | Park et al. | |
| 9,917,173 B2 | 5/2018 | Liu et al. | |
| 10,381,480 B2 | 8/2019 | Alptekin et al. | |
| 10,559,470 B2 | 2/2020 | Huang et al. | |
| 2003/0134505 A1* | 7/2003 | Dalton | H01L 21/76829 |
| | | | 257/E21.579 |
| 2014/0197498 A1* | 7/2014 | Hoentschel | H01L 29/665 |
| | | | 438/301 |
| 2018/0130889 A1* | 5/2018 | Xie | H01L 29/41791 |

* cited by examiner

FIG. 3
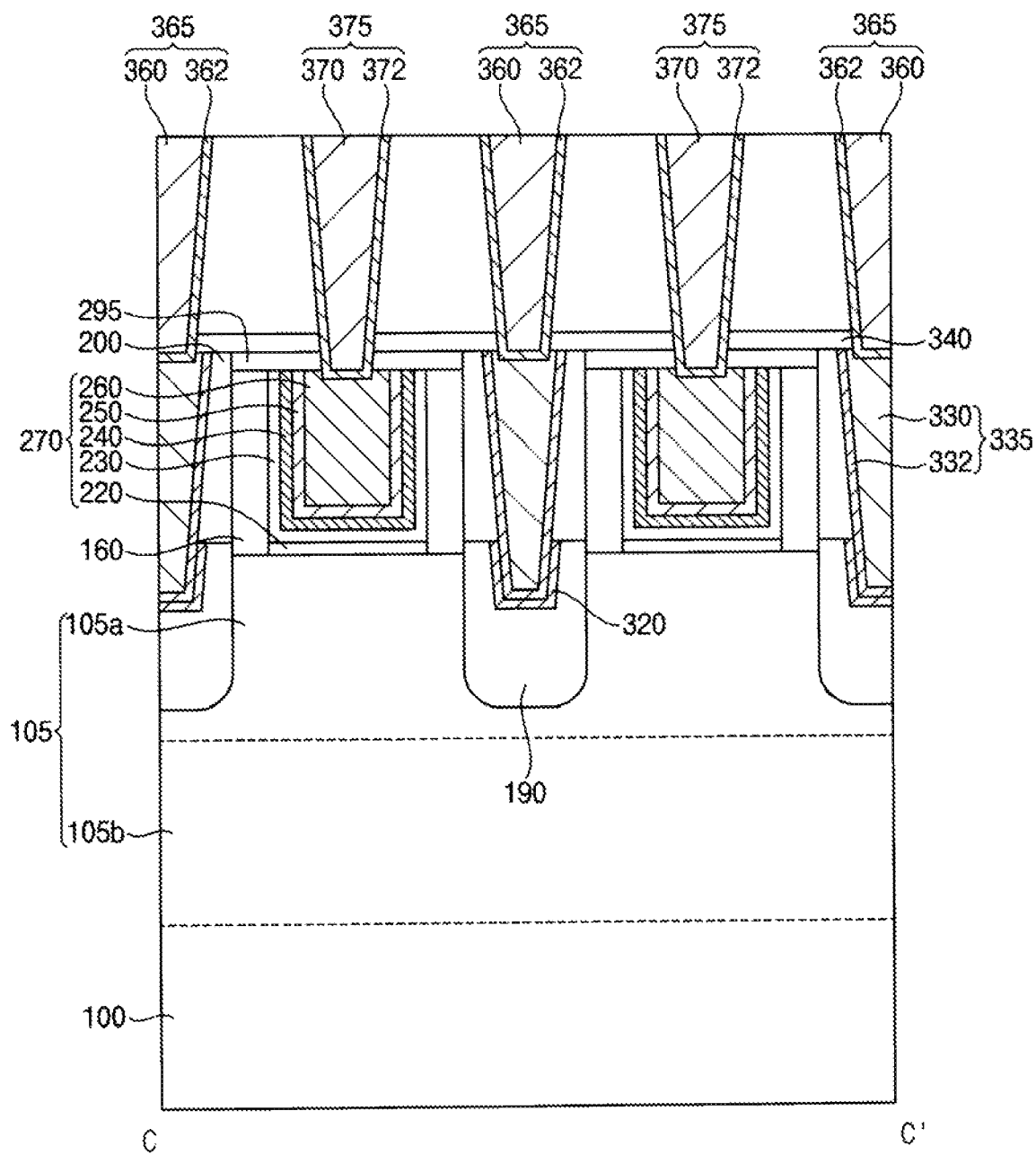
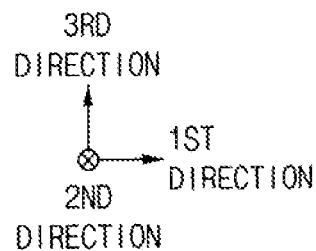

FIG. 5
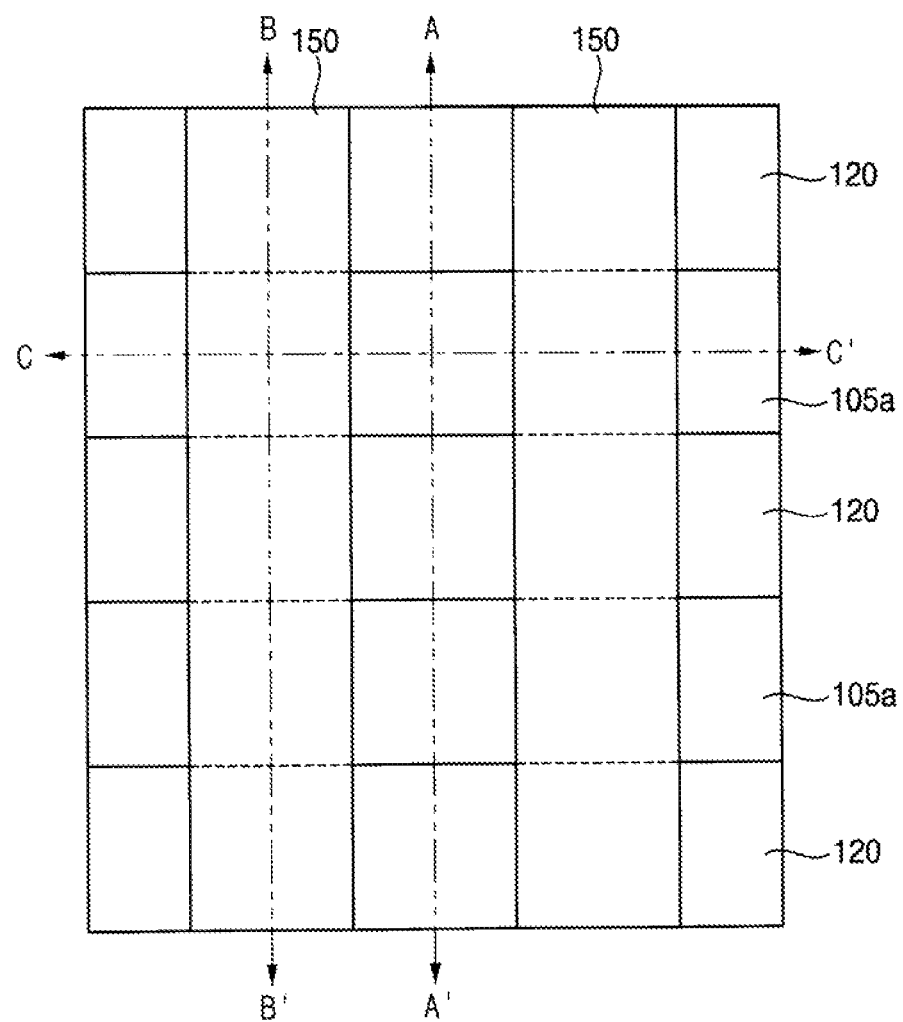
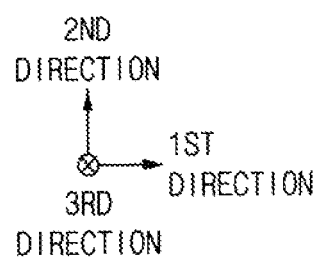

FIG. 12
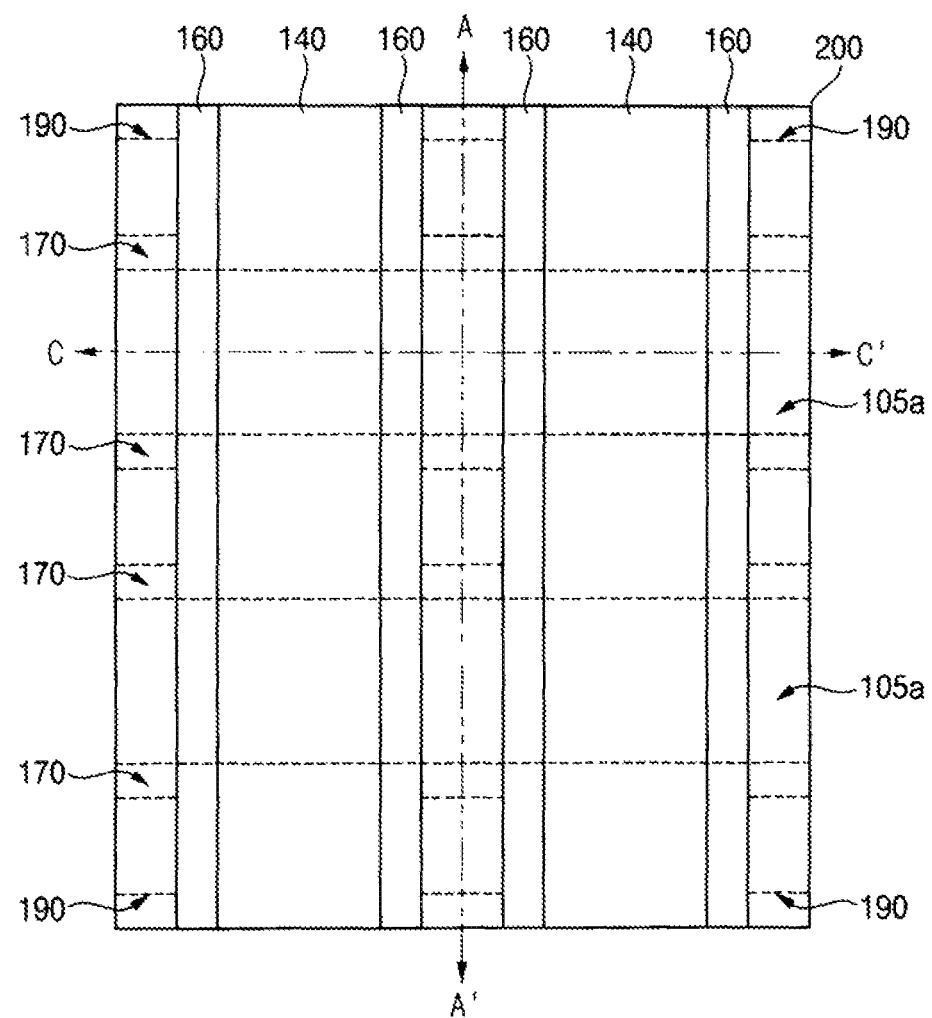
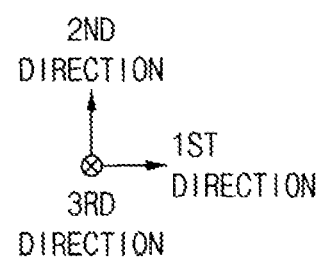

FIG. 18
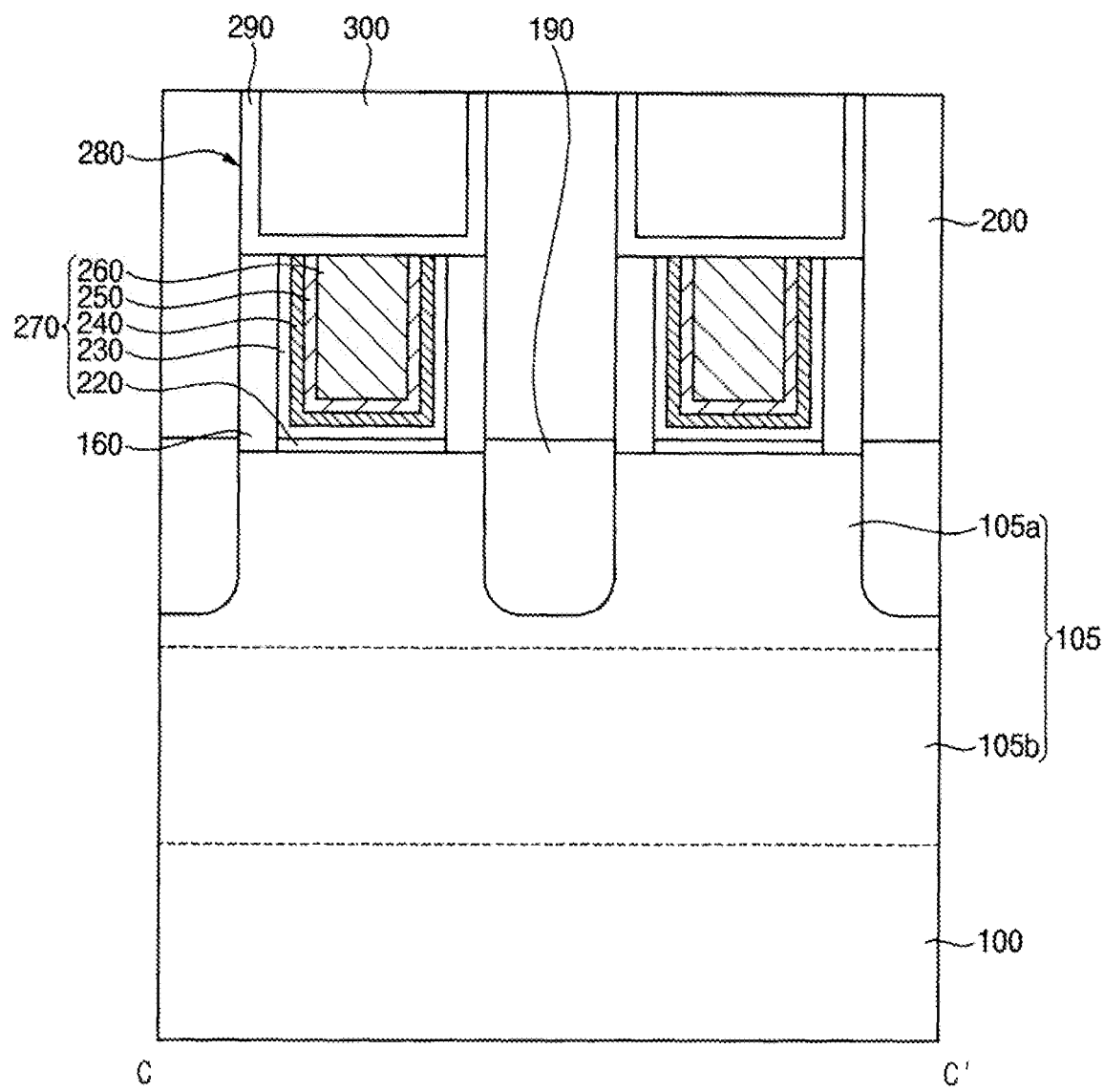
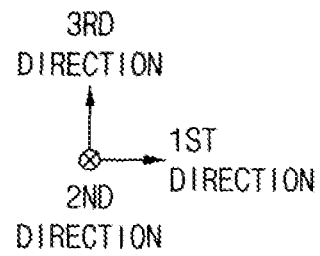

FIG. 25
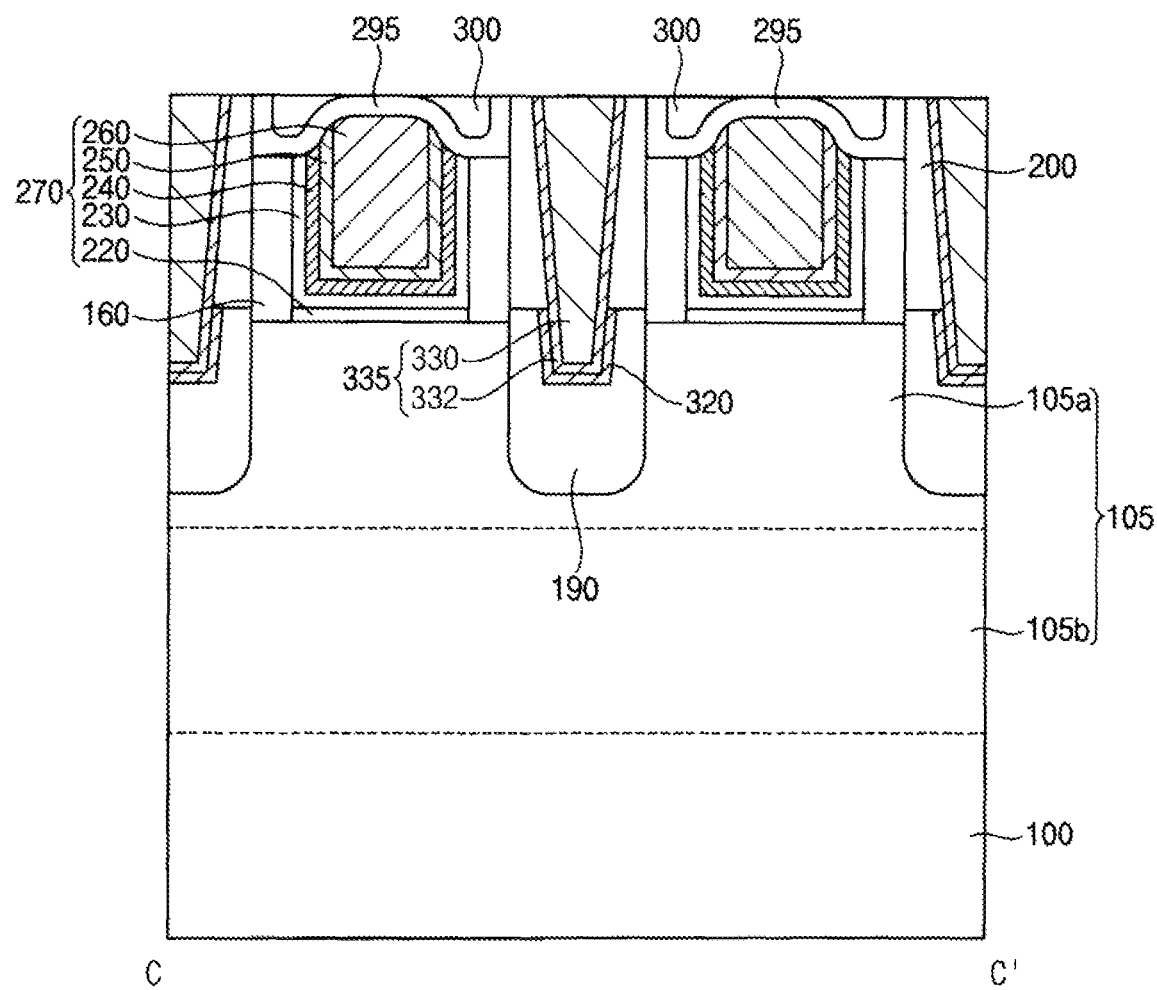
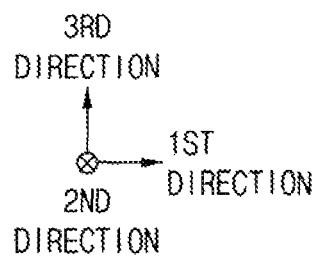

SEMICONDUCTOR DEVICES

CROSS-REFERENCE TO RELATED APPLICATION

Korean Patent Application No. 10-2020-0110056, filed on Aug. 31, 2020, in the Korean Intellectual Property Office, and entitled: "Semiconductor Devices," is incorporated by reference herein in its entirety.

BACKGROUND

1. Field

Embodiments relate to semiconductor devices.

2. Description of the Related Art

A contact plug of a semiconductor device may be self-aligned with a metal gate electrode, a gate spacer on a sidewall of the metal gate electrode, and a capping layer on the metal gate electrode and the gate spacer.

SUMMARY

The embodiments may be realized by providing a semiconductor device including a substrate; a gate structure on the substrate; a gate spacer on a sidewall of the gate structure; and a polishing stop pattern on the gate structure and the gate spacer, the polishing stop pattern including a first portion covering an upper surface of the gate structure and an upper surface of the gate spacer; and a second portion extending from the first portion in a vertical direction substantially perpendicular to an upper surface of the substrate, wherein an upper surface of a central portion of the first portion of the polishing stop pattern is higher than an upper surface of an edge portion of the first portion thereof, and the upper surface of the central portion of the first portion of the polishing stop pattern is substantially coplanar with an upper surface of the second portion thereof.

The embodiments may be realized by providing a semiconductor device including a substrate; channels spaced apart from each other on the substrate in a vertical direction substantially perpendicular to an upper surface of the substrate, each of the channels extending in a first direction substantially parallel to the upper surface of the substrate; a gate structure extending on the substrate in a second direction substantially parallel to the upper surface of the substrate and crossing the first direction, the gate structure covering lower and upper surfaces and opposite sidewalls in the second direction of the channels; a gate spacer on an upper sidewall of the gate structure; a polishing stop pattern on the gate structure and the gate spacer; a source/drain layer on a portion of the substrate adjacent to the gate structure, the source/drain layer being connected to each of opposite sidewalls in the first direction of the channels; a first insulating interlayer on the source/drain layer, the first insulating interlayer covering a sidewall of the gate spacer and a sidewall of the polishing stop pattern; and a first contact plug extending through the first insulating interlayer to contact an upper surface of the source/drain layer, an upper surface of the first contact plug being substantially coplanar with an upper surface of the polishing stop pattern.

The embodiments may be realized by providing a semiconductor device including a substrate including a first region and a second region; a first gate structure on the first region of the substrate; a first gate spacer on a sidewall of the first gate structure; a first polishing stop pattern on the first gate structure and the first gate spacer; a first source/drain layer on a portion of the first region of the substrate adjacent to the first gate structure; a second gate structure on the second region of the substrate; a second gate spacer on a sidewall of the second gate structure; a second polishing stop pattern on the second gate structure and the second gate spacer; a capping layer on the second polishing stop pattern; a second source/drain layer on a portion of the second region of the substrate adjacent to the second gate structure; a first insulating interlayer on the first and second source/drain layers, the first insulating interlayer covering sidewalls of the first and second gate spacers and sidewalls of the first and second polishing stop patterns; a first contact plug extending through the first insulating interlayer and contacting an upper surface of the first source/drain layer; a second contact plug extending through the first insulating interlayer and contacting an upper surface of the second source/drain layer; and an etch stop layer on the first and second polishing stop patterns, the capping layer, the first insulating interlayer, and the first and second contact plugs, wherein an upper surface of the first polishing stop pattern is substantially coplanar with an uppermost portion of the second polishing stop pattern and an upper surface of the capping layer.

BRIEF DESCRIPTION OF THE DRAWINGS

Features will be apparent to those of skill in the art by describing in detail exemplary embodiments with reference to the attached drawings in which:

FIGS. 1 to 4 are a plan view and cross-sectional views of a semiconductor device in accordance with example embodiments.

FIGS. 5 to 22 are plan views and cross-sectional views of stages in a method of manufacturing a semiconductor device in accordance with example embodiments.

FIGS. 24 and 25 are cross-sectional views of stages in a method of manufacturing a semiconductor device in accordance with example embodiments.

DETAILED DESCRIPTION

Figure 1:
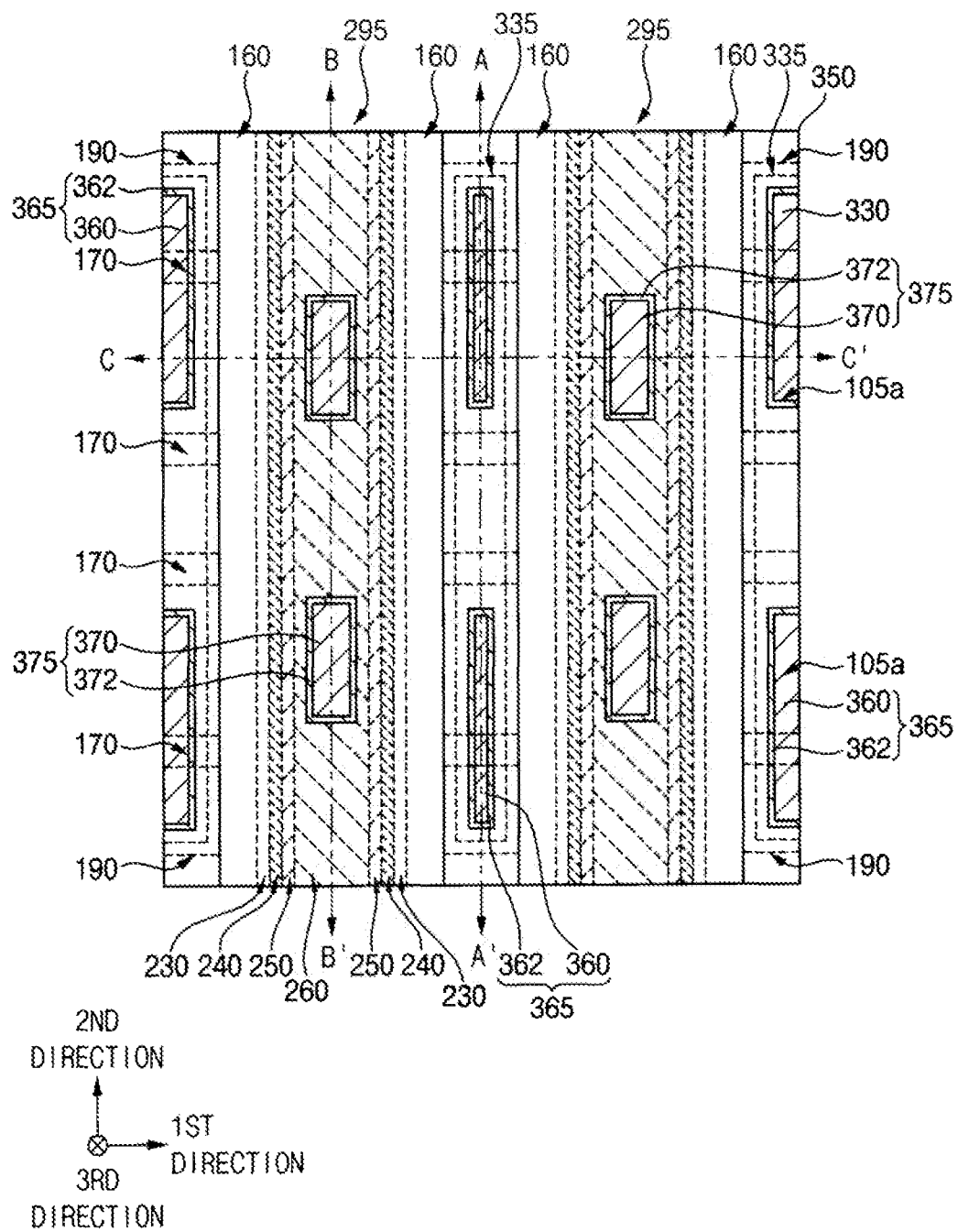
Figure 2:
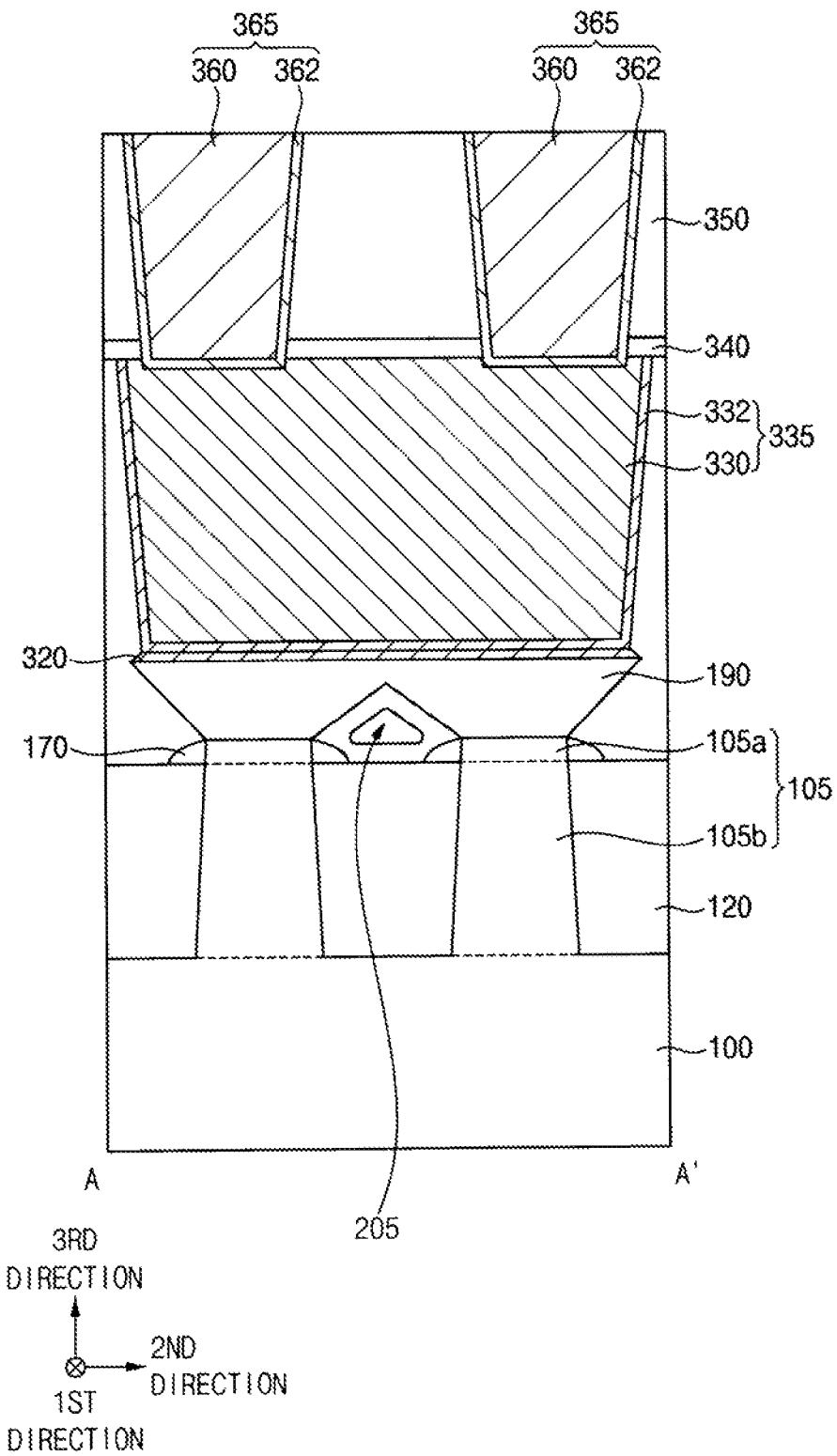
Figure 4:
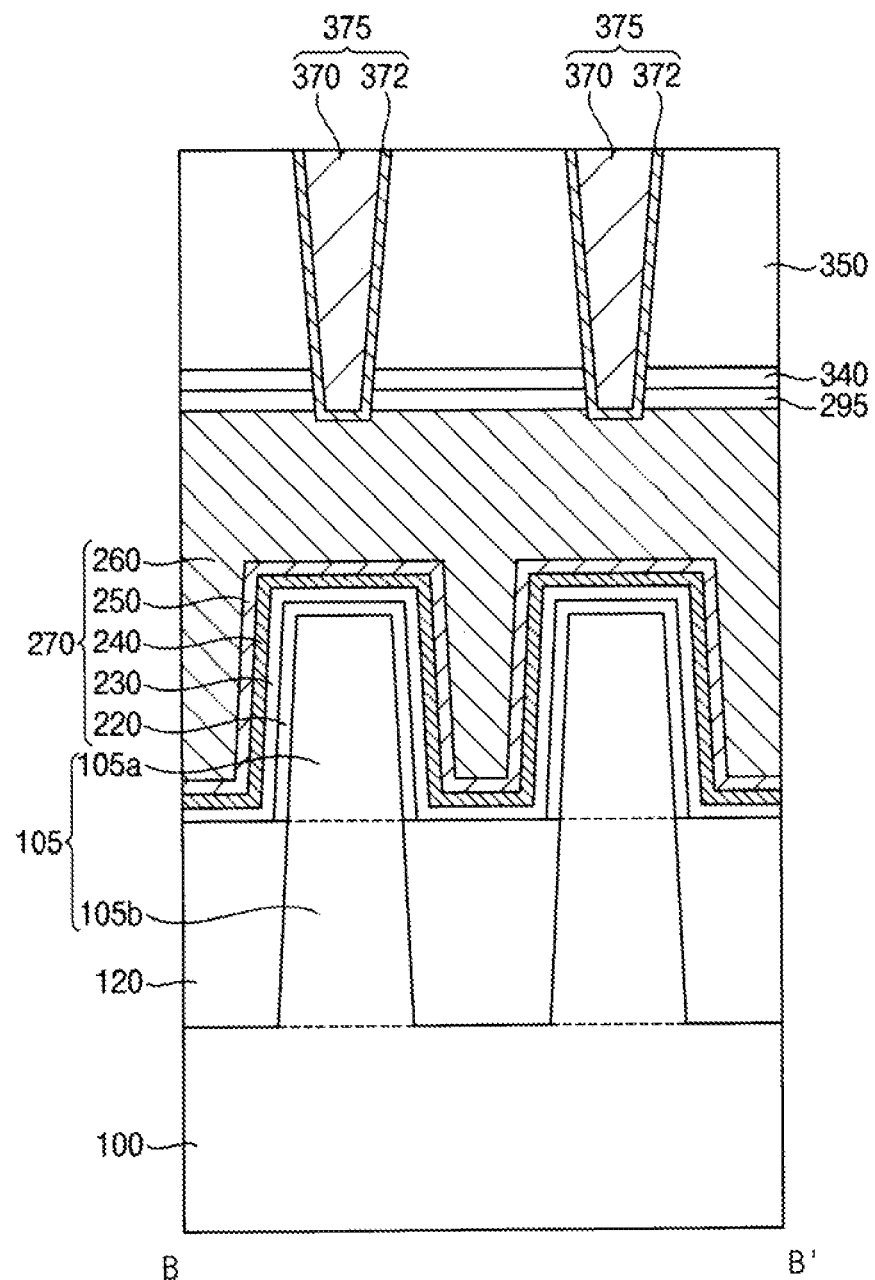

FIGS. 1 to 4 are a plan view and cross-sectional views of a semiconductor device in accordance with example embodiments. FIG. 1 is the plan view, and FIGS. 2 to 4 are the cross-sectional views. FIG. 2 is a cross-sectional view taken along a line A-A' of FIG. 1, FIG. 3 is a cross-sectional view taken along a line B-B' of FIG. 1, and FIG. 3 is a cross-sectional view taken along a line C-C' of FIG. 1.

Referring to FIGS. 1 to 4, the semiconductor device may include an active pattern 105, a first gate structure 270, a gate spacer 160, a polishing stop pattern 295, and a source/drain layer 190 on a substrate 100. The semiconductor device may further include an etch stop layer 340, first and third insulating interlayers 200 and 350, first to third contact plugs 335, 365 and 375, and a metal silicide pattern 320.

The substrate 100 may include a semiconductor material, e.g., silicon, germanium, silicon-germanium, or the like, or III-V semiconductor compounds, e.g., GaP, GaAs, GaSb, or the like. In an implementation, the substrate 100 may include a silicon-on-insulator (SOI) substrate or a germanium-on-insulator (GOI) substrate. As used herein, the term "or" is not an exclusive term, e.g., "A or B" would include A, B, or A and B.

An isolation pattern 120 may be on the substrate 100, and the active pattern 105 may be defined by the isolation pattern 120. A lower sidewall of the active pattern 105 may be covered by the isolation pattern 120, and the active pattern 105 may protrude from the isolation pattern 120 upwardly.

The active pattern 105 may have a fin shape, and thus may be referred to as an active fin. In an implementation, the active fin 105 may extend (e.g., lengthwise) in the first direction, and a plurality of active fins may be formed or spaced apart in the second direction.

The active fin 105 may include a lower active pattern 105b (of which a sidewall is covered by the isolation pattern 120) and an upper active pattern 105a (protruding from or above the isolation pattern 120, e.g., in the third direction). An area of the substrate 100 on which no active pattern 105 is formed may be defined as a field region.

In an implementation, the first gate structure 270 may extend (e.g., lengthwise) in the second direction, and a plurality of the first gate structures 270 may be spaced apart from each other in the first direction. In an implementation, as illustrated in FIGS. 1 to 4, two first gate structures 270 may be spaced apart from each other in the first direction.

In an implementation, the first gate structure 270 may include an interface pattern 220 on the active fin 105, and a gate insulation pattern 230, a gate barrier 240, and first and second gate electrodes 250 and 260 sequentially stacked on the interface pattern 220 and the isolation pattern 120. Each of the gate insulation pattern 230, the gate barrier 240, and the first and second gate electrodes 250 and 260 may extend in the second direction. In an implementation, the interface pattern 220 may be not only on the active fin 105 but may also extend in the second direction onto the isolation pattern 120. The first and second gate electrodes 250 and 260 together may be referred to as a gate electrode structure, and the first gate electrode 250 may be referred to as a workfunction control pattern. In an implementation, the gate electrode structure may include only one of the first and second gate electrodes 250 and 260.

A sidewall and a lower surface of the second gate electrode 260 may be covered by the first gate electrode 250, a sidewall and a lower surface of the first gate electrode 250 may be covered by the gate barrier 240, a sidewall and a lower surface of the gate barrier 240 may be covered by the gate insulation pattern 230, and a lower surface of the gate insulation pattern 230 may be covered by the interface pattern 220.

The interface pattern 220 may include an oxide, e.g., silicon oxide, and the gate insulation pattern 230 may include a metal oxide having a high dielectric constant, e.g., hafnium oxide, tantalum oxide, zirconium oxide, or the like.

The gate barrier 240 may include a metal nitride, e.g., titanium nitride, titanium aluminum nitride, tantalum nitride, tantalum aluminum nitride, or the like, the first gate electrode 250 may include a metal alloy, a metal carbide, a metal oxynitride, a metal carbonitride, or a metal oxycarbonitride, e.g., titanium aluminum, titanium aluminum carbide, titanium aluminum oxynitride, titanium aluminum carbonitride, titanium aluminum oxycarbonitride, or the like, and the second gate electrode 260 may include a low resistance metal, e.g., tungsten, aluminum, copper, tantalum, or the like.

The gate spacer 160 may cover opposite sidewalls in the first direction of the first gate structure 270, and may extend in the second direction. Each of opposite sidewalls in the second direction of the upper active pattern 105a of each of the active fins 105 may be covered by a fin spacer 170. The gate spacer 160 and the fin spacer 170 may include a nitride, e.g., silicon nitride. In an implementation, each of the gate spacer 160 and the fin spacer 170 may have a multi-layered structure including a nitride layer and an oxide layer sequentially stacked.

The polishing stop pattern 295 may be on the first gate structure 270 and the gate spacer 160, and may cover upper surfaces thereof. In an implementation, the polishing stop pattern 295 may also extend (e.g., lengthwise) in the second direction. In an implementation, the polishing stop pattern 295 may be on a same, e.g., single, plane, and a central portion and an edge portion of the polishing stop pattern 295 may have the same height (e.g., may be a same distance from the substrate 100 in the third direction).

The polishing stop pattern 295 may include a material having an etching selectivity or polishing selectivity with respect to the first insulating interlayer 200, the capping layer 300 (refer to FIG. 18), and the first contact plug 335, and may serve as a polishing end point when the first insulating interlayer 200, the capping layer 300, and the first contact plug 335 are removed by a polishing process.

In an implementation, the polishing stop pattern 295 may include a carbon-containing material, e.g., silicon carbide, silicon oxycarbide, silicon carbonitride, silicon oxycarbonitride, amorphous carbon layer (ACL), or the like. In an implementation, the polishing stop pattern 295 may include a transition metal, e.g., ruthenium. In an implementation, the polishing stop pattern 295 may include polysilicon or boronitride.

The source/drain layer 190 may be on the active fin 105 between the first gate structures 270, and an upper portion of the source/drain layer 190 may contact a sidewall of the gate spacer 160. In an implementation, the source/drain layer 190 may have a cross-section taken along the second direction having a pentagon-like shape.

In an implementation, a distance between neighboring ones of the active fins 105 in the second direction may be relatively small, and each of the source/drain layers 190 grown on each of the active fins 105 may be merged with each other. In an implementation, as illustrated in FIGS. 1 and 2, two source/drain layers 190 grown on two active fins 105 may be merged with each other.

In an implementation, the source/drain layer 190 may include single crystalline silicon-germanium layer doped with p-type impurities. The source/drain layer 190 may serve as a source/drain region of a positive-channel metal oxide semiconductor (PMOS) transistor.

In an implementation, the source/drain layer 190 may include single crystalline silicon carbide layer doped with n-type impurities or single crystalline silicon layer doped with n-type impurities. The source/drain layer 190 may serve as a source/drain region of a negative-channel metal oxide semiconductor (NMOS) transistor.

The first insulating interlayer 200 may be on the active fin 105 and the isolation pattern 120 of the substrate 100, and may cover a sidewall of the gate spacer 160 on each of opposite sidewalls of the first gate structure 270, a sidewall of the polishing stop pattern 295, and an upper surface of the source/drain layer 190. The first insulating interlayer 200 may not entirely fill a space between the merged source/drain layers 190 and the isolation pattern 120, and an air gap 205 may be formed. The first insulating interlayer 200 may include an oxide, e.g., silicon oxide.

The first contact plug 335 may extend through the first insulating interlayer 200 between the first gate structures 270 spaced apart from each other in the first direction, and may contact (e.g., directly contact) the upper surface of the source/drain layer 190. In an implementation, the first contact plug 335 may include a first metal pattern 330 and a first barrier pattern 332 covering a lower surface and a sidewall of the first metal pattern 330. The first metal pattern 330 may include a metal, e.g., tungsten, copper, aluminum, cobalt, molybdenum, or the like, and the first barrier pattern 332 may include a metal nitride, e.g., titanium nitride, tantalum nitride, tungsten nitride, or the like.

In an implementation, the first contact plug 335 may not contact a sidewall of the first gate structure 270, and the first insulating interlayer 200 may be between the sidewall of the first gate structure 270 and the first contact plug 335. In an implementation, the first contact plug 335 may be self-aligned with the sidewall of the first gate structure 270 so as to contact the sidewall of the first gate structure 270.

In an implementation, an upper surface (e.g., surface facing away from the substrate 100 in the third direction) of the first contact plug 335 may be substantially coplanar with an upper surface of the polishing stop pattern 295. The first contact plug 335 may extend through the first insulating interlayer 200, and an upper surface of the first insulating interlayer 200 and the upper surface of the first contact plug 335 may be substantially coplanar with each other.

The metal silicide pattern 320 may be between a lower surface (e.g., substrate 100 facing surface) and a lower sidewall of the first contact plug 335 and the upper surface of the source/drain layer 190. The metal silicide pattern 320 may include a metal silicide pattern, e.g., titanium silicide, cobalt silicide, nickel silicide, or the like.

The etch stop layer 340 may be commonly on the polishing stop pattern 295, the first insulating interlayer 200 and the first contact plug 335, and may cover the upper surfaces (e.g., surfaces facing away from the substrate 100 in the third direction) of the polishing stop pattern 295, the first insulating interlayer 200 and the first contact plug 335. The etch stop layer 340 may include a nitride, e.g., silicon nitride.

The third insulating interlayer 350 may be on the etch stop layer 340. The third insulating interlayer 350 may include an oxide, e.g., silicon oxide, or a low-k dielectric material having a dielectric constant less than that of silicon oxide.

The second contact plug 365 may extend through the third insulating interlayer 350 and the etch stop layer 340 to contact (e.g., directly contact) the (e.g., upper surface of the) first contact plug 335, and the third contact plug 375 may extend through the third insulating interlayer 350, the etch stop layer 340, and the polishing stop pattern 295 to contact (e.g., directly contact) (e.g., an upper surface of) the first gate structure 270. The third contact plug 375 may contact (e.g., an upper surface of) the gate electrode structure of the first gate structure 270.

In an implementation, as illustrated in FIGS. 1 to 4, two second contact plugs 365 may be spaced apart from each other in the second direction on the first contact plug 335 and two third contact plugs 375 may be spaced apart from each other in the second direction on the first gate structure 270. In an implementation, the layouts of the second and third contact plugs 365 and 375 may vary.

In an implementation, the second contact plug 365 may include a second metal pattern 360 and a second barrier pattern 362 covering a lower surface and a sidewall thereof, and the third contact plug 375 may include a third metal pattern 370 and a third barrier pattern 372 covering a lower surface and a sidewall thereof. The second and third metal patterns 360 and 370 may include a material substantially the same as that of the first metal pattern 330, and the second and third barrier patterns 362 and 372 may include a material substantially the same as that of the first barrier pattern 332.

In an implementation, the first contact plug 335 may extend through the first insulating interlayer 200, and the upper surface of the first contact plug 335 may be substantially coplanar with the upper surfaces of the first insulating interlayer 200 and the polishing stop pattern 295. In an implementation, the polishing stop pattern 295 may be formed relatively thinly on the upper surface of the first gate structure 270, and a height (e.g., distance from the substrate 100 in the third direction) of the upper surface of the first contact plug 335 may be slightly different from that of the upper surface of the first gate structure 270.

If a capping layer having a relatively thick thickness were to be formed on the first gate structure 270, an insulating interlayer could be formed to cover sidewalls of the first gate structure 270 and the capping layer, the first contact plug 335 could extend through the insulating interlayer, a height of an upper surface of the first contact plug could be equal to that of the insulating interlayer, and the height of the upper surface of the first contact plug 335 and the height of the upper surface of the first gate structure 270 could have a large difference. In such a case, a parasitic capacitance generated by the first contact plugs 335 and the insulating interlayer surrounding the first contact plugs 335 could have a relatively large value.

According to an embodiment, the height of the upper surface of the first contact plugs 335 may be similar to that of the upper surface of the first gate structure 270, the parasitic capacitance between the first contact plugs 335 and the first insulating interlayer 200 may have a small value, and each of the first contact plugs 335 may have a small thickness in the third direction in which electrical signals may flow, so as to have a small resistance. Accordingly, an RC-delay of signals through the first contact plugs 335 may decrease.

FIGS. 5 to 22 are plan views and cross-sectional views of stages in a method of manufacturing a semiconductor device in accordance with example embodiments. FIGS. 5, 9, 12, 15, 19 and 21 are the plan views, and FIGS. 6-8, 10-11, 13-14, 16-18, 20 and 22 are the cross-sectional views.

Figure 6:
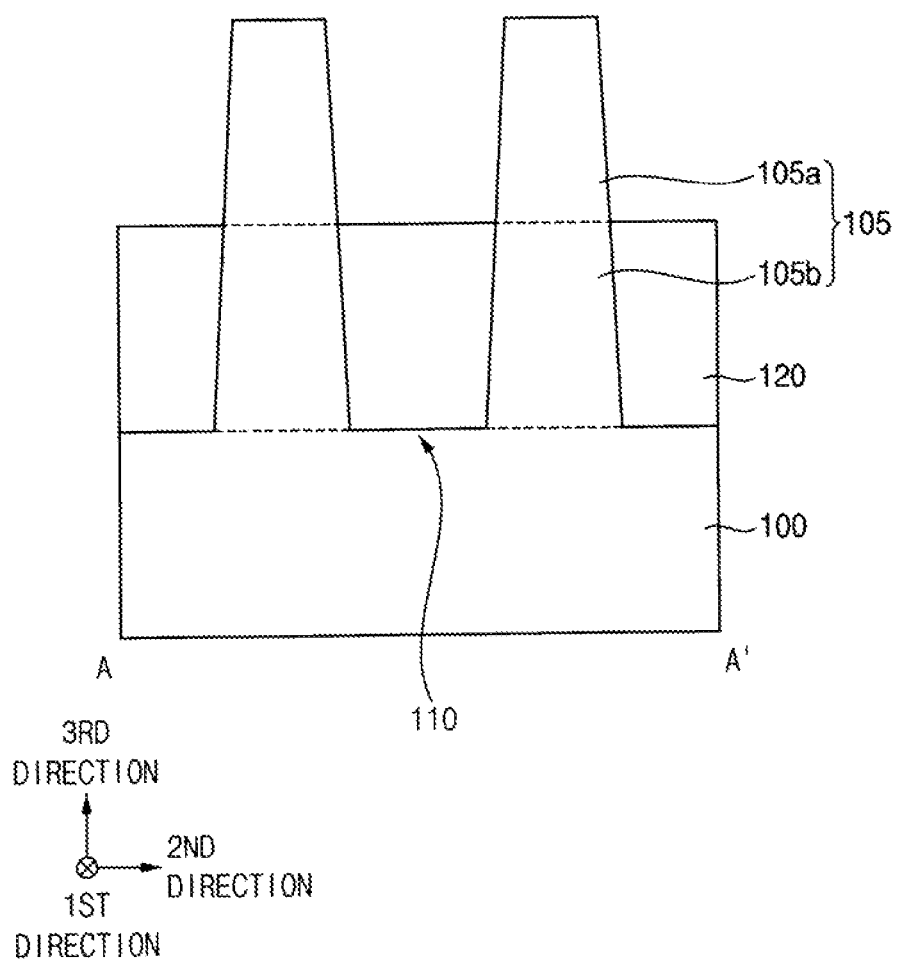
Figure 7:
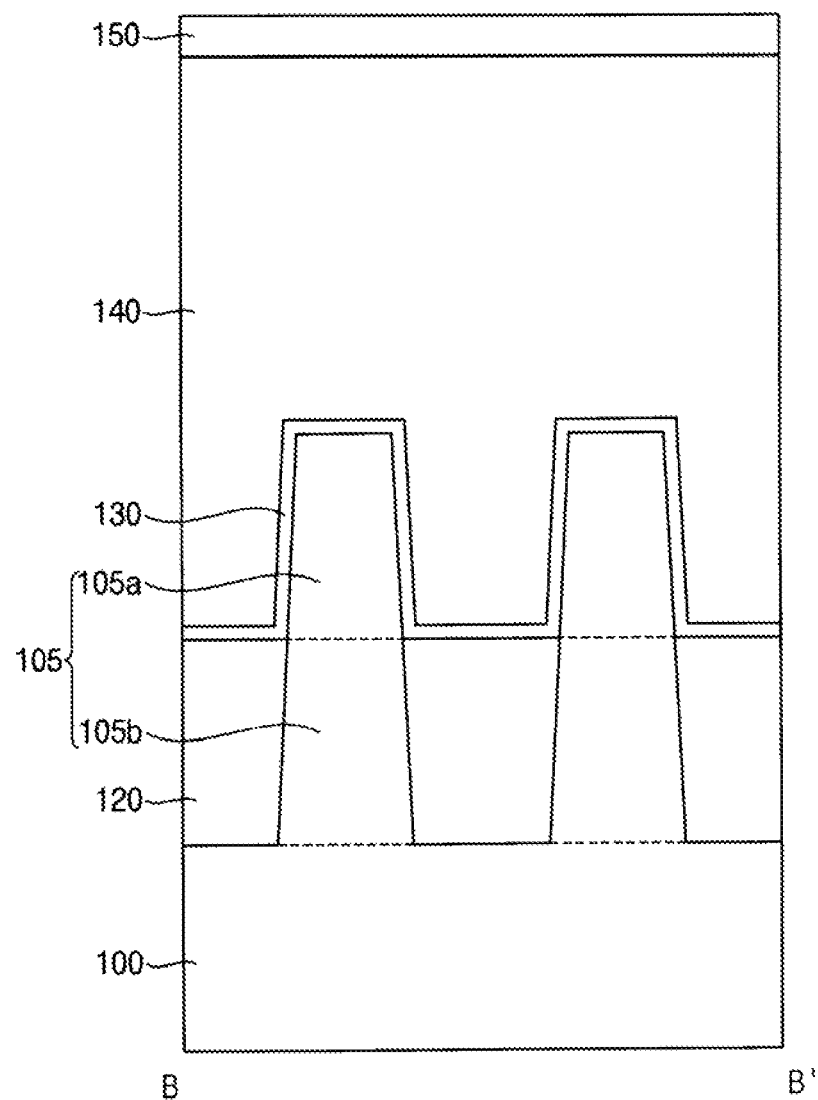
Figure 8:
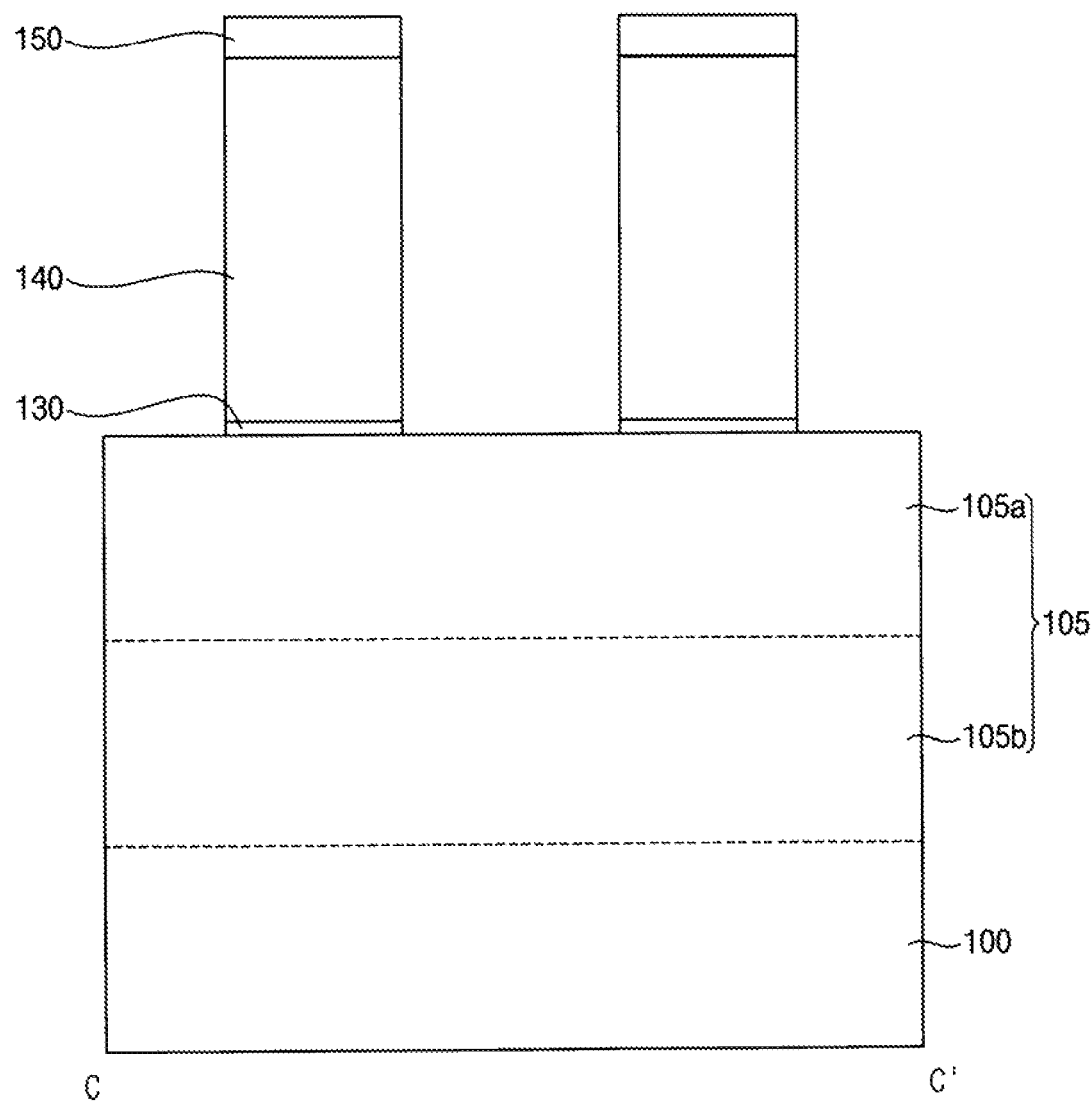
Figure 10:
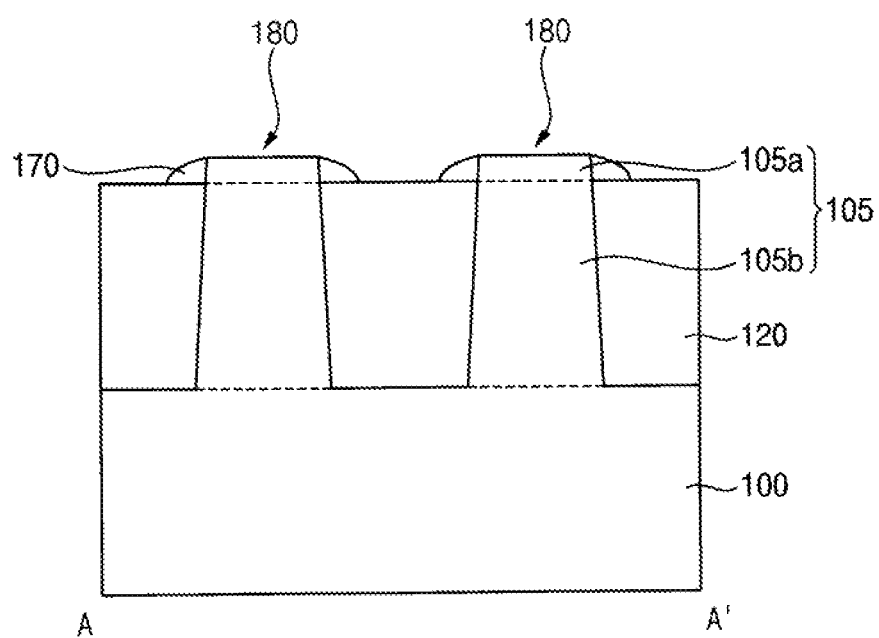
Figure 13:
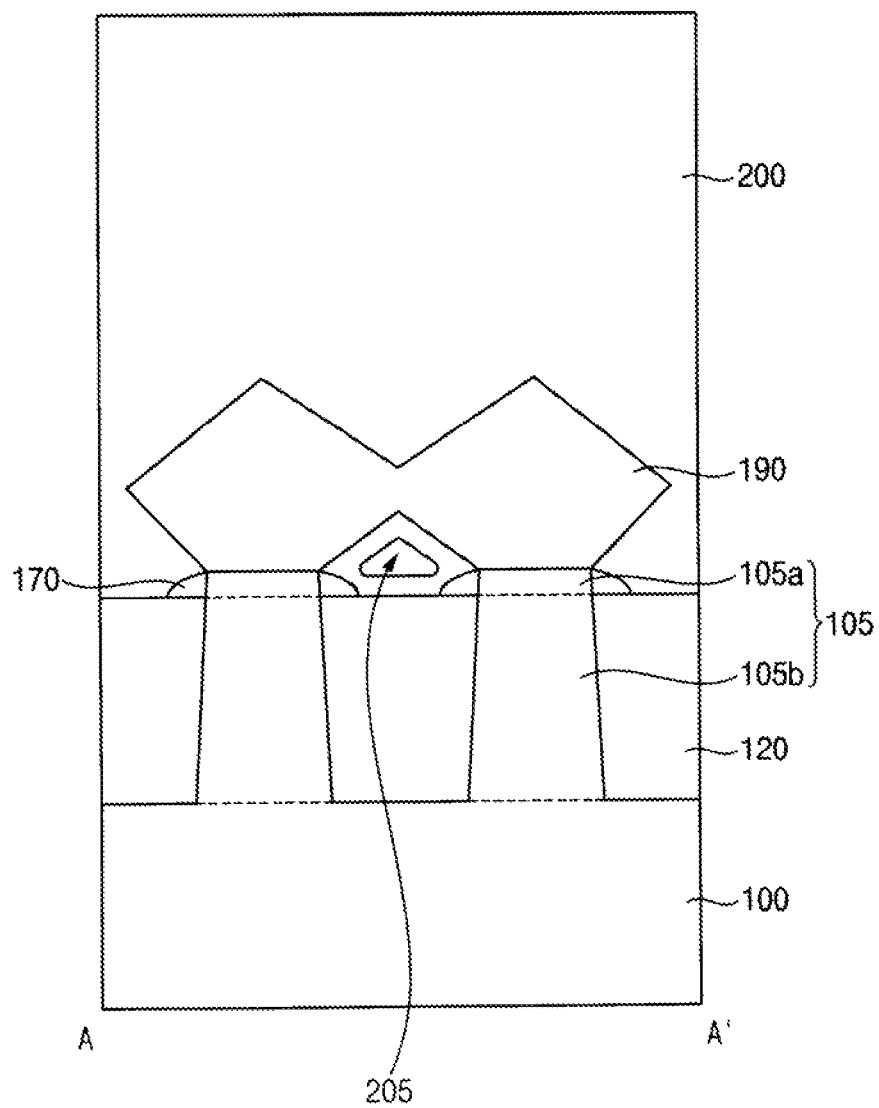
Figure 16:
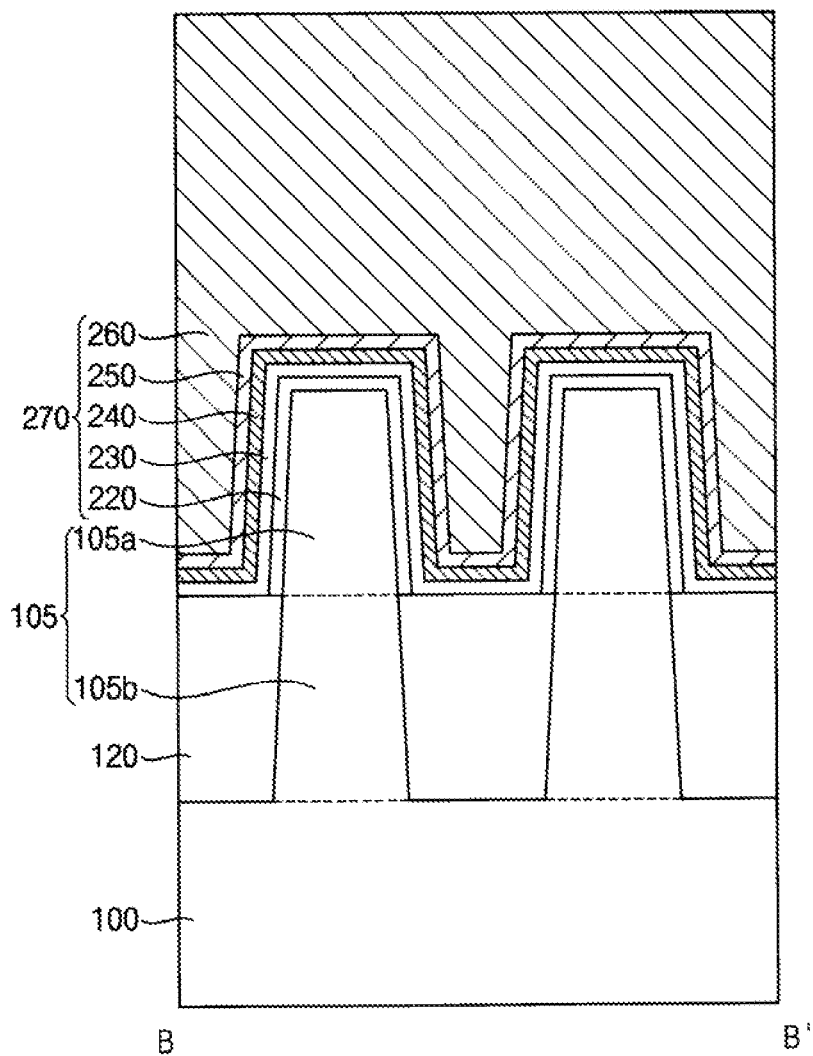

FIGS. 6, 10 and 13 are cross-sectional views taken along lines A-A' of corresponding plan views, respectively, FIGS. 7 and 16 are cross-sectional views taken along lines B-B' of corresponding plan views, respectively, and FIGS. 8, 11, 14, 17-18, 20 and 22 are cross-sectional views taken along lines C-C' of corresponding plan views, respectively.

Referring to FIGS. 5 to 8, an upper portion of a substrate 100 may be partially etched to form a first recess 110, an isolation pattern 120 filling a lower portion of the first recess 110 may be formed, and a dummy gate structure may be formed on the substrate 100 and the isolation pattern 120.

As the first recess 110 is formed on the substrate 100, an active pattern 105 may be defined. The active pattern 105 may be referred to as an active fin 105.

In an implementation, the isolation pattern 120 may be formed by forming an isolation layer on the substrate 100 to fill the first recess 110, the isolation layer may be planarized until an upper surface of the substrate 100 is exposed, and an upper portion of the isolation layer may be removed to expose an upper portion of the first recess 110. The active fin 105 may include a lower active pattern 105b of which a sidewall may be covered by the isolation pattern 120 and an upper active pattern 105a protruding from the isolation pattern 120.

The dummy gate structure may be formed by sequentially forming a dummy gate insulation layer, a dummy gate electrode layer, and a dummy gate mask layer on the active fin 105 and the isolation pattern 120 of the substrate 100, patterning the dummy gate mask layer to form a dummy gate mask 150 on the substrate 100, and sequentially etching the dummy gate electrode layer and the dummy gate insulation layer using the dummy gate mask 150 as an etching mask. Thus, the dummy gate structure including the dummy gate insulation pattern 130, the dummy gate electrode 140 and the dummy gate mask 150 sequentially stacked may be formed on the substrate 100.

The dummy gate insulation layer may include an oxide, e.g., silicon oxide, the dummy gate electrode layer may include, e.g., polysilicon, and the dummy gate mask layer may include a nitride, e.g., silicon nitride.

The dummy gate insulation layer may be formed by, e.g., a chemical vapor deposition (CVD) process, an atomic layer deposition (ALD) process, etc. In an implementation, the dummy gate insulation layer may be formed by a thermal oxidation process on an upper surface of the substrate 100, and in this case, the dummy gate insulation layer may be formed only on an upper surface of the active fin 105. The dummy gate electrode layer and the dummy gate mask layer may be formed by, e.g., a CVD process, an ALD process, etc.

Figure 9:
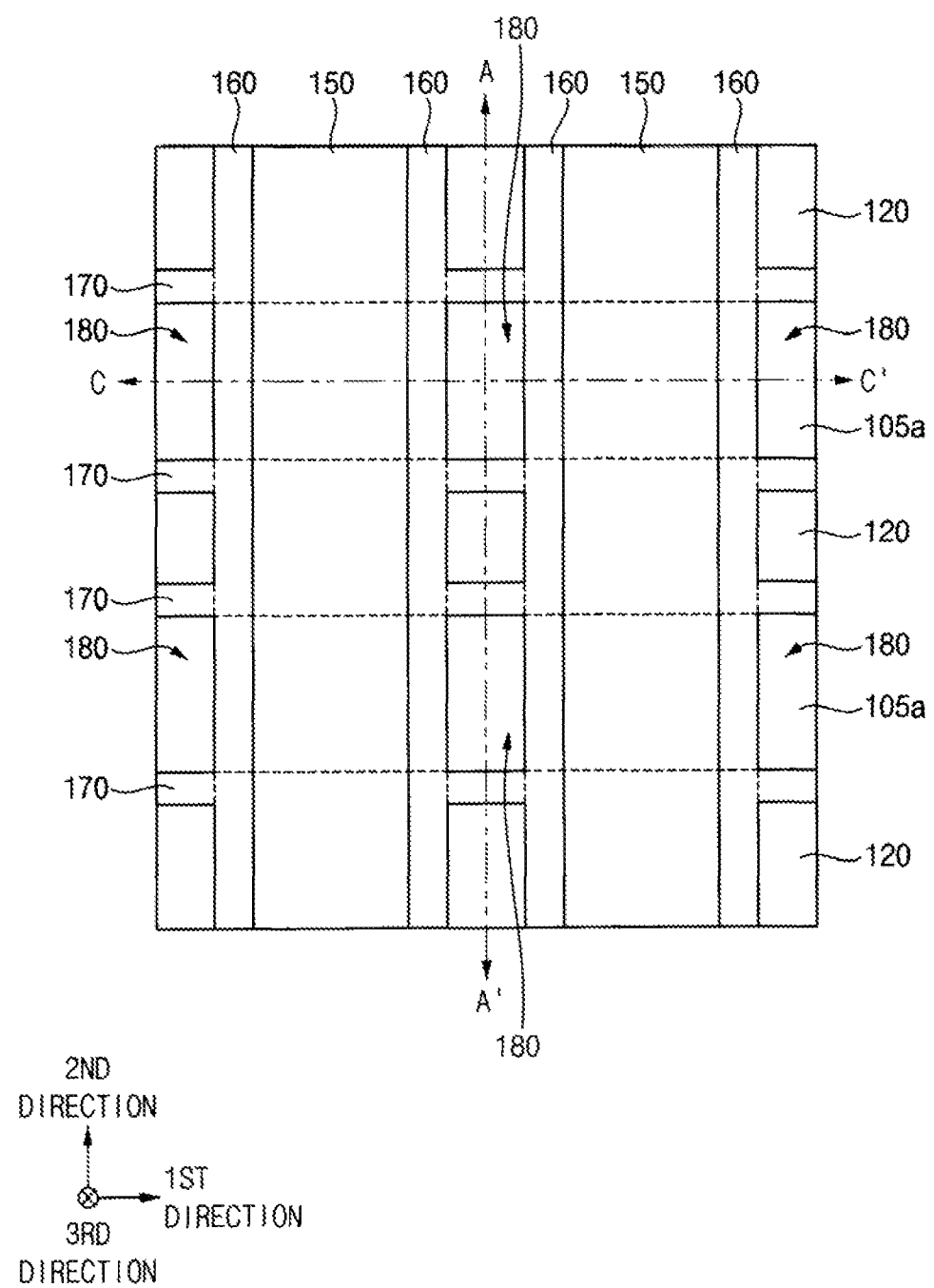
Figure 11:
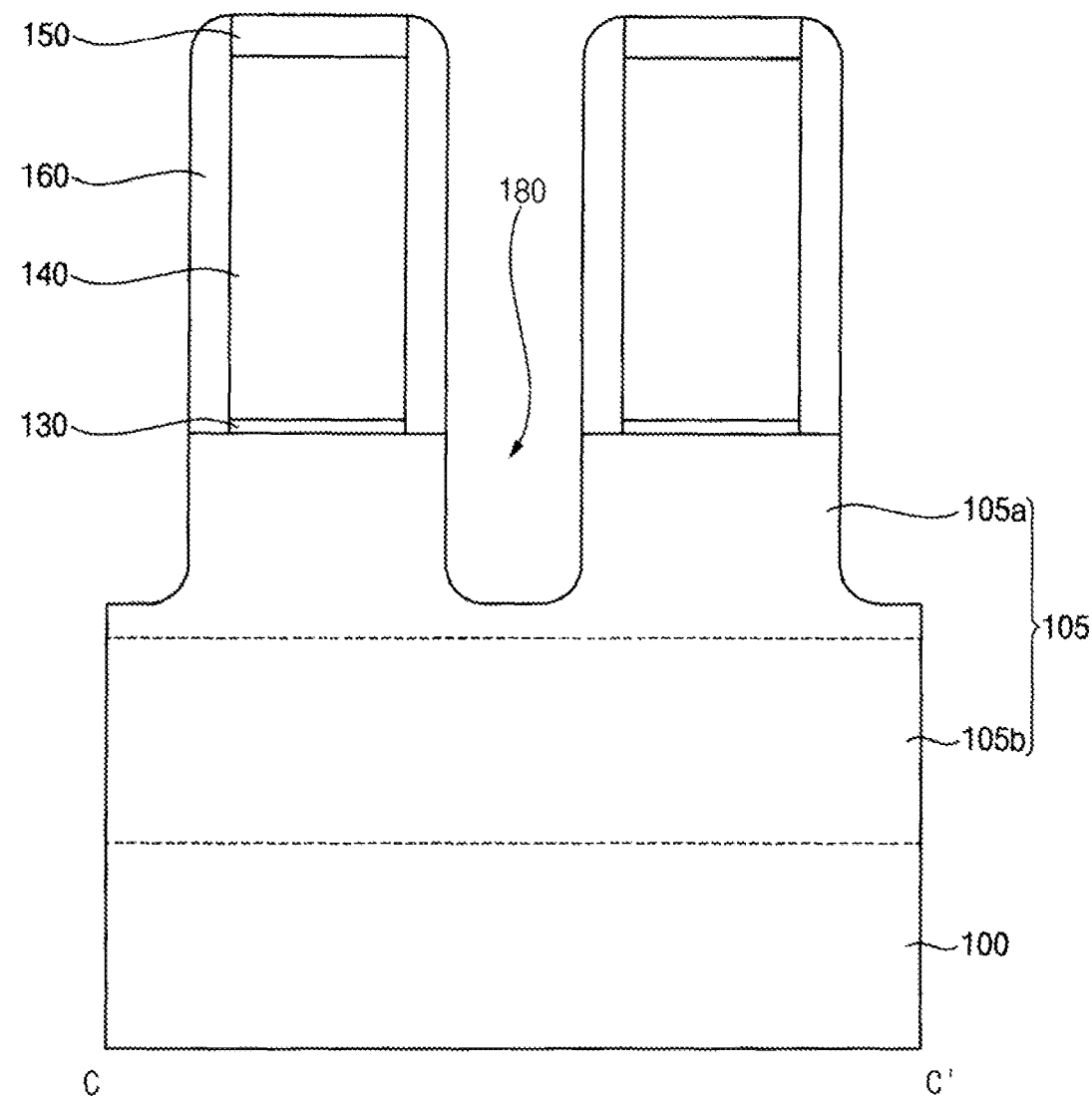

Referring to FIGS. 9 to 11, a spacer layer may be formed on the active fin 105 and the isolation pattern 120 to cover the dummy gate structure, and may be anisotropically etched to form the gate spacer 160 on each of opposite sidewalls in the first direction of the dummy gate structure. A fin spacer 170 may be formed on each of opposite sidewalls in the second direction of the upper active pattern 105a.

An upper portion of the active fin 105 adjacent to the gate spacer 160 may be removed to form a second recess 180.

In an implementation, as illustrated in the drawings, only a portion of the upper active pattern 105a may be etched to form the second recess 180, and a bottom of the second recess 180 may be higher than an upper surface of the lower active pattern 105b. In an implementation, the second recess 180 may be formed by etching not only the upper active pattern 105a but also a portion of the lower active pattern 105b, and the bottom of the second recess 180 may be lower than an uppermost surface (e.g., a portion farthest from the substrate 100 in the third direction) of the lower active pattern 105b.

When the second recess 180 is formed, the fin spacer 170 on each of opposite sidewalls in the second direction of the upper active pattern 105a may be partially or entirely removed.

In example embodiments, the etching process for forming the second recess 180 and the etching process for forming the gate spacer 160 and the fin spacer 170 may be performed in-situ.

Figure 14:
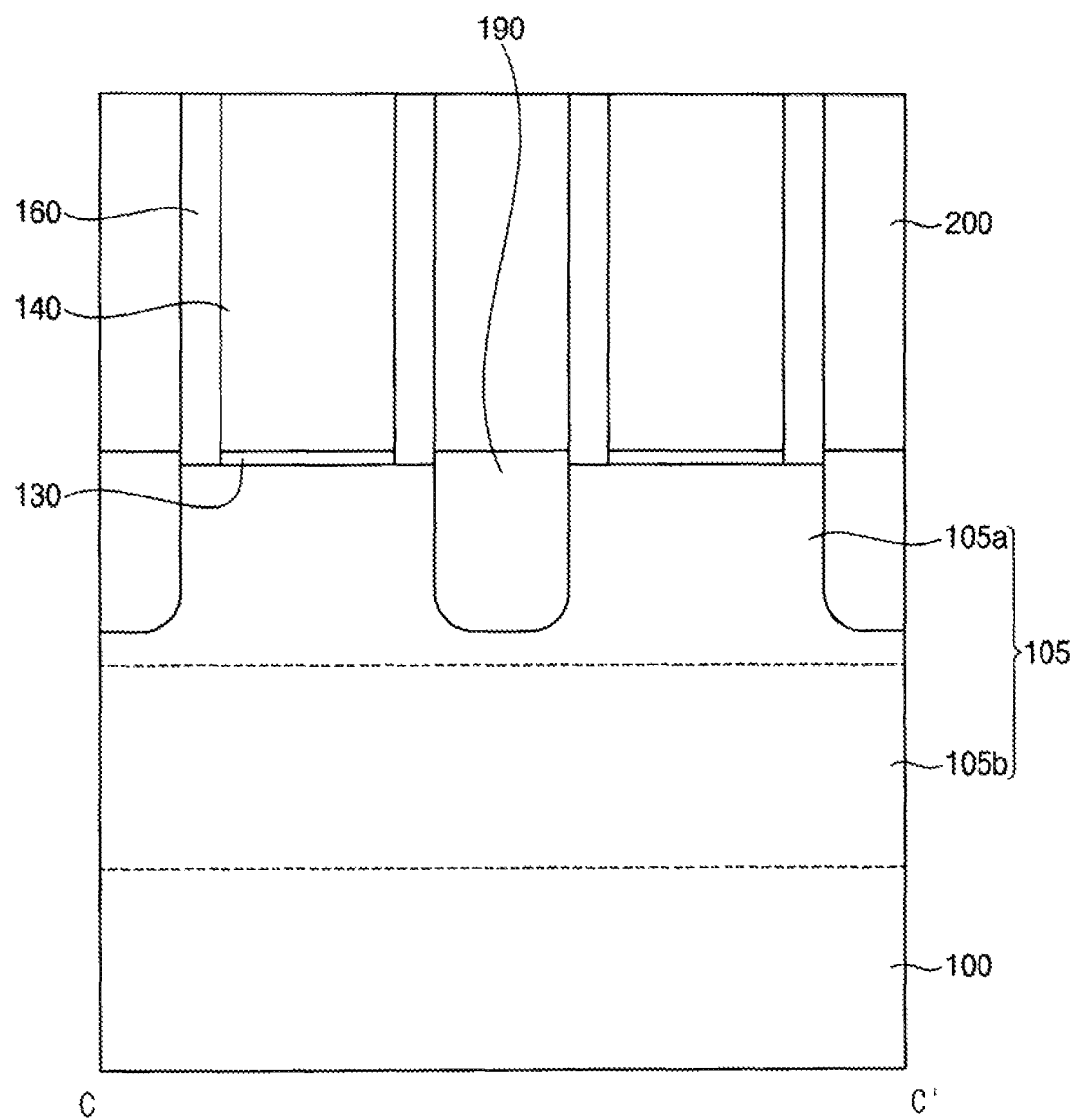

Referring to FIGS. 12 to 14, a source/drain layer 190 may be formed to fill the second recess 180.

In an implementation, the source/drain layer 190 may be formed by a selective epitaxial growth (SEG) process using an upper surface of the active fin 105 exposed by the second recess 180 as a seed.

In an implementation, the SEG process may be performed using a silicon source gas, a germanium source gas, an etching gas, and a carrier gas, so that a single crystalline silicon-germanium layer may be formed as the source/drain layer 190. The SEG process may be performed using p-type impurity source gas, so that a single crystalline silicon-germanium layer doped with p-type impurities may be formed as the source/drain layer 190.

In an implementation, the SEG process may be performed using a silicon source gas, a carbon source gas, an etching gas, and a carrier gas, so that a single crystalline silicon carbide layer may be formed as the source/drain layer 190. The SEG process may be performed using n-type impurity source gas, so that a single crystalline silicon carbide layer doped with n-type impurities may be formed as the source/drain layer 190. In an implementation, the SEG process may be performed using a silicon source gas, an etching gas, and a carrier gas, so that a single crystalline silicon layer may be formed as the source/drain layer 190. The SEG process may be performed using n-type impurity source gas, so that a single crystalline silicon layer doped with n-type impurities may be formed as the source/drain layer 190.

The source/drain layer 190 may grow in a vertical direction substantially perpendicular to the upper surface of the substrate 100 and in a horizontal direction substantially parallel to the upper surface of the substrate 100, and may contact a sidewall of the gate spacer 160.

In an implementation, a distance between the active fins 105 neighboring in the second direction may be small, and the source/drain layers 190 grown from the active fins 105, respectively, may be merged with each other.

A first insulating interlayer 200 may be formed on the active fin 105 and the isolation pattern 120 to cover the dummy gate structure, the gate spacer 160, the fin spacer 170 and the source/drain layer 190, and may be planarized until an upper surface of the dummy gate electrode 140 of the dummy gate structure is exposed. During the planarization process, the dummy gate mask 150 may be also removed.

A space between the merged source/drain layer 190 and the isolation pattern 120 may not be entirely filled with the first insulating interlayer 200, and thus an air gap 205 may be formed.

The planarization process may be performed by a chemical mechanical polishing (CMP) process and/or an etch back process.

Figure 15:
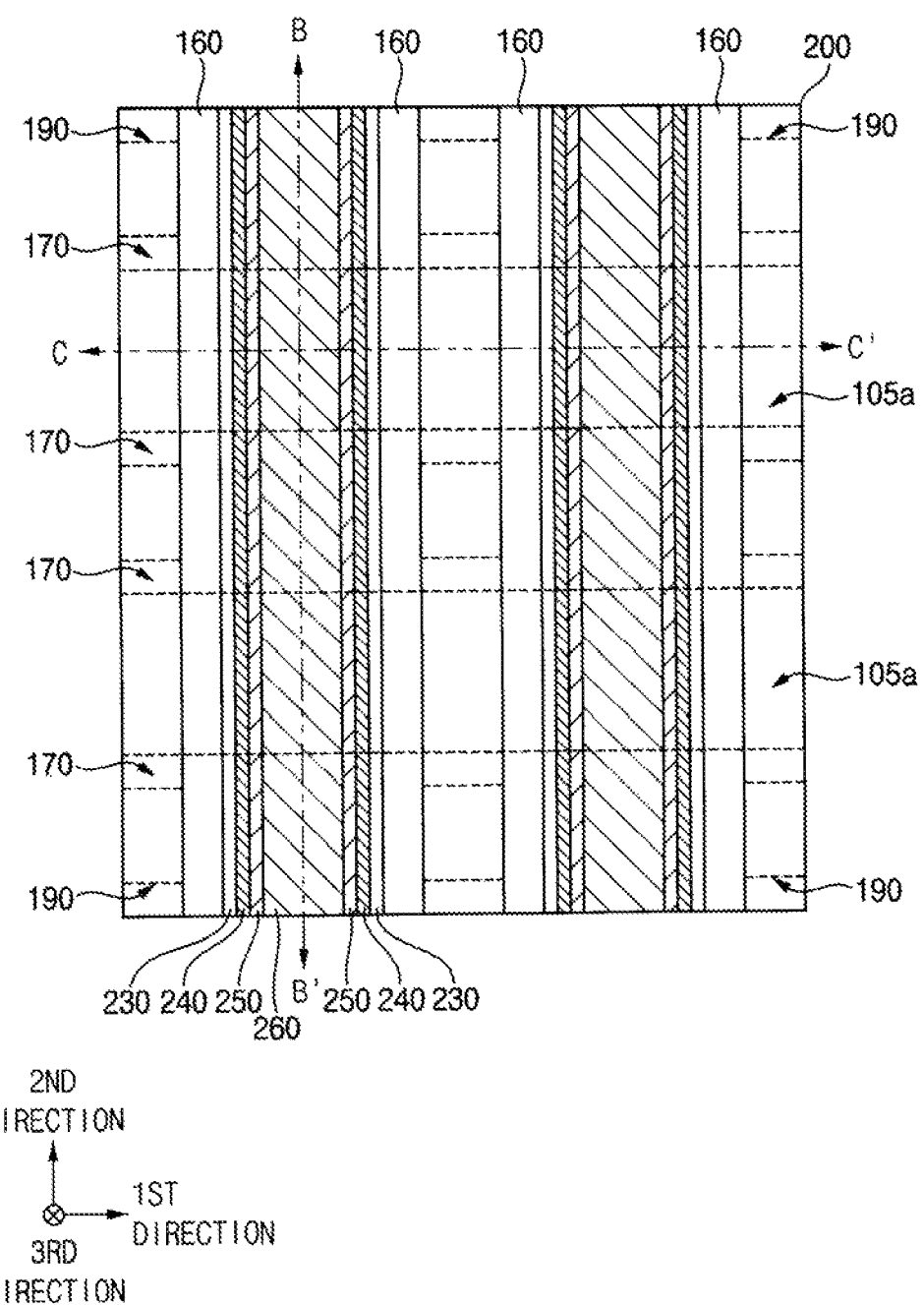
Figure 17:
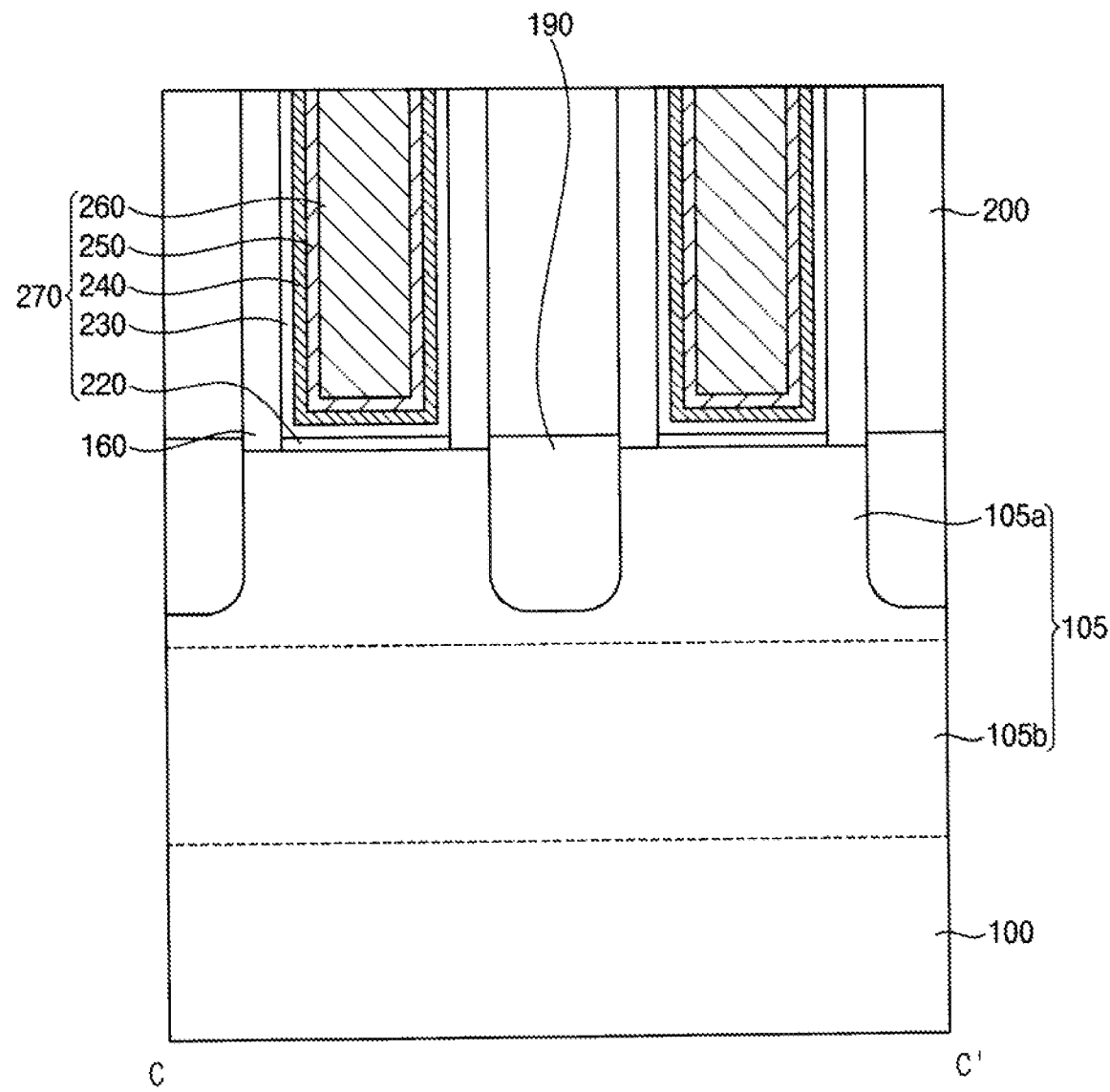

Referring to FIGS. 15 to 17, the exposed dummy gate electrode 140 and the dummy gate insulation pattern 130 thereunder may be removed to form a first opening exposing an inner sidewall of the gate spacer 160 and an upper surface of the active fin 105, and a first gate structure 270 may be formed to fill the first opening.

In an implementation, a thermal oxidation process may be performed on the surface of the active fin 105 exposed by the first opening to form an interface pattern 220, and a gate insulation layer, a gate barrier layer and a first gate electrode layer may be sequentially formed on the interface pattern 220, the isolation pattern 120, the gate spacer 160 and the first insulating interlayer 200, and a second gate electrode layer may be formed on the first gate electrode to fill a remaining portion of the first opening.

The gate insulation layer, the gate barrier layer and the first and second gate electrode layers may be formed by a chemical vapor deposition (CVD) process, an atomic layer deposition (ALD) process, a physical vapor deposition (PVD) process, or the like.

In an implementation, the interface pattern 220 may be also formed by a CVD process, an ALD process, a PVD process, or the like, instead of the thermal oxidation process, and the interface pattern 220 may be also formed not only on the upper surface of the active fin 105 but also on an upper surface of the isolation pattern 120 and the inner sidewall of the gate spacer 160.

The first and second gate electrode layers, the gate barrier layer, and the gate insulation layer may be planarized until the upper surface of the first insulating interlayer 200 is exposed to form a gate insulation pattern 230, a gate barrier 240, and a first gate electrode 250 sequentially stacked on the upper surface of the interface pattern 220, the upper surface of the isolation pattern 120 and the inner sidewall of the gate spacer 160, and a second gate electrode 260 may be formed on the first gate electrode 250 to fill the remaining portion of the first opening.

The interface pattern 220, the gate insulation pattern 230, the gate barrier 240 and the first and second gate electrodes 250 and 260 sequentially stacked may form a first gate structure 270, the first and second gate electrodes 250 and 260 may form a gate electrode structure, and the first gate structure 270 and the source/drain layer 190 may form a transistor. In an implementation, the gate electrode structure may include only one of the first gate electrode 250 and the second gate electrode 260. The transistor may form a PMOS transistor or an NMOS transistor depending on the conductivity type of the source/drain layer 190.

Referring to FIG. 18, upper portions of the first gate structure 270 and the gate spacer 160 may be removed to form a third recess 280, a polishing stop pattern 290 may be formed on a bottom and a sidewall of the third recess 280 and the upper surface of the first insulating interlayer 200, and a capping layer may be formed on the polishing stop pattern 290 to fill a remaining portion of the third recess 280.

The capping layer 300 may include a material having an etching selectivity with respect to a second insulating interlayer 310 to be subsequently formed, e.g., a nitride such as silicon nitride.

In an implementation, the polishing stop pattern 290 may have an etching selectivity or a polishing selectivity with respect to the first insulating interlayer 200, the capping layer 300, and a first contact plug 335 (refer to FIG. 20) to be substantially formed.

The capping layer 300 and the polishing stop pattern 290 may be planarized until the upper surface of the first insulating interlayer 200 is exposed, so that the polishing stop pattern 290 may be formed on the bottom and the sidewall of the third recess 280 and the capping layer 300 may be formed on the polishing stop pattern 290 to fill the remaining portion of the third recess 280. Hereinafter, a portion of the polishing stop pattern 290 on the upper surfaces of the first gate structure 270 and the gate spacer 160 may be referred to as a first portion, and a portion of the polishing stop pattern 290 on the sidewall of the third recess 280 may be referred to as a second portion.

The planarization process may be performed by a CMP process and/or an etch back process.

Figure 19:
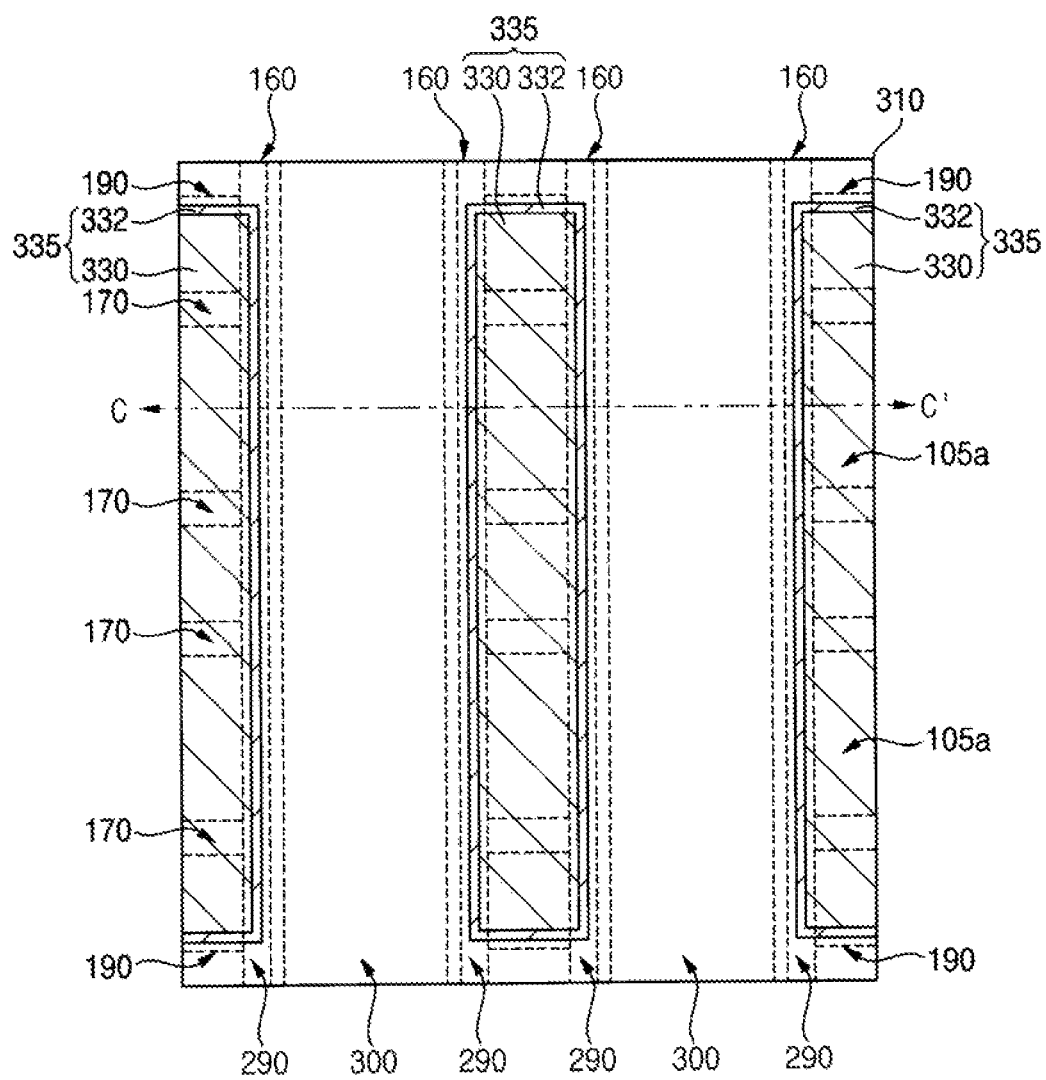
Figure 20:
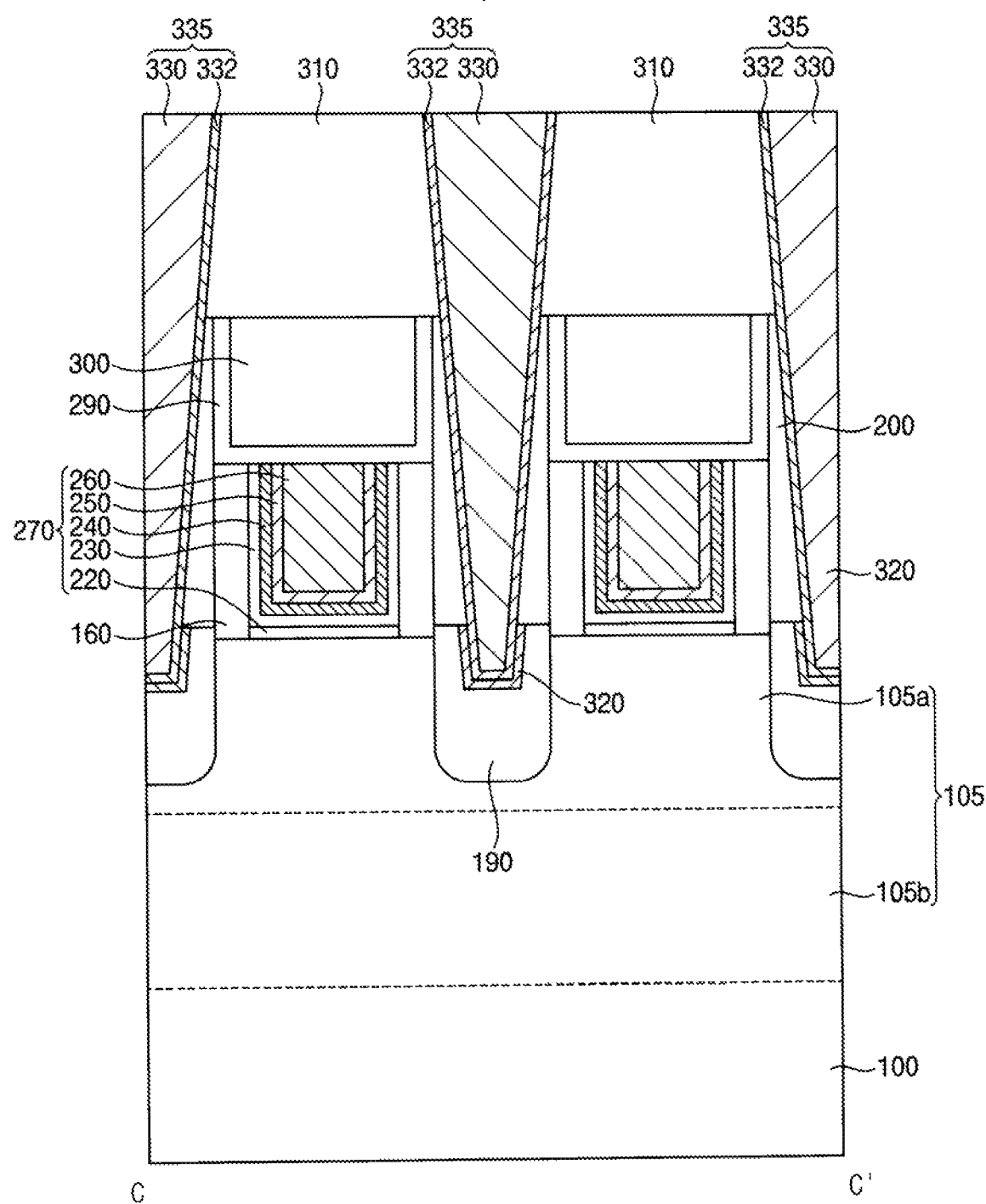

Referring to FIGS. 19 and 20, a second insulating interlayer 310 may be formed on the first insulating interlayer 200, the polishing stop pattern 290 and the capping layer 300, a second opening may be formed through the first and second insulating interlayers 200 and 310 to expose an upper portion of the source/drain layer 190 by an etching process, and the first contact plug 335 may be formed in the second opening.

In an implementation, during the etching process for forming the second opening, even if the second opening were to expose portions of the capping layer 300 and the polishing stop pattern 290 adjacent to the first insulating interlayer 200 due to misalignment, the capping layer 300 and the polishing stop pattern 290 may include a material having an etching selectivity with respect to the first and second insulating interlayers 200 and 310 so as to not be easily removed.

Before forming the first contact plug 335 after forming the second opening, a metal silicide pattern 320 may be further formed on (e.g., the upper surface of) the source/drain layer 190 exposed by the second opening through a silicidation process.

The first contact plug 335 may extend in the second direction and may contact the upper surface of the merged source/drain layer 190. In an implementation, the first contact plug 335 may include a first barrier pattern 332 on the bottom and the sidewall of the second opening and a first metal pattern 330 filling a remaining portion of the second opening.

Figure 21:
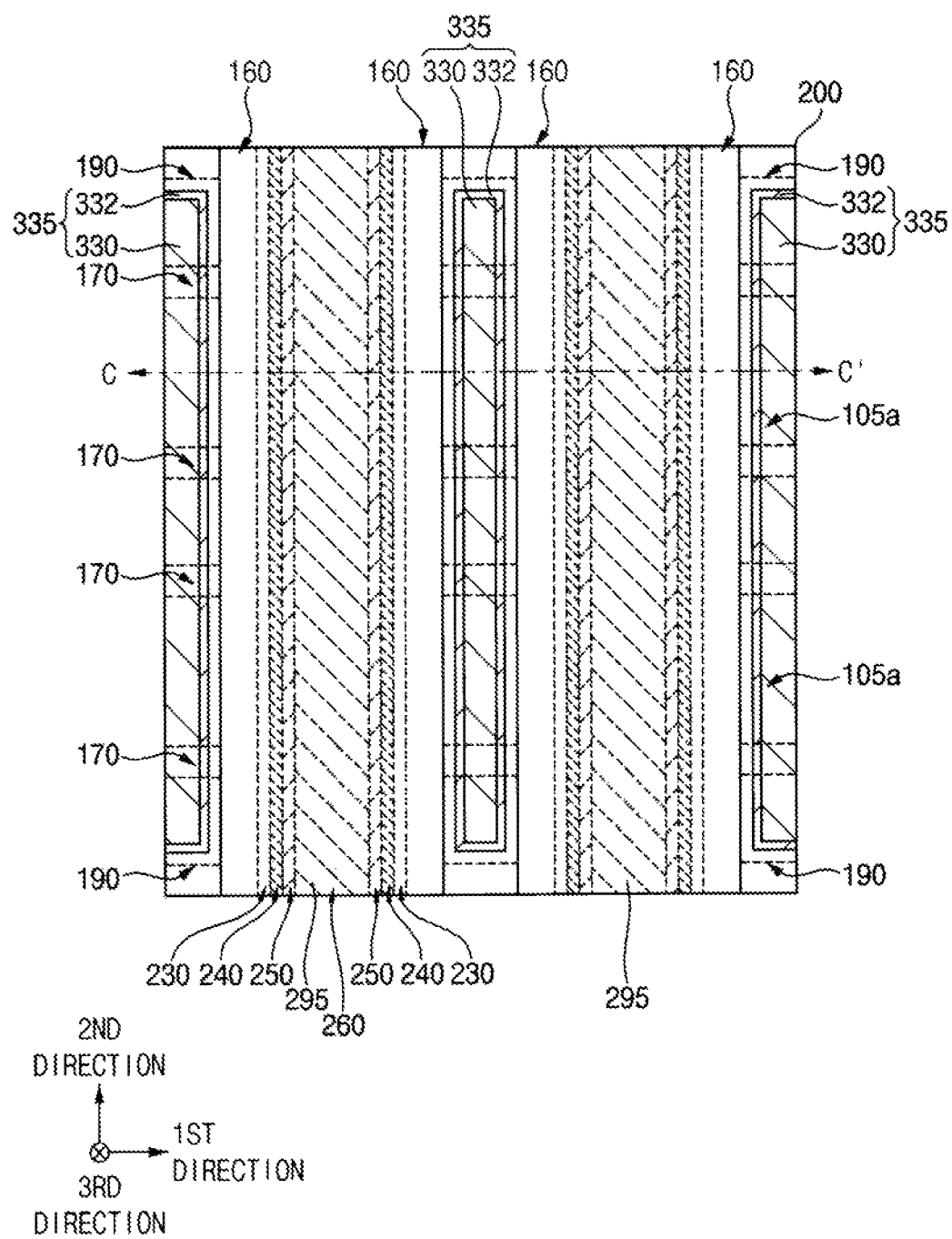
Figure 22:
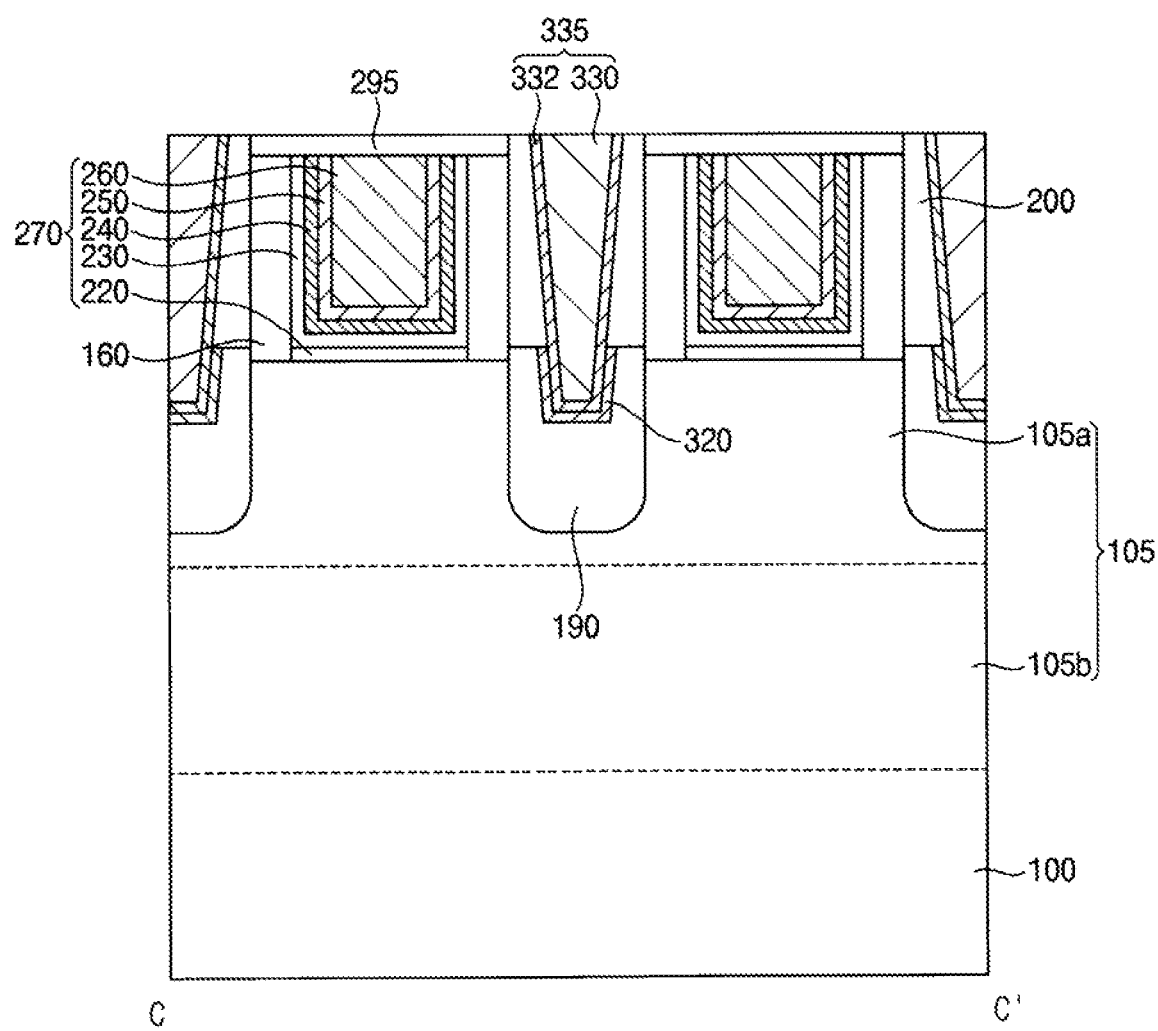

Referring to FIGS. 21 and 22, in example embodiments, a CMP process may be performed until the first portion of the polishing stop pattern 290 is exposed, so as to remove the second insulating interlayer 310, the capping layer 300, an upper portion of the first contact plug 335 and an upper portion of the first insulating interlayer 200, and the second portion of the polishing stop pattern may be also at least partially removed.

In an implementation, the polishing stop pattern may include the material having an etching selectivity with respect to the first and second insulating interlayers 200 and 310 and the first contact plug 335, and thus at least the first portion of the polishing stop pattern 290 may not be removed but may remain during the CMP process, and the remaining portion may be referred to as a polishing stop pattern 295.

By the CMP process, the upper surfaces of the first contact plug 335 and the first insulating interlayer 200 may be lowered.

Referring to FIGS. 1 to 4 again, an etch stop layer 340 and a third insulating interlayer 350 may be sequentially formed on the polishing stop pattern 295, the first contact plug 335, and the first insulating interlayer 200, and a second contact plug 365 (extending through the etch stop layer 340 and the third insulating interlayer 350 to contact the upper surface of the first contact plug 335) and a third contact plug 375 (extending through the third insulating interlayer 350, the etch stop layer 340 and the polishing stop pattern 295 to contact an upper surface of the gate electrode structure) may be formed. Thus, the fabrication of the semiconductor device may be completed.

In an implementation, the upper portions of the first gate structure 270 and the gate spacer 160 may be removed to form the third recess 280, the polishing stop pattern 290 may be formed on the bottom and the sidewall of the third recess 280, and the capping layer 300 may be formed in the third recess 280. After the second insulating interlayer 310 is formed, the first contact plug 335 may be formed through the first and second insulating interlayers 200 and 310 to contact the source/drain layer 190, and the second insulating interlayer 310 and the upper portions of the first insulating interlayer 200 and the first contact plug 335 may be removed by a CMP process until the first portion of the polishing stop pattern 290 on the bottom of the third recess 280 is exposed.

Accordingly, the first contact plug 335 may be formed by a self-aligned method using the capping layer 300 and the polishing stop pattern 290, and further, the upper portion of the first contact plug 335 may be removed by the CMP process so that the upper surface of the first contact plug 335 may be lowered. Accordingly, when electrical signals are transferred through the first contact plug 335, an RC-delay may be reduced.

Figure 23:
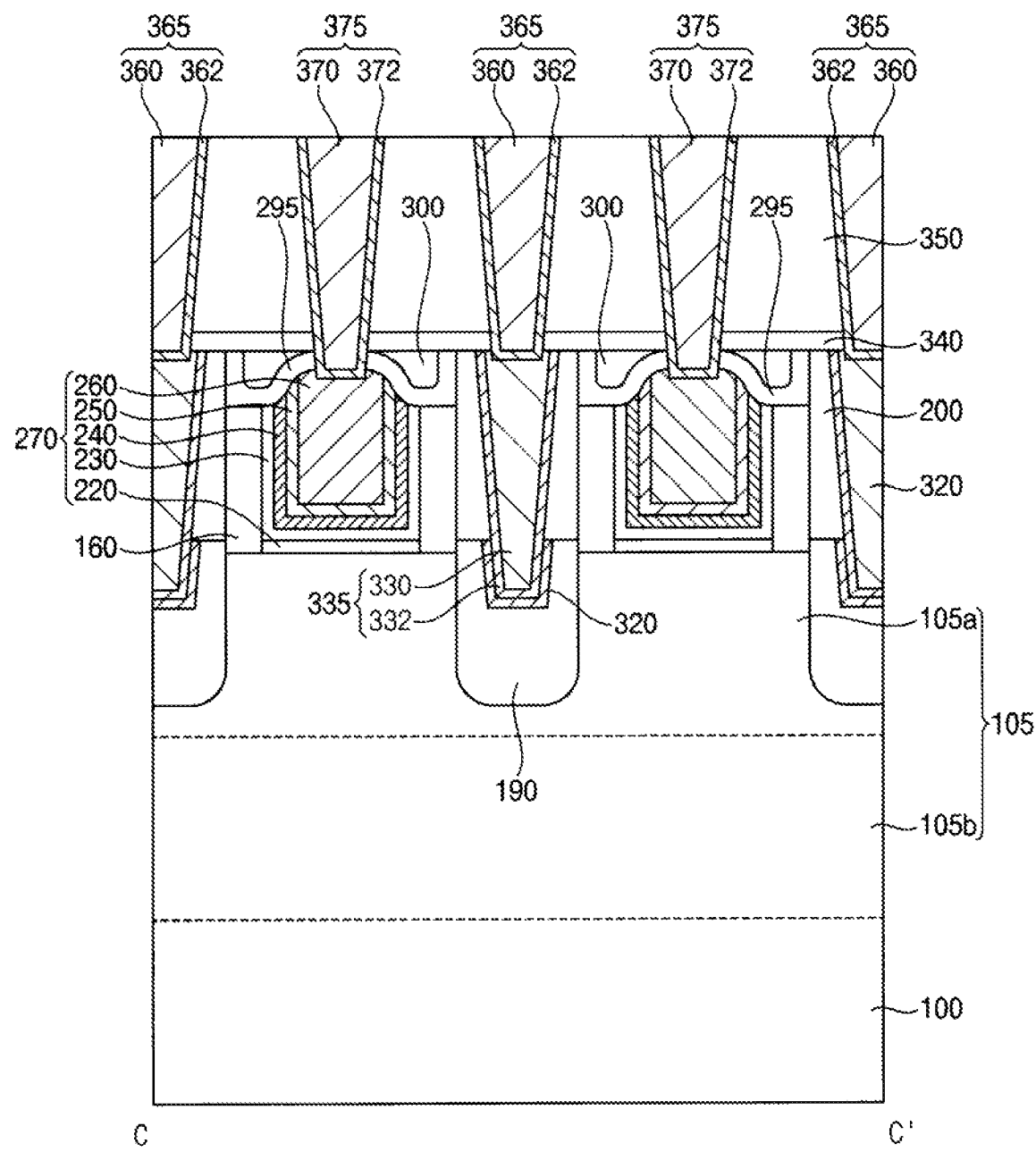
FIG. 23 is a cross-sectional view of a semiconductor device in accordance with example embodiments.

FIG. 23 is a cross-sectional view of a semiconductor device in accordance with example embodiments. FIG. 23 is a cross-sectional view taken along a line C-C' of FIG. 1.

This semiconductor device may be substantially the same as or similar to that of FIGS. 1 to 4, except for the first gate structure, the polishing stop pattern or layer, and the capping layer. Thus, like reference numerals refer to like elements, and repeated detailed descriptions thereon may be omitted herein.

Referring to FIG. 23, an upper surface of the first gate structure 270 may not be flat but rather may have an uneven (e.g., not flat) surface, and thus an upper surface of a first portion of the polishing stop pattern 295 conformally formed on the upper surface of the first gate structure 270 may have a height that is not constant.

In an implementation, an upper surface of the second gate electrode 260 (that is at a central portion in the first direction in the first gate structure 270) may be higher than (e.g., farther from the substrate 100 in the third direction than) uppermost surfaces of the first gate electrode 250, the gate barrier 240, and the gate insulation pattern 230 (that are at an edge portion in the first direction in the first gate structure 270). In an implementation, the upper surface of the second gate electrode 260 may be higher than an upper surface of the gate spacer 160 on the sidewall of the first gate structure 270.

In an implementation, an upper surface of a central portion in the first direction of the first portion of the polishing stop pattern 295 may be higher than an upper surface of an edge portion in the first direction of the first portion of the polishing stop pattern 295. In an implementation, the polishing stop pattern 295 may include a second portion extending in the third direction from an end (in the first direction) of the edge portion of the first portion of the polishing stop pattern 295. In an implementation, an upper surface of the second portion of the polishing stop pattern 295 may be substantially coplanar with the central portion of the first portion of the polishing stop pattern 295.

In an implementation, portions of the capping layer 300 may remain on the first portion of the polishing stop pattern 295. An upper surface of the capping layer 300 may be substantially coplanar with an upper surface of the central portion of the first portion of the polishing stop pattern 295. In an implementation, the capping layer 300 may be on the edge portion of the first portion of the polishing stop pattern 295, and may contact a sidewall (e.g., inner sidewall) of the second portion of the polishing stop pattern 295.

The capping layer 300 may include a nitride, e.g., silicon nitride.

Figure 24:
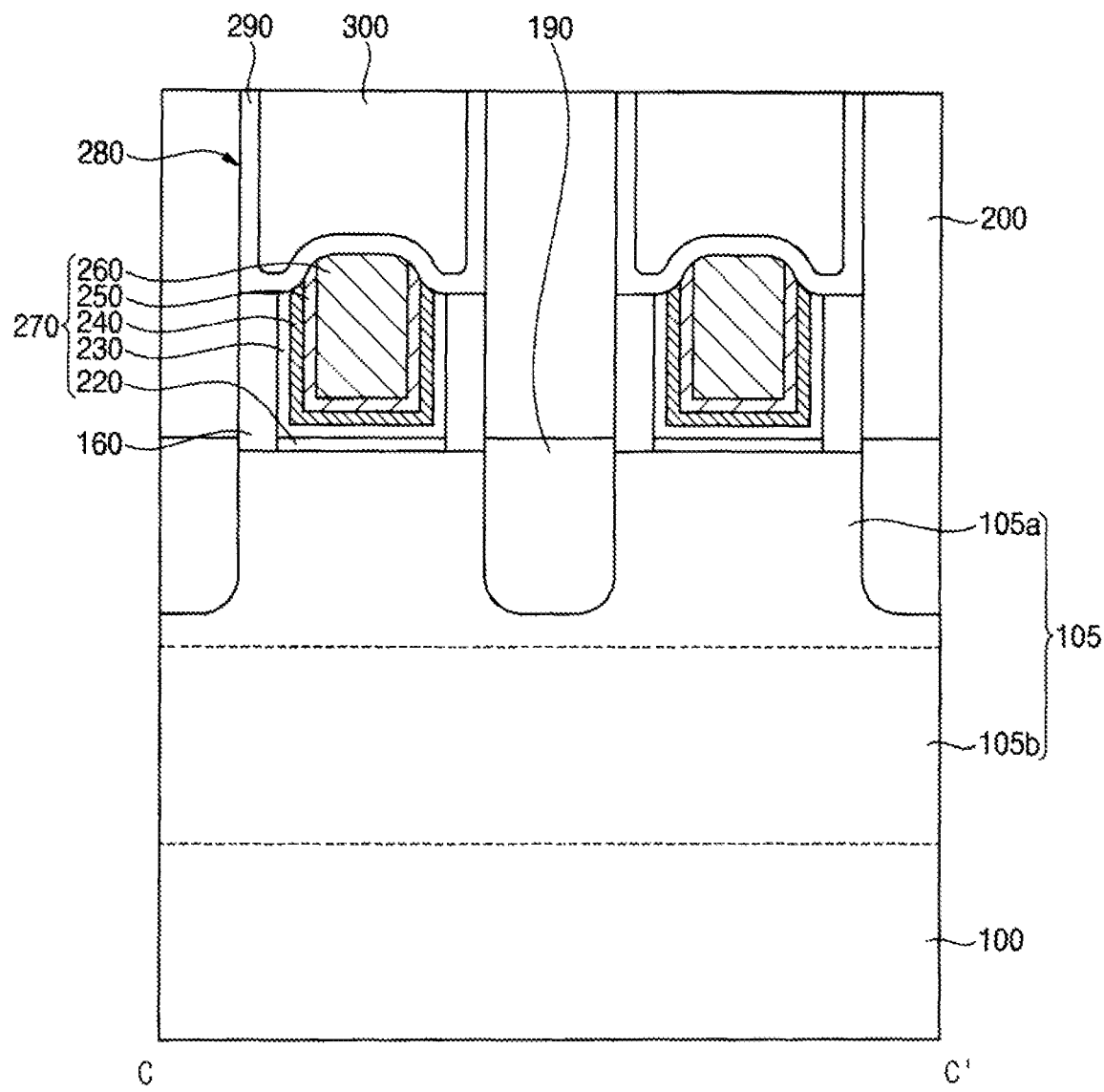

FIGS. 24 and 25 are cross-sectional views of stages in a method of manufacturing a semiconductor device in accordance with example embodiments. FIGS. 24 and 25 are cross-sectional views taken along a line C-C' of FIG. 1.

This method may include processes substantially the same as or similar to those illustrated with reference to FIGS. 5 to 22 and FIGS. 1 to 4, and repeated explanations thereon may be omitted herein.

Referring to FIG. 24, processes substantially the same as or similar to those illustrated with reference to FIGS. 5 to 18 may be performed to form the polishing stop pattern 290 and the capping layer 300 in the third recess 280.

In an implementation, the third recess 280 (that may be formed by removing the upper portions of the first gate structure 270 and the gate spacer 160) may have a bottom that may not be flat but rather may be uneven. In an implementation, during the etching process for forming the third recess 280, the second gate electrode 260 in the first gate structure 270 may be relatively less etched, and a central portion of the bottom of the third recess 280 may be higher than an edge portion of the bottom of the third recess 280.

In an implementation, the first portion of the polishing stop pattern 290 on the bottom of the third recess 280 may not be formed on the same or a single plane (e.g., the first portion of the polishing stop pattern 290 may not be flat), and a height of a central portion of the polishing stop pattern 290 may be higher than a height of an edge portion of the polishing stop pattern 290.

Referring to FIG. 25, processes substantially the same as or similar to those illustrated with reference to FIGS. 19 to 22 may be performed so that a CMP process may be performed until an upper surface of the first portion of the polishing stop pattern 290 is exposed to remove the second insulating interlayer 310, (portions of) the capping layer 300, an upper portion of the first contact plug 335, and an upper portion of the first insulating interlayer 200.

In an implementation, as illustrated above, the first portion of the polishing stop pattern 290 may not be on a single plane and may not have the same height, and the central portion of the first portion of the polishing stop pattern 290 may be relatively high, the capping layer 300 may not be entirely removed during the CMP process and a portion of the capping layer 300 in the third recess 280, e.g., in an edge lower portion of the third recess 280, may remain. In an implementation, an upper portion of the second portion of the polishing stop pattern 290 may be removed, and a lower portion thereof may remain.

Referring to FIG. 23 again, processes substantially the same as or similar to those illustrated with reference to FIGS. 1 to 4 may be performed to complete the fabrication of the semiconductor device.

Figure 26:
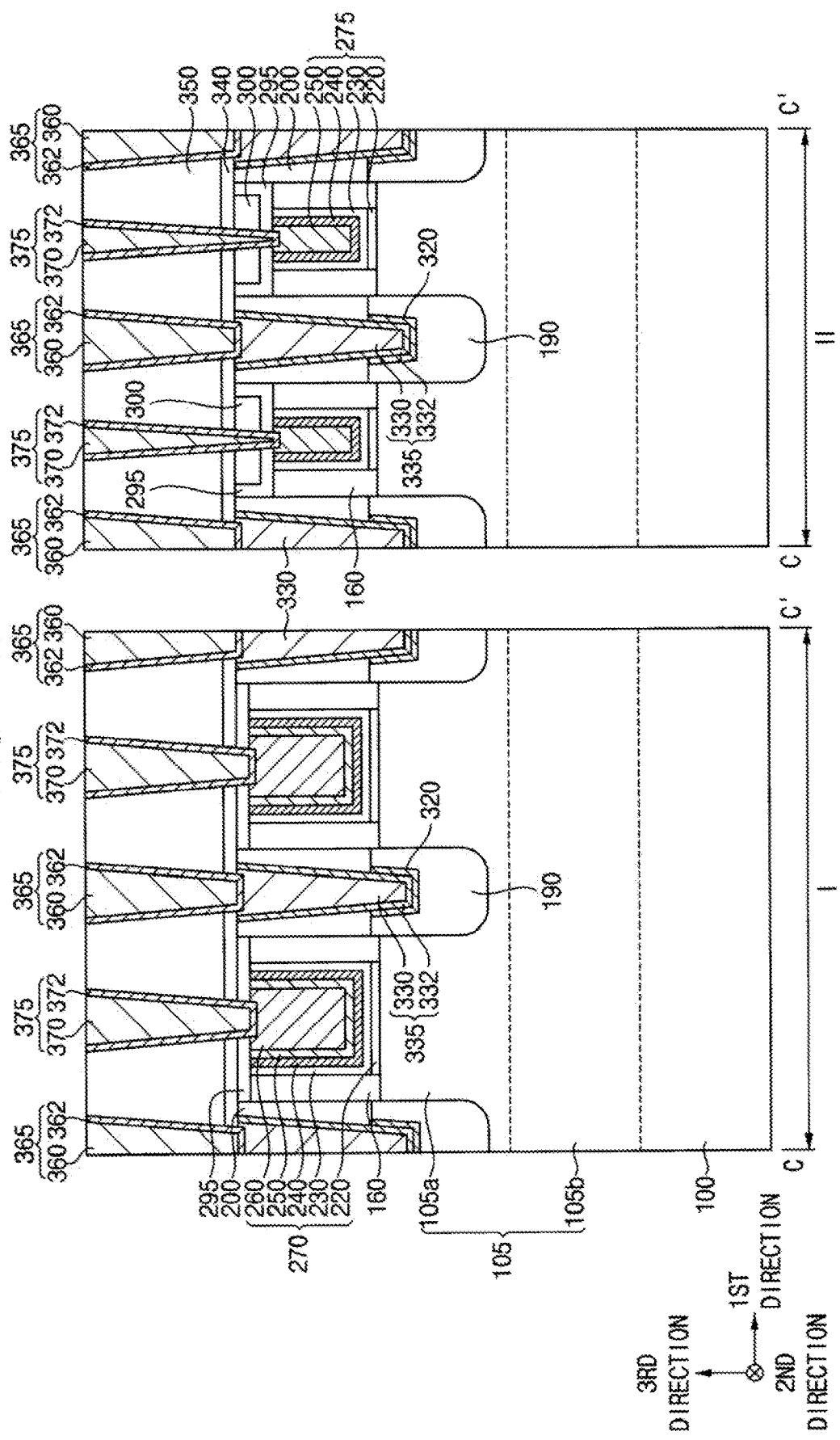
FIG. 26 is a cross-sectional view of a semiconductor device in accordance with example embodiments.

FIG. 26 is a cross-sectional view of a semiconductor device in accordance with example embodiments. FIG. 26 is a cross-sectional view taken along a line C-C' of FIG. 1.

This semiconductor device may be substantially the same as or similar to that of FIGS. 1 to 4, except for the first gate structure, the polishing stop pattern or layer, and the capping layer. Thus, like reference numerals refer to like elements, and repeated detailed descriptions thereon may be omitted herein.

Referring to FIG. 26, the semiconductor device may be formed on the substrate 100 including first and second regions I and II. The first region I of the substrate 100 may be a high voltage region to which a relatively high voltage may be applied, and the second region II of the substrate 100 may be a low voltage region to which a relatively low voltage may be applied.

The first gate structure 270 and the polishing stop pattern 295 on the first region I of the substrate 100 may be substantially the same as those shown in FIGS. 1 to 4, and hereinafter, a second gate structure 275 and the polishing stop pattern 295 on the second region II of the substrate 100 will be mainly illustrated.

In an implementation, the second gate structure 275 on the second region II of the substrate 100 (to which a relatively low voltage is applied) may have a width in the first direction less than that of (e.g., the width in the first direction) of the first gate structure 270 on the first region I of the substrate 100 (to which a relatively high voltage is applied). In an implementation, the second gate structure 275 may not include the second gate electrode 260, and may only include the first gate electrode 250 in a gate electrode structure.

In an implementation, an upper surface of the second gate structure 275 may be lower (e.g., closer to the substrate 100 in the third direction) than an upper surface of the first gate structure 270. In an implementation, an upper surface of the gate spacer 160 on a sidewall of the second gate structure 275 may be also lower than an upper surface of the gate spacer 160 on the sidewall of the first gate structure 270.

In an implementation, the polishing stop pattern 295 on the second gate structure 275 and the gate spacer 160 on the sidewall thereof may include not only a first portion on the second gate structure 275 and the gate spacer 160 but also a second portion extending in the third direction from an end (in the first direction) of the first portion thereof.

In an implementation, the capping layer 300 may be on the first portion of the polishing stop pattern 295 on the second gate structure 275 and the gate spacer 160, and the capping layer 300 may cover a (e.g., inner) sidewall of the second portion of the polishing stop pattern 295. In an implementation, an upper surface of the capping layer 300 may be substantially coplanar with an upper surface of the second portion of the polishing stop pattern 295, and substantially coplanar with the upper surface of the polishing stop pattern 295 on the first gate structure 270 and the gate spacer 160 on the sidewall of the first gate structure 270.

Figure 27:
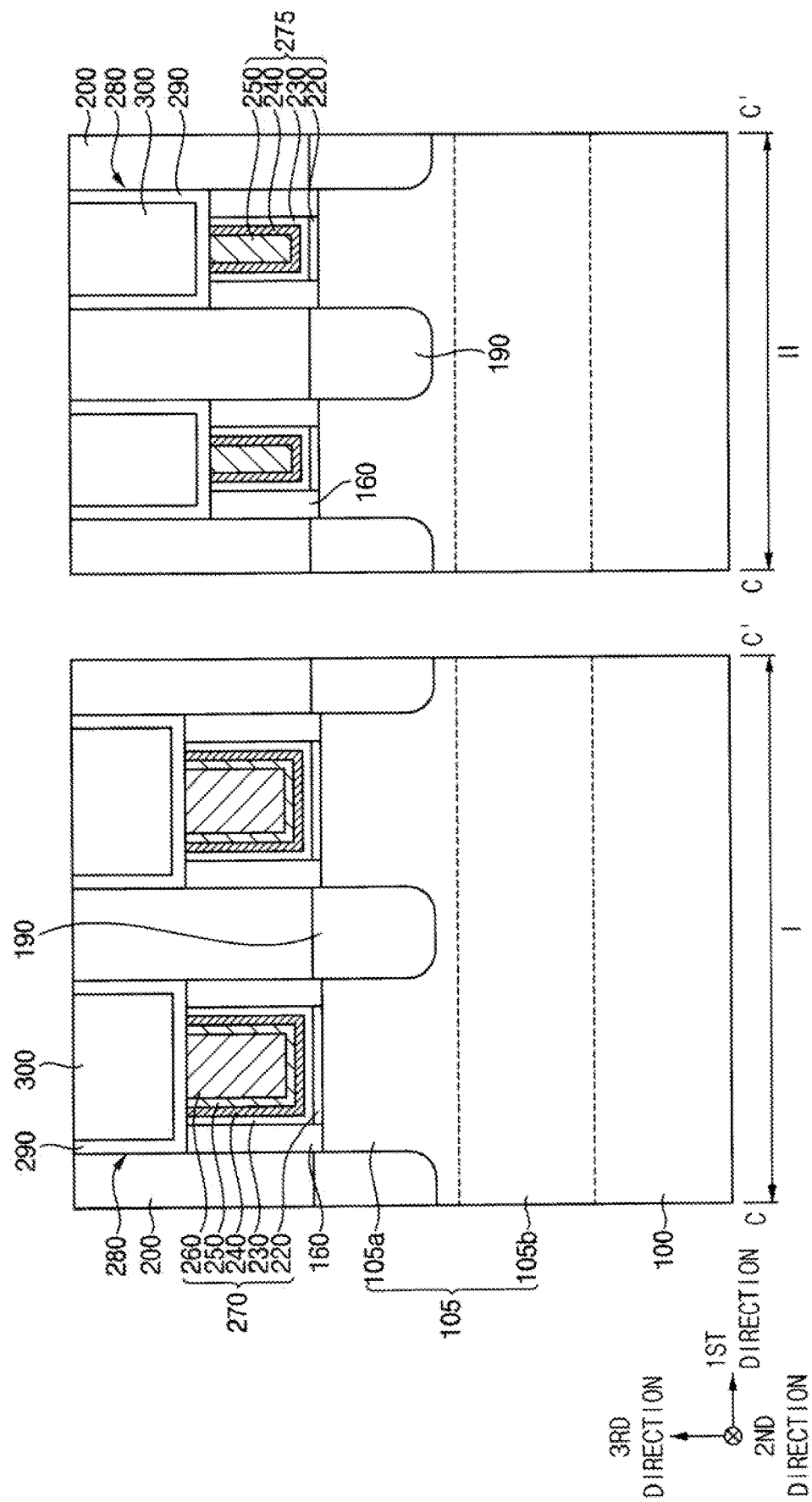
FIGS. 27 and 28 are cross-sectional views of stages in a method of manufacturing a semiconductor device in accordance with example embodiments.
Figure 28:
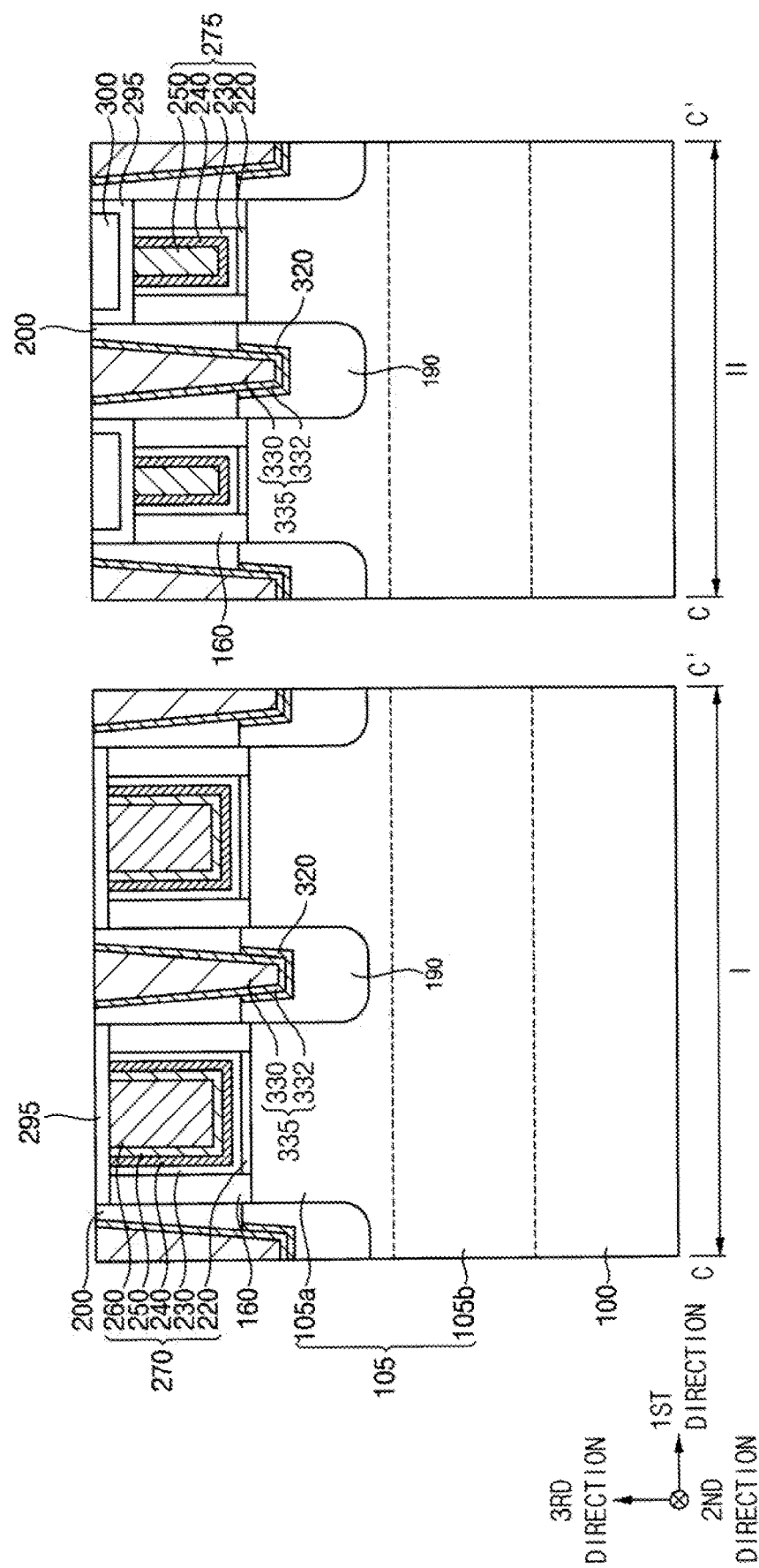

FIGS. 27 and 28 are cross-sectional views of stages in a method of manufacturing a semiconductor device in accordance with example embodiments. FIGS. 27 and 28 are cross-sectional views taken along a line C-C' of FIG. 1.

This semiconductor device may include processes substantially the same as or similar to those illustrated with reference to FIGS. 5 to 22 and FIGS. 1 to 4, and thus repeated explanations thereon may be omitted herein.

Referring to FIG. 27, processes substantially the same as or similar to those illustrated with reference to FIGS. 5 to 18 may be performed.

In an implementation, unlike the first gate structure 270 on the first region I of the substrate 100, the second gate structure 275 on the second region II of the substrate 100 may not include the second gate electrode 260, and the gate electrode structure may include only the first gate electrode 250.

In an implementation, the second gate structure 275 may have a width (in the first direction) less than that of the first gate structure 270, and when the first and second gate structures 270 and 275 are formed in the first openings (that may be formed by the processes illustrated with reference to FIGS. 15 to 17), the first opening on the second region II of the substrate 100 may be entirely filled with the first gate electrode 250 so that no space for the second gate electrode 260 may remain.

Processes substantially the same as or similar to those illustrated with reference to FIG. 18 may be performed to remove upper portions of the first and second gate structures 270 and 275 and the gate spacer 160, so that the third recesses 280 may be formed. In an implementation, one of the third recesses 280 that may be formed by removing the upper portion of the first gate structure 270 having a relatively large width may have a depth greater than that of one of the third recesses 280 that may be formed by removing the upper portion of the second gate structure 275 having a relatively smaller width.

In an implementation, a height of the first portion of the polishing stop pattern 290 on or at the bottom of the third recess 280 formed from or on the upper portion of the first gate structure 270 may be greater than a height of the first portion of the polishing stop pattern 290 on or at the bottom of the third recess 280 formed from or on the upper portion of the second gate structure 275.

Referring to FIG. 28, processes substantially the same as or similar to those illustrated with reference to FIGS. 19 to 22 may be performed, so that a CMP process may be performed until the upper surface of the first portion of the polishing stop pattern 290 is exposed.

In an implementation, as described above, an upper surface of the first portion of the polishing stop pattern 290 on the upper surface of the first gate structure 270 may be higher than an upper surface of the first portion of the polishing stop pattern 290 on the upper surface of the second gate structure 275, and the CMP process may be performed until the upper surface of the first portion of the polishing stop pattern 290 on the upper surface of the first gate structure 270 is exposed. Thus, not only the first portion of the polishing stop pattern 290 but also a lower portion of the second portion thereof may remain on the upper surface of the second gate structure 275 to form the polishing stop pattern 295, and the capping layer 300 may not be entirely removed, but rather may partially remain on the polishing stop pattern 295.

Referring to FIG. 26 again, processes substantially the same as or similar to those illustrated with reference to FIGS. 1 to 4 may be performed to complete the fabrication of the semiconductor device.

Figure 29:
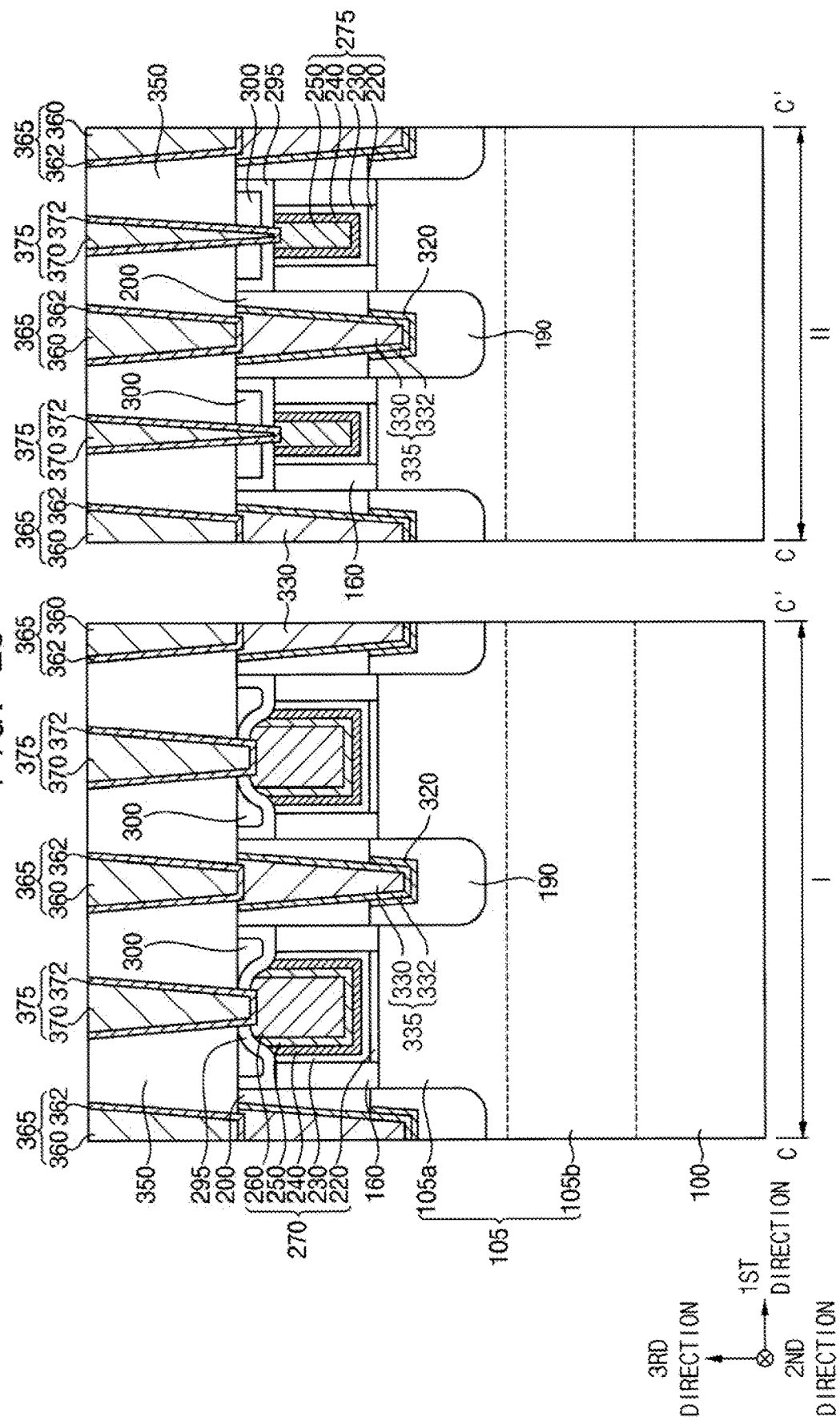
FIG. 29 is a cross-sectional view of a semiconductor device in accordance with example embodiments.

FIG. 29 is a cross-sectional view of a semiconductor device in accordance with example embodiments. FIG. 29 is a cross-sectional view taken along a line C-C' of FIG. 1.

This semiconductor device may be substantially the same as or similar to that of FIG. 26, except for the gate structure, the polishing stop pattern or layer and the capping layer. Thus, like reference numerals refer to like elements, and repeated detailed descriptions thereon may be omitted herein.

Referring to FIG. 29, the first gate structure 270 and the polishing stop pattern 295 on the first region I of the substrate 100 may be substantially the same as those shown in FIG. 23.

In an implementation, the upper surface of the second gate electrode 260 of the first gate structure 270 may be higher than the upper surfaces of other elements of the first gate structure 270 and the gate spacer 160, the upper surface of the central portion of the first portion of the polishing stop pattern 295 may be higher than the upper surface of the edge portion of the first portion of the polishing stop pattern 295, and the polishing stop pattern 295 may further include the second portion extending in the third direction from the end (in the first direction) of the first portion. In an implementation, the capping layer 300 may be on the polishing stop pattern 295, and the upper surface of the capping layer 300 may be substantially coplanar with the upper surface of the central portion of the first portion of the polishing stop pattern 295 or the upper surface of the second portion of the polishing stop pattern 295.

In an implementation, the second gate structure 275 and the polishing stop pattern 295 on the second region II of the substrate 100 may be substantially the same as those shown in FIG. 26.

In an implementation, the second gate structure 275 may not include the second gate electrode 260, and thus the upper portion of the second gate structure 275 may be uniformly etched so that the second gate structure 275 may have a flat upper surface. Accordingly, the first portion of the polishing stop pattern 295 on the upper surface of the second gate structure 275 may have a flat upper surface, and the capping layer 300 may be formed on the polishing stop pattern 295. The upper surface of the second gate structure 275 may be higher than the upper surface of the first gate structure 270, and a thickness of the capping layer 300 on the second gate structure 275 may be greater than a thickness of the capping layer 300 on the first gate structure 270.

Figure 30:
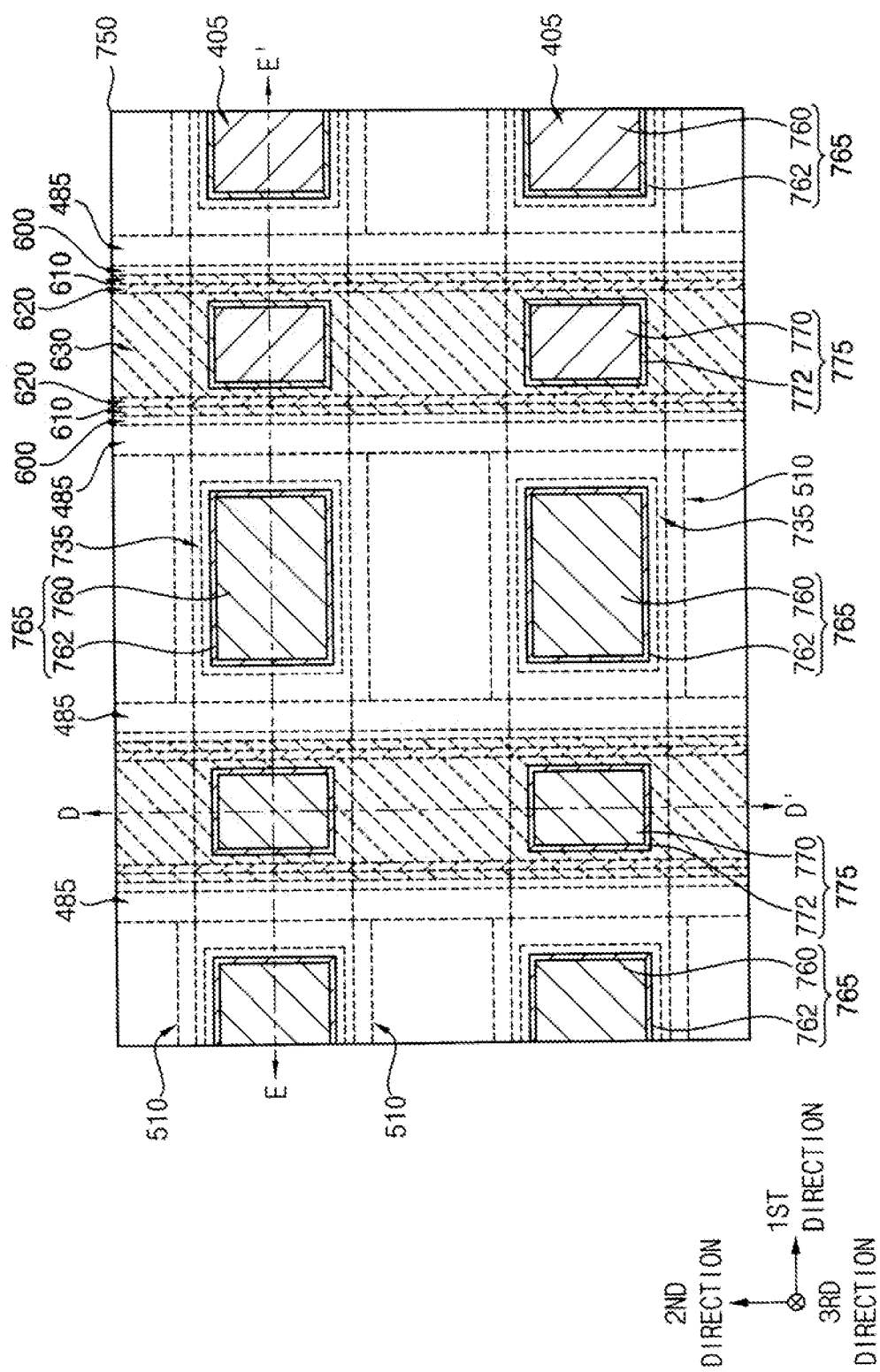
FIGS. 30 to 32 are a plan view and cross-sectional views of a semiconductor device in accordance with example embodiments.
Figure 31:
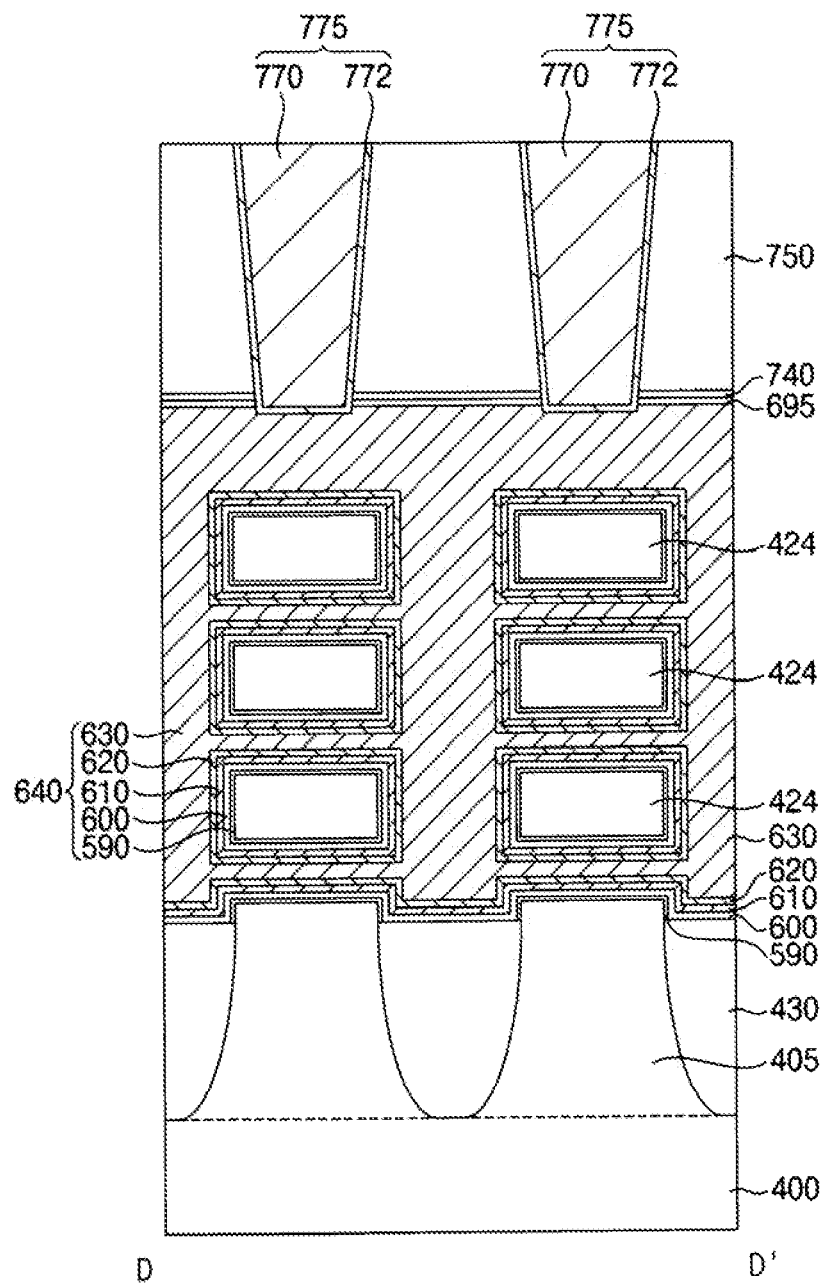
Figure 32:
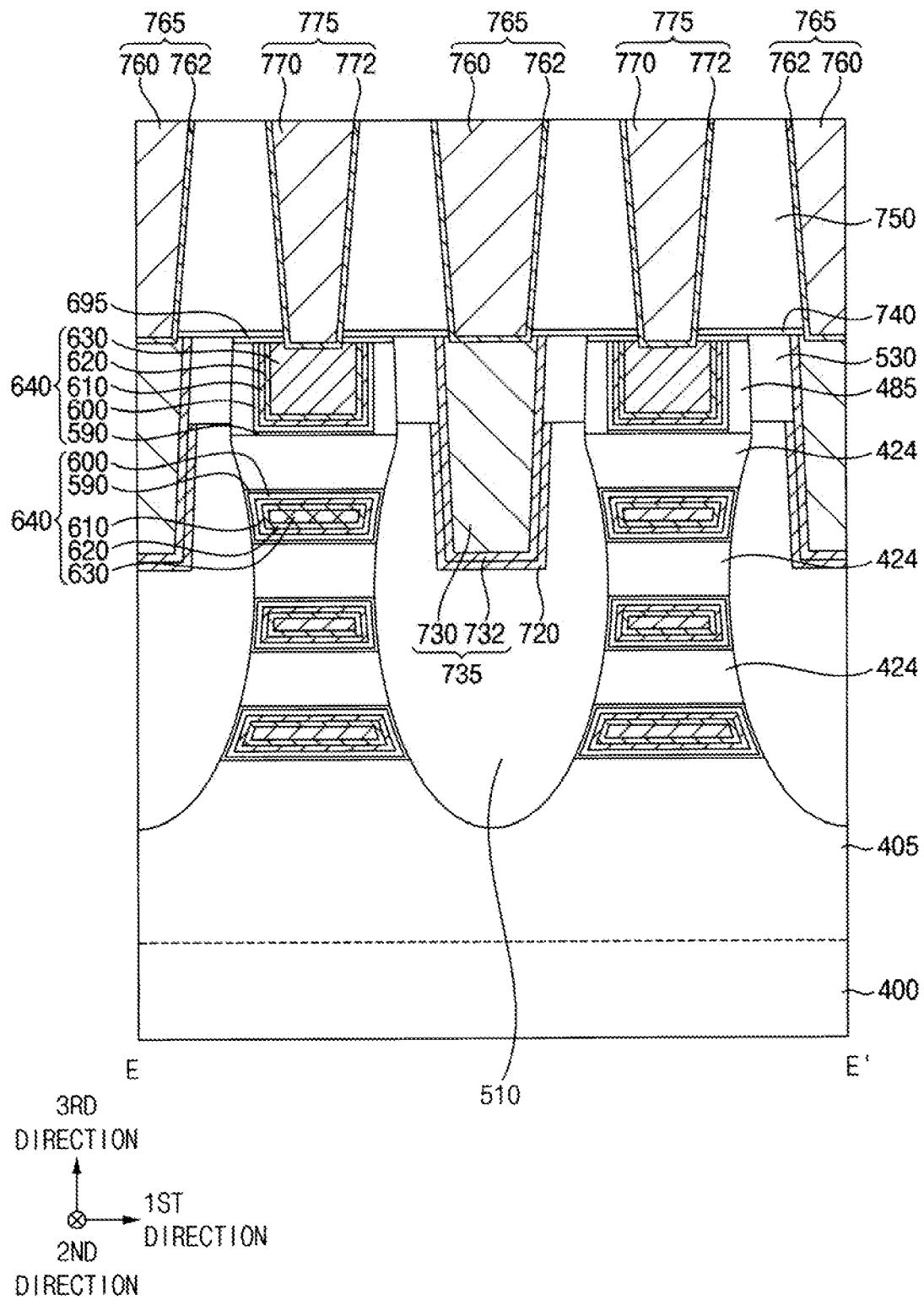

FIGS. 30 to 32 are a plan view and cross-sectional views of a semiconductor device in accordance with example embodiments. Particularly, FIG. 30 is the plan view, FIG. 31 is a cross-sectional view taken along a line D-D' of FIG. 30, and FIG. 32 is a cross-sectional view taken along a line E-E' of FIG. 30. This semiconductor device may include elements substantially the same as or similar to those of FIGS. 1 to 4, and thus repeated detailed descriptions thereon may be omitted herein.

Referring to FIGS. 30 to 32, the semiconductor device may include an active pattern 405, a semiconductor pattern 424, a first gate structure 640, a gate spacer 485, a polishing stop pattern 695, and a source/drain layer 510 on a substrate 400. The semiconductor device may further include an etch stop layer 740, first and third insulating interlayers 530 and 750, first to third contact plugs 735, 765 and 775, and a metal silicide pattern 720.

The active pattern 405 may protrude from the substrate 400 in the third direction, and may extend (e.g., lengthwise) in the first direction. In an implementation, two active patterns 405 may be included, as shown in the drawings. In an implementation, more than two active patterns 405 may be spaced apart from each other in the second direction on the substrate 400. The active pattern 405 may be formed by removing an upper portion of the substrate 400, and thus may include the same material as the substrate 400. Each of opposite sidewalls in the second direction of the active pattern 405 may be covered by the isolation pattern 430.

A plurality of semiconductor patterns 424 may be formed at a plurality of levels (e.g., distances from the substrate 400 in the third direction), respectively, over an upper surface of the active pattern 405 to be spaced apart from each other in the third direction. In an implementation, as illustrated in the drawings, three semiconductor patterns 424 may be formed at three levels, respectively. In an implementation, two semiconductor patterns 424 may be spaced apart from each other in the first direction at each level on the active pattern 405 extending in the first direction, or more than two semiconductor patterns 424 may be spaced apart from each other in the first direction at each level on the active pattern 405.

In an implementation, the semiconductor pattern 424 may include nano-sheets or nano-wires containing a semiconductor material, e.g., silicon, germanium, or the like. In an implementation, the semiconductor pattern 424 may serve as a channel of a transistor, and thus may be referred to as a channel.

The first gate structure 640 may be on the substrate 400 and may extend in the second direction, and may surround a central portion in the first direction each of the semiconductor patterns 424. In an implementation, the first gate structure 640 may cover lower and upper surfaces and opposite sidewalls in the second direction of the central portion of each of the semiconductor patterns 424. The first gate structure 640 may cover the semiconductor patterns 424 on two active patterns 405 in the second direction. In an implementation, the first gate structure 640 may extend in the second direction on the substrate 400 having the isolation pattern 430 thereon, and may cover the semiconductor patterns 424 on more than two active patterns 405 spaced apart from each other in the second direction.

In an implementation, two first gate structures 640 are formed in the first direction on the substrate 400, as illustrated in the drawings, or more than two first gate structures 640 may be formed in the first direction.

The first gate structure 640 may include an interface pattern 590, a gate insulation pattern 600, a gate barrier 610 and a first gate electrode 620 sequentially stacked on a surface of each of the semiconductor patterns 424, an upper surface of the active pattern 405, and a sidewall of the source/drain layer 510.

The interface pattern 590 may be on the surface of each of the semiconductor patterns 424, the upper surface of the active pattern 405, and the sidewall of the source/drain layer 510, the gate insulation pattern 600 may be on a surface of the interface pattern 590 and an inner sidewall of the gate spacer 485, the gate barrier 610 and the first gate electrode 620 may be sequentially on the gate insulation pattern 600, and the second gate electrode 630 may fill a space between the semiconductor patterns 424 spaced apart from each other in the third direction, a space between a lowermost one of the semiconductor patterns 424 and the active pattern 405, and a space between the gate spacers 485 on an uppermost one of the semiconductor patterns 424.

The gate spacer 485 may cover each of opposite sidewalls in the first direction of the first gate structure 640 on the uppermost one of the semiconductor patterns 424, and thus may extend in the second direction.

The polishing stop pattern 695 may be on the first gate structure 640 and the gate spacer 485, and may cover upper surfaces of the first gate structure 640 and the gate spacer 485. In an implementation, the polishing stop pattern 695 may also extend (e.g., lengthwise) in the second direction. In an implementation, the polishing stop pattern 695 may be entirely formed on the same, e.g., a single, flat plane, and a central portion and an edge portion of the polishing stop pattern 695 may have the same height.

The polishing stop pattern 695 may include a material having an etching selectivity or a polishing selectivity with respect to the first insulating interlayer 530, a capping layer 700 (referring to FIG. 44), and the first contact plug 735, and thus may serve as a polishing end point when removing the first insulating interlayer 530, the capping layer, and the first contact plug 735 by a polishing process.

The source/drain layer 510 may be between the first gate structures 640 on the active pattern 405 of the substrate 400, and may commonly contact each of opposite sidewalls in the first direction of the semiconductor patterns 424 at a plurality of levels, respectively, and may be connected thereto. An upper portion of the source/drain layer 510 may contact an outer sidewall of the gate spacer 485.

In an implementation, the source/drain layer 510 may include single crystalline silicon-germanium doped with p-type impurities, and thus may form a PMOS transistor together with the first gate structure 640, the source/drain layer 510 and each of the semiconductor patterns 424 serving as a channel. A plurality of semiconductor patterns 424 may be spaced apart from each other in the third direction, and thus the semiconductor device may be a multi-bridge channel field effect transistor (MBCFET).

In an implementation, the source/drain layer 510 may include single crystalline silicon doped with n-type impurities or single crystalline silicon carbide doped with n-type impurities, and thus may form a PMOS transistor together with the first gate structure 640, the source/drain layer 510 and each of the semiconductor patterns 424 serving as a channel. A plurality of semiconductor patterns 424 may be spaced apart from each other in the third direction, and thus the semiconductor device may be an MBCFET.

The first insulating interlayer 530 may be on the active pattern 405 of the substrate 400 and the isolation pattern 430, and may cover a sidewall of the gate spacer 485 on each of opposite sidewalls of the first gate structure 640, a sidewall of the polishing stop pattern 695, and an upper surface of the source/drain layer 510.

The first contact plug 735 may extend through the first insulating interlayer 530 between the first gate structures 640 spaced apart from each other in the first direction to contact an upper surface of the source/drain layer 510. In an implementation, the first contact plug 735 may not contact sidewalls of the first gate structures 640, and the first insulating interlayer 530 may be between the sidewalls of the first gate structures 640 and the first contact plug 735. In an implementation, the first contact plug 735 may be self-aligned with the sidewalls of the first gate structures 640, and may contact the sidewalls of the first gate structures 640. In an implementation, an upper surface of the first contact plug 735 may be substantially coplanar with upper surfaces of the first insulating interlayer 530 and the polishing stop pattern 695.

In an implementation, the first contact plug 735 may include a first metal pattern 730 and a first barrier pattern 732 covering a lower surface and a sidewall of the first metal pattern 730.

The metal silicide pattern 720 may be between a lower surface and a lower sidewall of the first contact plug 735 and the upper surface of the source/drain layer 510.

The etch stop layer 740 may be commonly on the polishing stop pattern 695, the first insulating interlayer 530, and the first contact plug 735, and may cover upper surfaces of the polishing stop pattern 695, the first insulating interlayer 530, and the first contact plug 735. The third insulating interlayer 750 may be on the etch stop layer 740.

The second contact plug 765 may extend through the third insulating interlayer 750 and the etch stop layer 740 to contact an upper surface of the first contact plug 735, and the third contact plug 775 may extend through the third insulating interlayer 750, the etch stop layer 740 and the polishing stop pattern 695 to contact an upper surface of the first gate structure 640.

In an implementation, the second contact plug 765 may include a second metal pattern 760 and a second barrier pattern 762 covering a lower surface and a sidewall of the second metal pattern 760, and the third contact plug 775 may include a third metal pattern 770 and a third barrier pattern 772 covering a lower surface and a sidewall of the third metal pattern 770.

The second and third contact plugs 765 and 775 may have various types of layouts in addition to the layout shown in the drawings.

As illustrated with reference to FIGS. 1 to 4, a height of the upper surface of the first contact plug 735 may be only slightly different from a height of the upper surface of the first gate structure 640. Thus, the parasitic capacitance by the first contact plugs 735 and the first insulating interlayer 530 may have a relatively small value, and an RC-delay of signals through the first contact plugs 735 may be reduced.

In an implementation, each of the first contact plugs 735 may have a relatively small thickness in the third direction in which signals may flow, so as to have a reduced resistance.

FIGS. 33 to 46 are plan views and cross-sectional views of stages in a method of manufacturing a semiconductor device in accordance with example embodiments. Particularly, FIGS. 33, 35, 38 and 42 are the plan views, and FIGS. 34, 36-37, 39-41 and 43-46 are the cross-sectional views.

Figure 34:
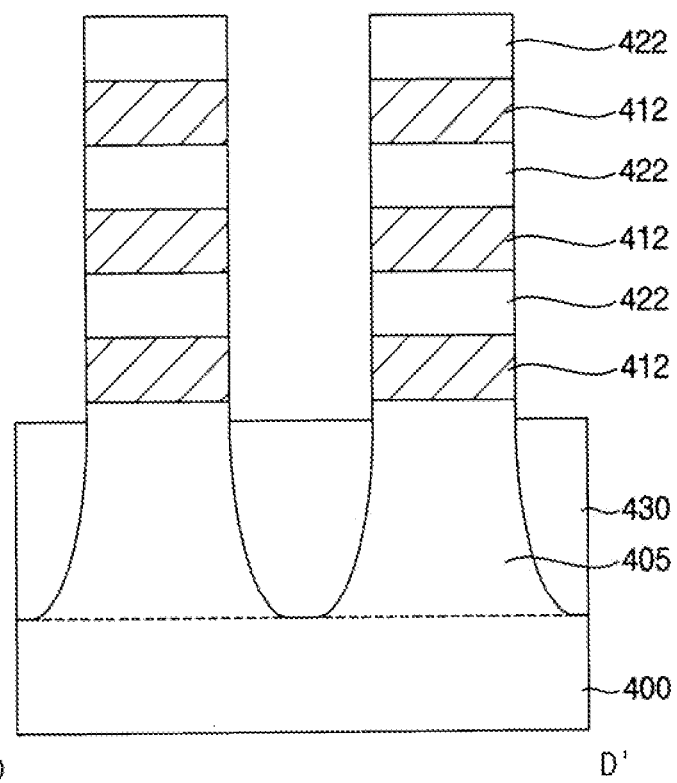
Figure 36:
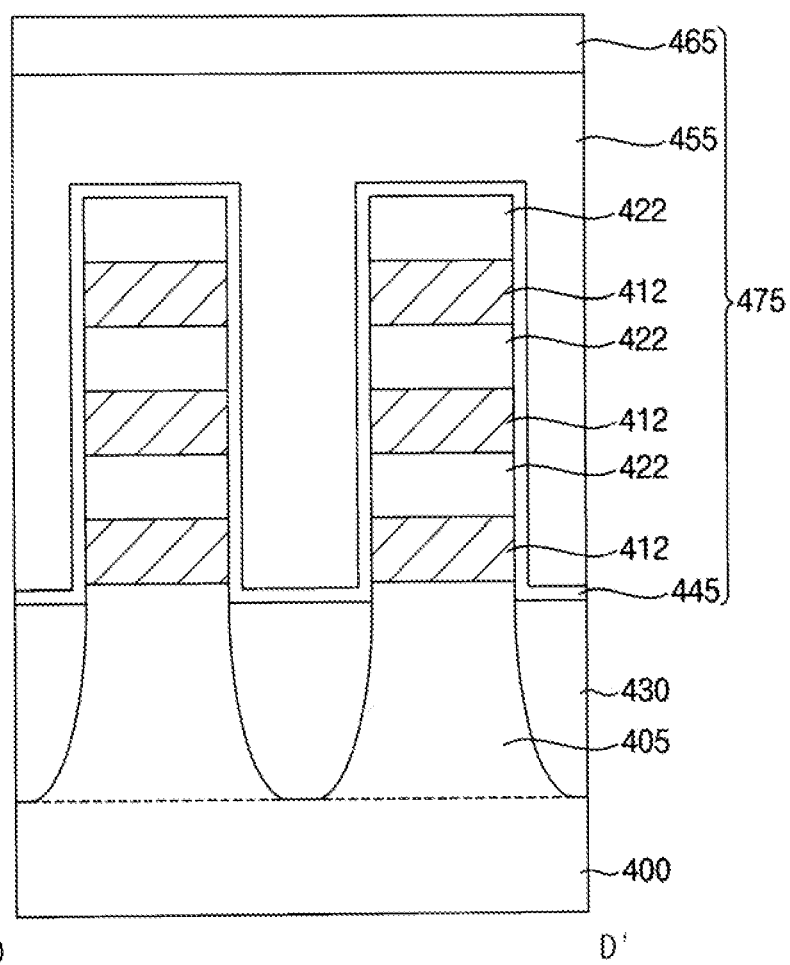

FIGS. 34 and 36 are cross-sectional views taken along lines D-D' of corresponding plan views, respectively, and FIGS. 37, 39-41 and 43-46 are cross-sectional views taken along lines E-E' of corresponding plan views, respectively.

This method may include processes substantially the same as or similar to those illustrated with reference to FIGS. 5 to 22 and FIGS. 1 to 4, and thus repeated descriptions thereon may be omitted herein.

Figure 33:
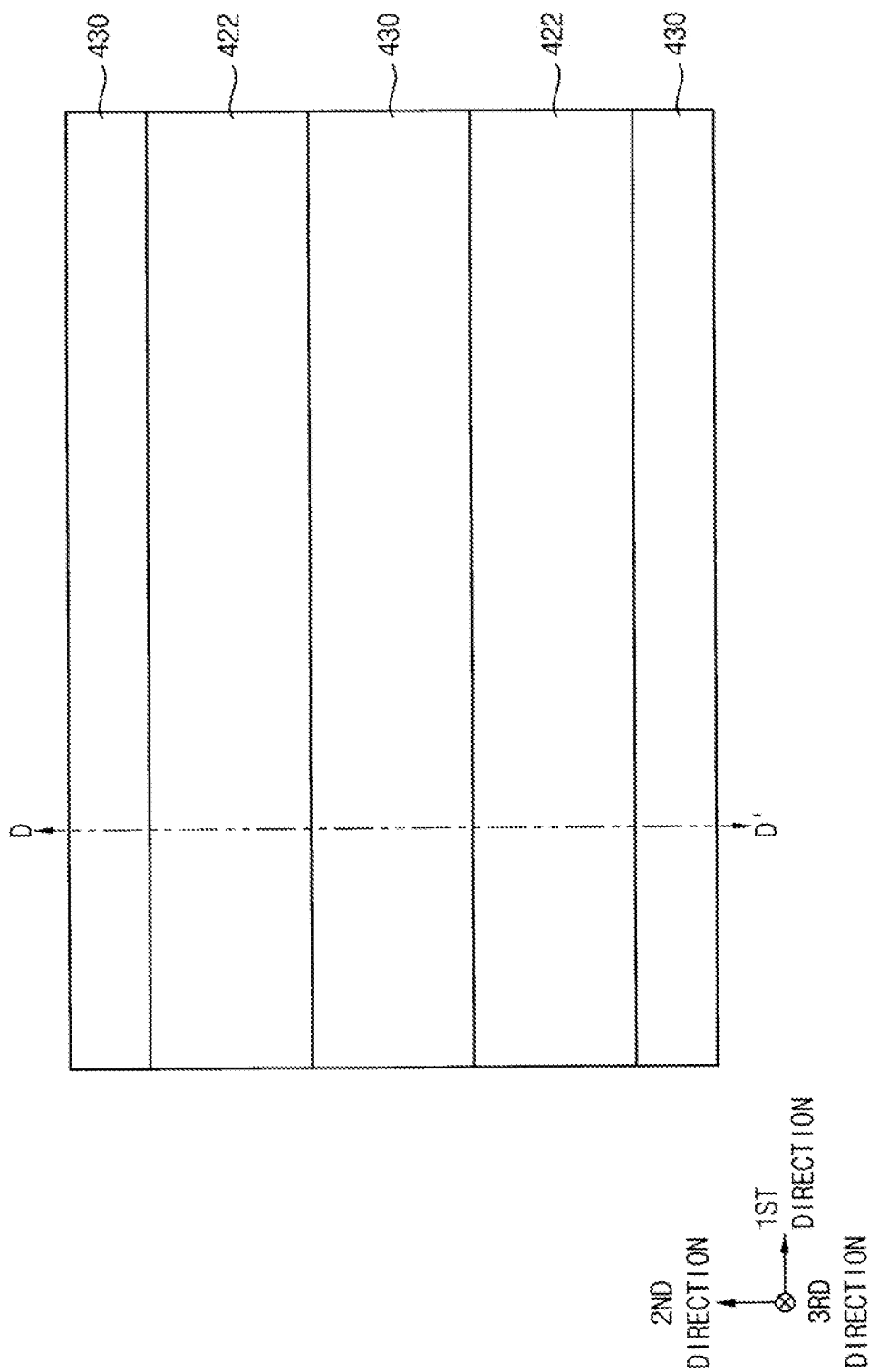
FIGS. 33 to 46 are plan views and cross-sectional views of stages in a method of manufacturing a semiconductor device in accordance with example embodiments.

Referring to FIGS. 33 and 34, a sacrificial layer and a semiconductor layer may be alternately and repeatedly stacked on a substrate 400, an etching mask extending in the first direction may be formed on an uppermost one of the semiconductor layers, and the semiconductor layers, the sacrificial layers, and an upper portion of the substrate 400 may be etched using the etching mask.

Thus, an active pattern 405 may be formed on the substrate 400 to extend in the first direction, and a fin structure including sacrificial lines 412 and semiconductor lines 422 alternately and repeatedly stacked may be formed on the active pattern 405. In an implementation, a plurality of fin structures may be spaced apart from each other in the second direction on the substrate 400.

In an implementation, three sacrificial lines 412 and three semiconductor lines 422 may be formed at three levels, respectively, as illustrated in the drawings. The sacrificial lines 412 may include a material having an etching selectivity with respect to the substrate 400 and the semiconductor lines 422.

An isolation pattern 430 may be formed on the substrate 400 to cover a sidewall of the active pattern 405.

Figure 35:
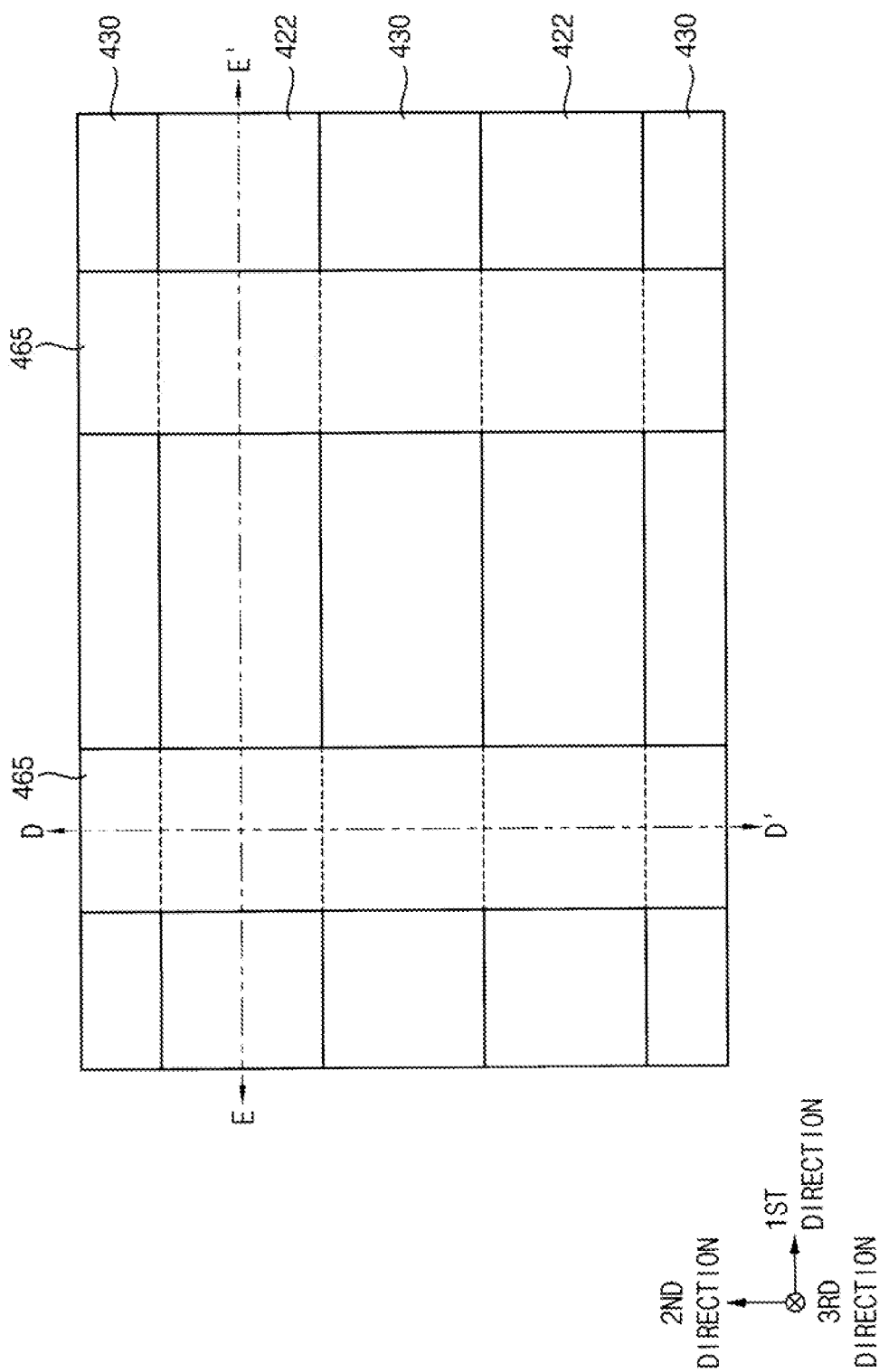
Figure 37:
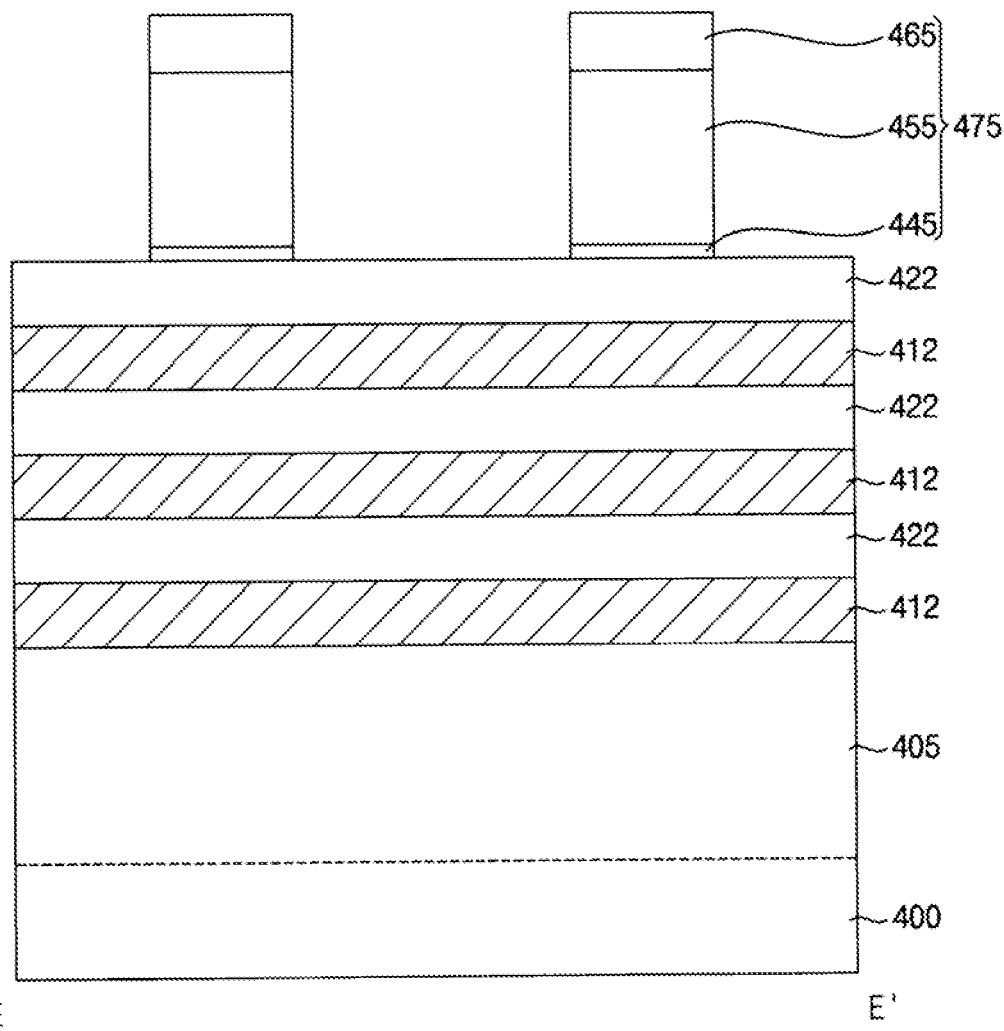

Referring to FIGS. 35 to 37, a dummy gate structure 475 may be formed on the substrate 400 to partially cover the fin structure and the isolation pattern 430.

In an implementation, a dummy gate insulation layer, a dummy gate electrode layer and a dummy gate mask layer may be sequentially formed on the substrate 400 having the fin structure and the isolation pattern 430 thereon, an etching mask extending in the second direction may be formed on the dummy gate mask layer, and the dummy gate mask layer may be etched using the etching mask to form a dummy gate mask 465.

The dummy gate electrode layer and the dummy gate insulation layer may be etched using the dummy gate mask 465 as an etching mask to form a dummy gate electrode 455 and a dummy gate insulation pattern 445, respectively.

The dummy gate insulation pattern 445, the dummy gate electrode 455 and the dummy gate mask 465 sequentially stacked on the active pattern 405 and a portion of the isolation pattern 430 adjacent thereto may form a dummy gate structure 475. In an implementation, the dummy gate structure 475 may extend in the second direction on the fin structure and the isolation pattern 430, and may cover an upper surface and opposite sidewalls in the second direction of the fin structure.

Figure 38:
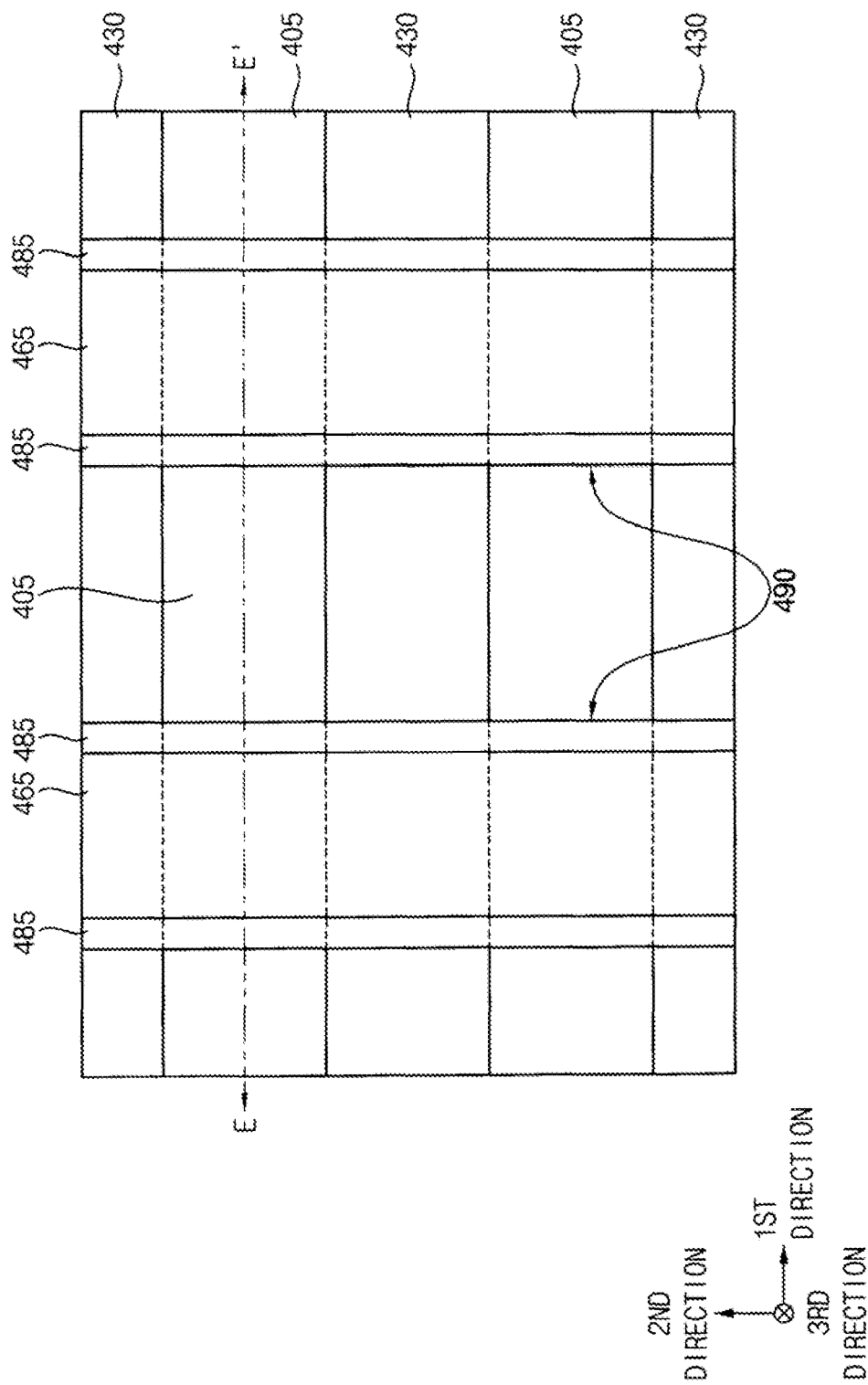
Figure 39:
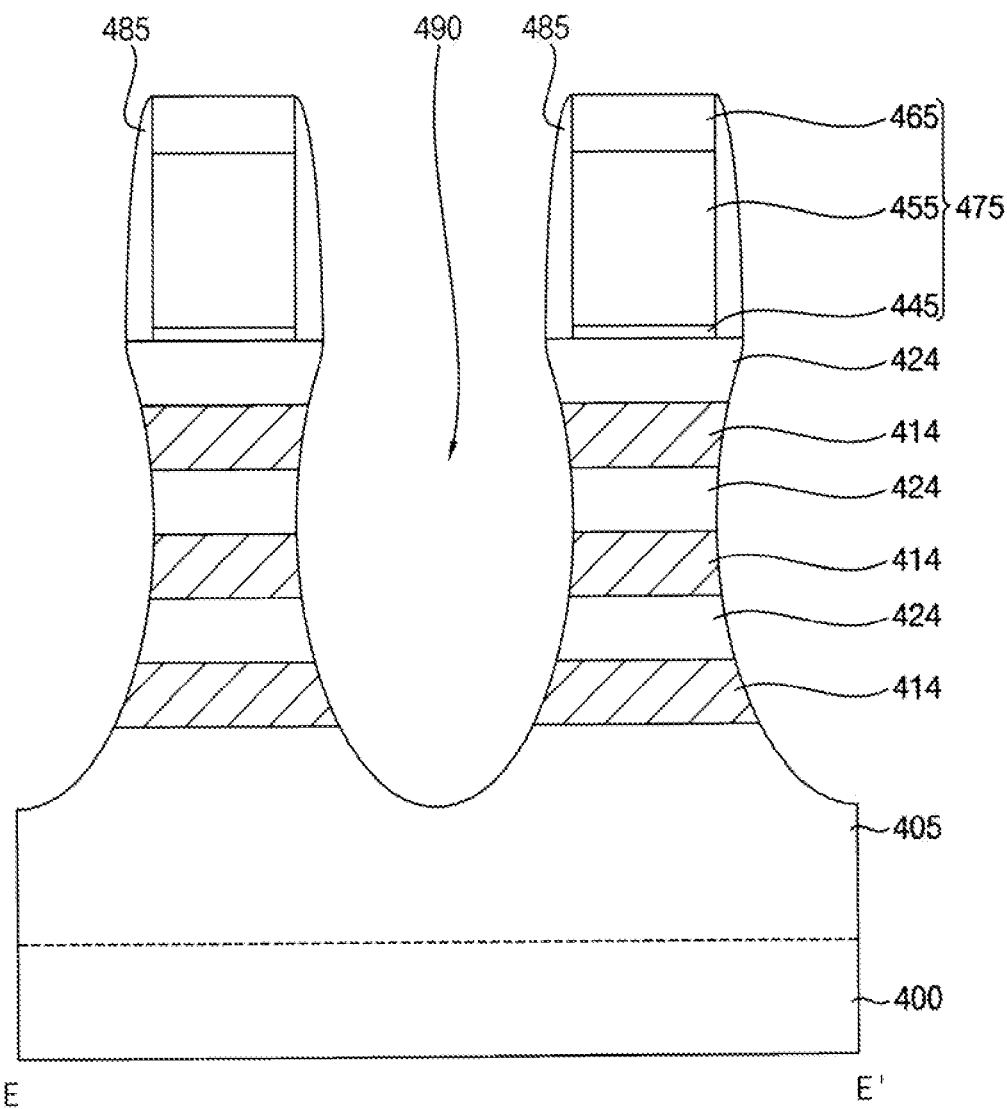

Referring to FIGS. 38 and 39, a gate spacer 485 may be formed on a sidewall of the dummy gate structure 475.

In an implementation, a spacer layer may be formed on the fin structure, the isolation pattern 430 and the dummy gate structure 475 and anisotropically etched to form the gate spacer 485 covering each of opposite sidewalls in the first direction of the dummy gate structure 475.

The fin structure and an upper portion of the active pattern 405 thereunder may be etched using the dummy gate structure 475 and the gate spacer 485 as an etching mask to form a third opening 490.

In an implementation, the sacrificial lines 412 and the semiconductor lines 422 under the dummy gate structure 475 and the gate spacer 485 may form sacrificial patterns 414 and semiconductor patterns 424, respectively, and the fin structure extending in the first direction may be divided into a plurality of pieces spaced apart from each other in the first direction.

Hereinafter, the dummy gate structure 475, the gate spacers 485 on opposite sidewalls in the first direction of the dummy gate structure 475, and the fin structure may be referred to as a first structure. In an implementation, the first structure may extend in the second direction, and a plurality of first structures may be spaced apart from each other in the first direction.

In an implementation, the third opening 490 may be formed to have a maximum volume. Thus, a sidewall of the third opening 490 may have a convex shape. Sidewalls in the first direction of the semiconductor patterns 424 may not be perpendicular, but rather may be slanted with respect to an upper surface of the substrate 400. Thus, lengths in the first direction of the semiconductor patterns 424 may not be constant in the third direction.

In an implementation, the sidewall of the third opening 490 may be substantially perpendicular with respect to the upper surface of the substrate 400, and the lengths in the first direction of the semiconductor patterns 424 may be constant.

A portion of each of the sacrificial patterns 414 adjacent to the third opening 490 may be removed to form a gap, and an inner spacer may be formed to fill the gap.

Figure 40:
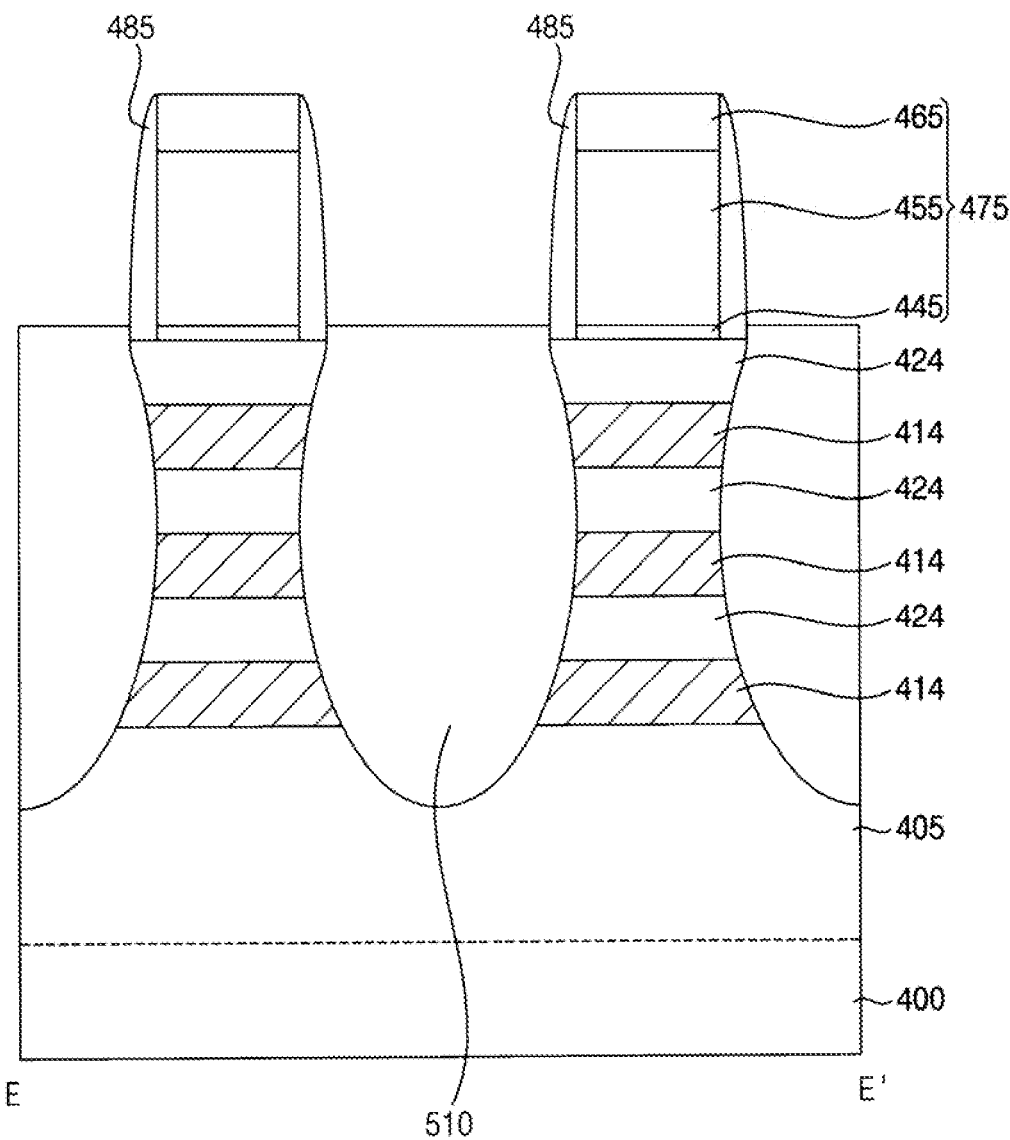

Referring to FIG. 40, a SEG process may be performed using sidewalls of the semiconductor patterns 424 and the sacrificial patterns 414 and the upper surface of the active pattern 405 exposed by the third opening 490 as a seed to form a source/drain layer 510 on an inner wall of the third opening 490.

In an implementation, the SEG process may be performed using a silicon source gas, e.g., dichlorosilane ($SiH_2Cl_2$) gas, a germanium source gas, e.g., germane ($GeH_4$) gas, and a p-type impurity source gas, e.g., diborane ($B_2H_6$) gas, so that a single crystalline silicon-germanium layer doped with p-type impurities may be formed as the source/drain layer 510. In an implementation, an upper portion of the source/drain layer 510 may contact an outer sidewall of the gate spacer 485.

In an implementation, the SEG process may be performed using a silicon source gas, e.g., disilane ($Si_2H_6$) gas and n-type impurity source gas, e.g., $PH_3$, $POCl_3$, or $P_2O_5$, so that a single crystalline silicon layer doped with n-type impurities may be formed as the source/drain layer 510.

Figure 41:
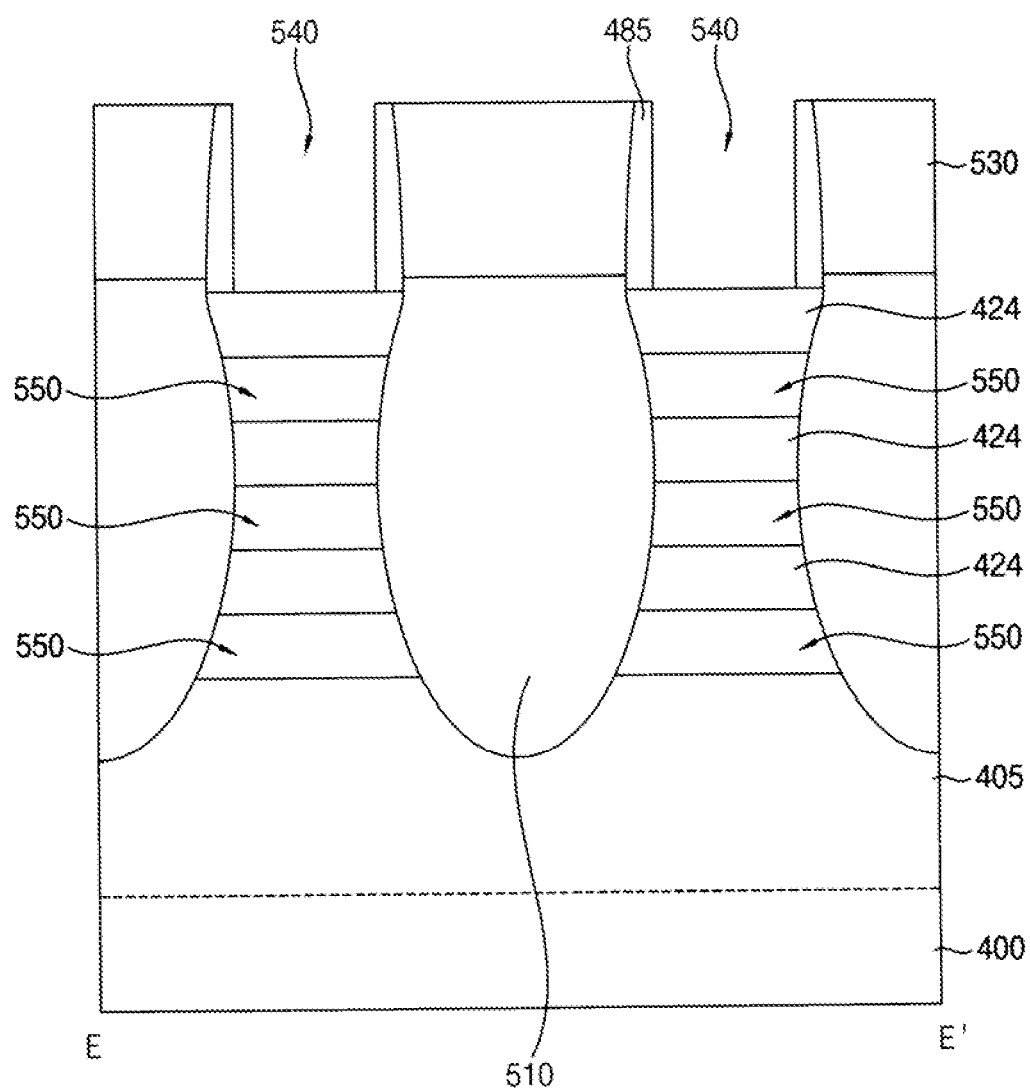

Referring to FIG. 41, a first insulating interlayer 530 may be formed on the substrate 400 to cover the first structure and the source/drain layer 510, and may be planarized until the dummy gate electrode 455 of the first structure is exposed. During the planarization process, the dummy gate mask 465 may be also removed, and an upper portion of the gate spacer 485 may be partially removed.

The exposed dummy gate electrode 455, the dummy gate insulation pattern 445 and the sacrificial patterns 414 may be removed by, e.g., a wet etching process and/or a dry etching process to form a fourth opening 540 exposing an inner sidewall of the gate spacer 485 and an upper surface of an uppermost one of the semiconductor patterns 424, and to form a fifth opening 550 exposing a sidewall of the source/drain layer 510, surfaces of the semiconductor patterns 424 and an upper surface of the active pattern 405.

Figure 42:
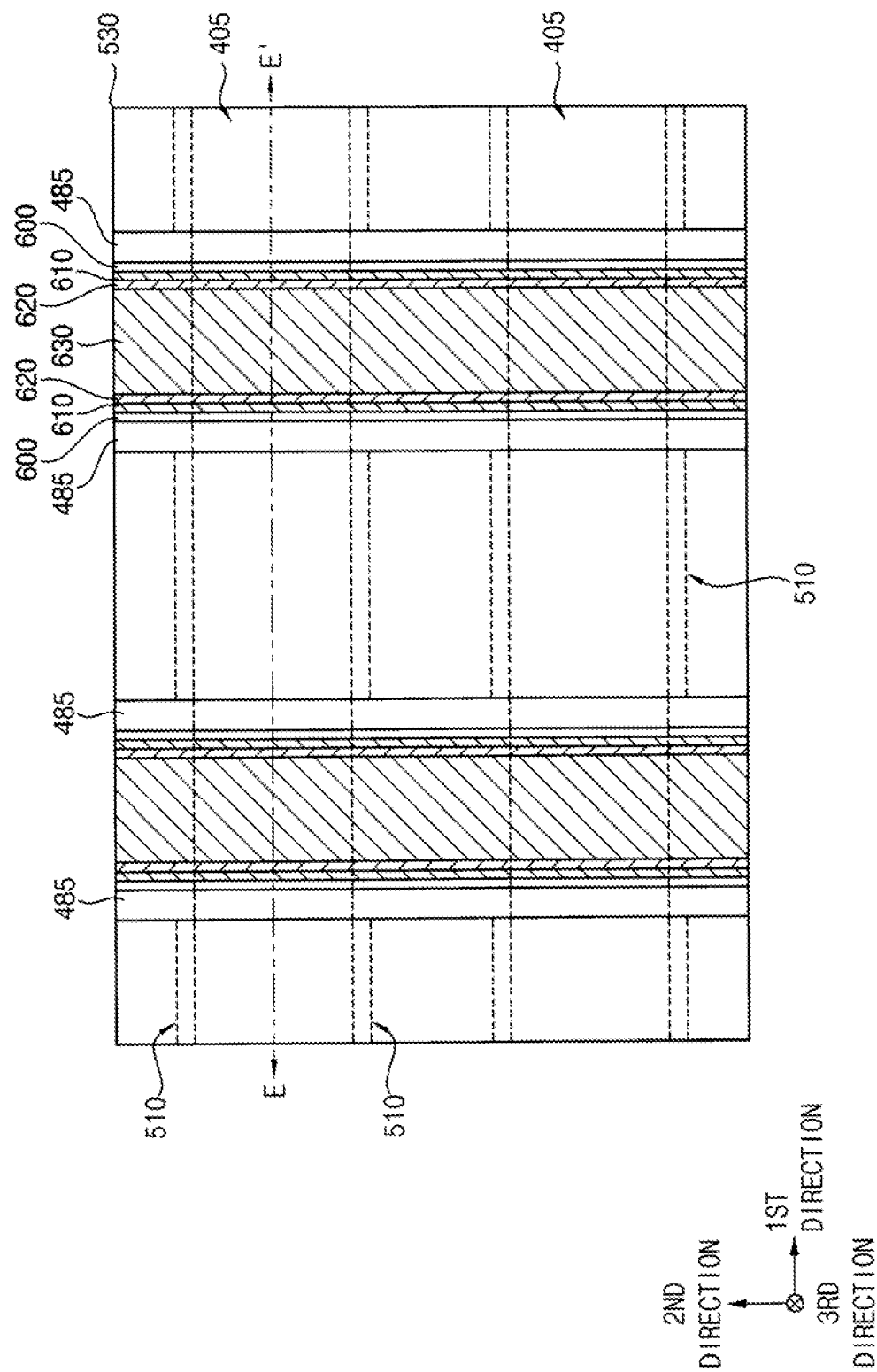
Figure 43:
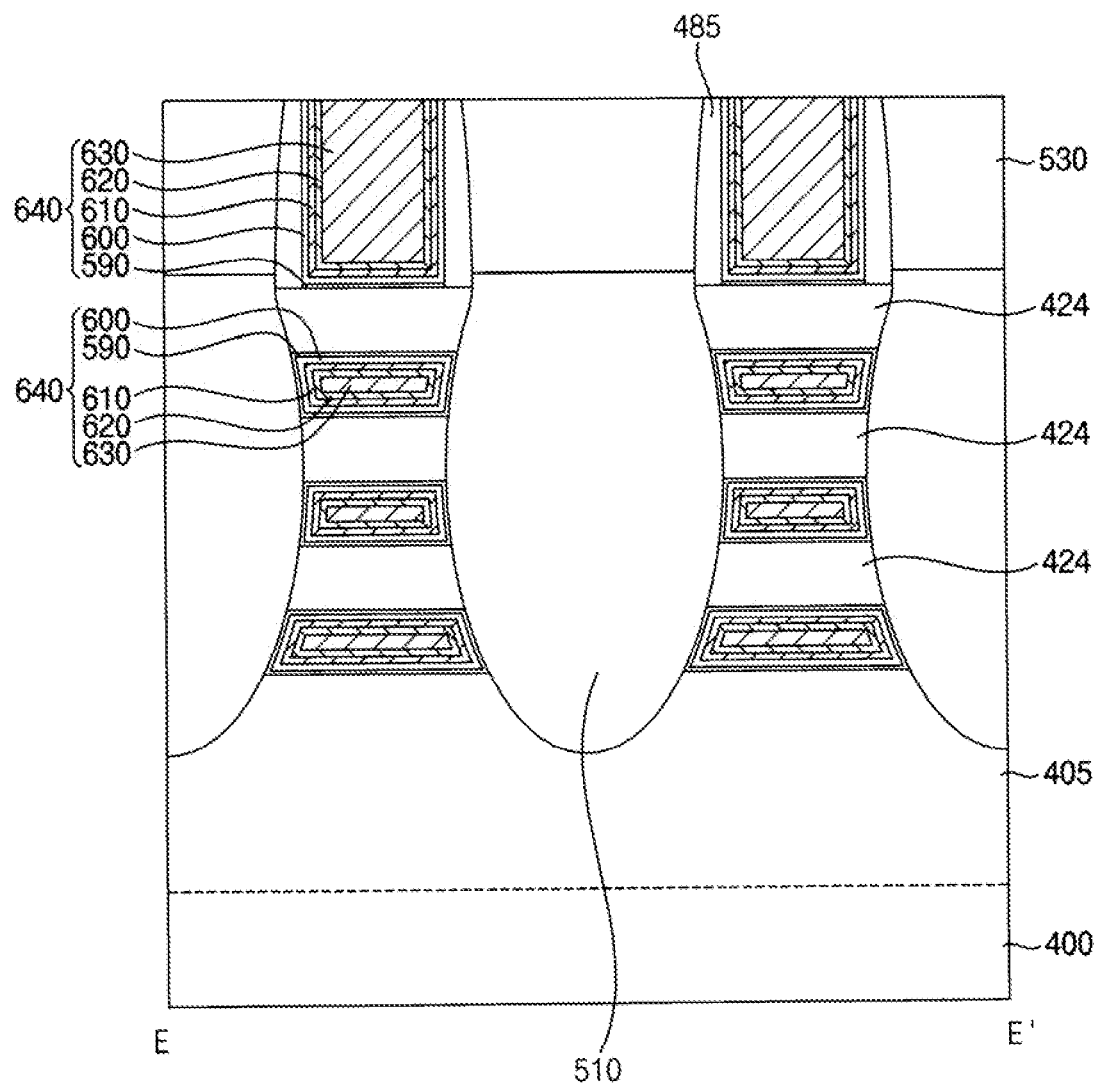

Referring to FIGS. 42 and 43, a first gate structure 640 may be formed on the substrate 400 to fill the fourth and fifth openings 540 and 550.

In an implementation, a thermal oxidation process may be performed on the upper surface of the active pattern 405, the surfaces of the semiconductor patterns 424 and the sidewall of the source/drain layer 510 exposed by the fourth and fifth openings 540 and 550 to form an interface pattern 590, a gate insulation layer, a gate barrier layer and a first gate electrode layer may be sequentially and conformally formed on a surface of the interface pattern 590, an inner sidewall and an upper surface of the gate spacer 485 and an upper surface of the first insulating interlayer 530, and a second gate electrode layer may be formed to fill remaining portions of the fourth and fifth openings 540 and 550.

The gate insulation layer, the gate barrier layer, and the first and second gate electrode layers may be formed by, e.g., a CVD process, an ALD process, a PVD process, or the like. In an implementation, the interface pattern 590 may be formed by a CVD process, an ALD process, or the like, instead of the thermal oxidation process, and may be also formed on the inner sidewall and the upper surface of the gate spacer 485 and the upper surface of the first insulating interlayer 530.

The first and second gate electrode layers, the gate barrier layer and the gate insulation layer may be planarized until the upper surface of the first insulating interlayer 530 is exposed, so that first and second gate electrodes 620 and 630, a gate barrier 610, and a gate insulation pattern 600 may be formed. The interface pattern 590, the gate insulation pattern 600, the gate barrier 610, and the first and second gate electrodes 620 and 630 may form the first gate structure 640, and the first and second gate electrodes 620 and 630 may form a gate electrode structure.

Figure 44:
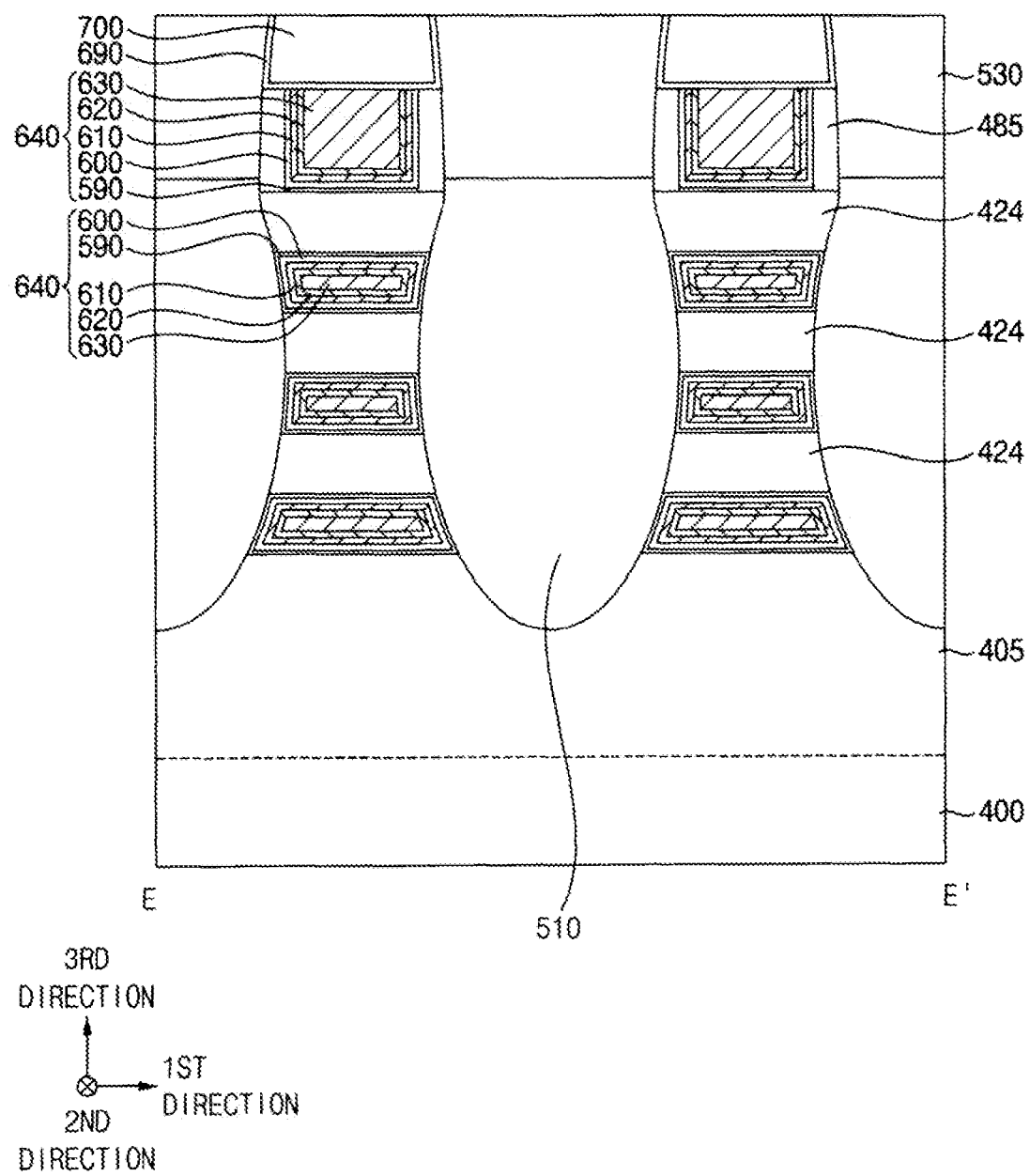

Referring to FIG. 44, processes substantially the same as or similar to those illustrated with reference to FIG. 18 may be performed, so that a fourth recess may be formed on the first gate structure 640 and the gate spacer 485, a polishing stop pattern 690 may be formed on a bottom and a sidewall of the fourth recess, and a capping layer 700 may be formed to fill the fourth recess.

Figure 45:
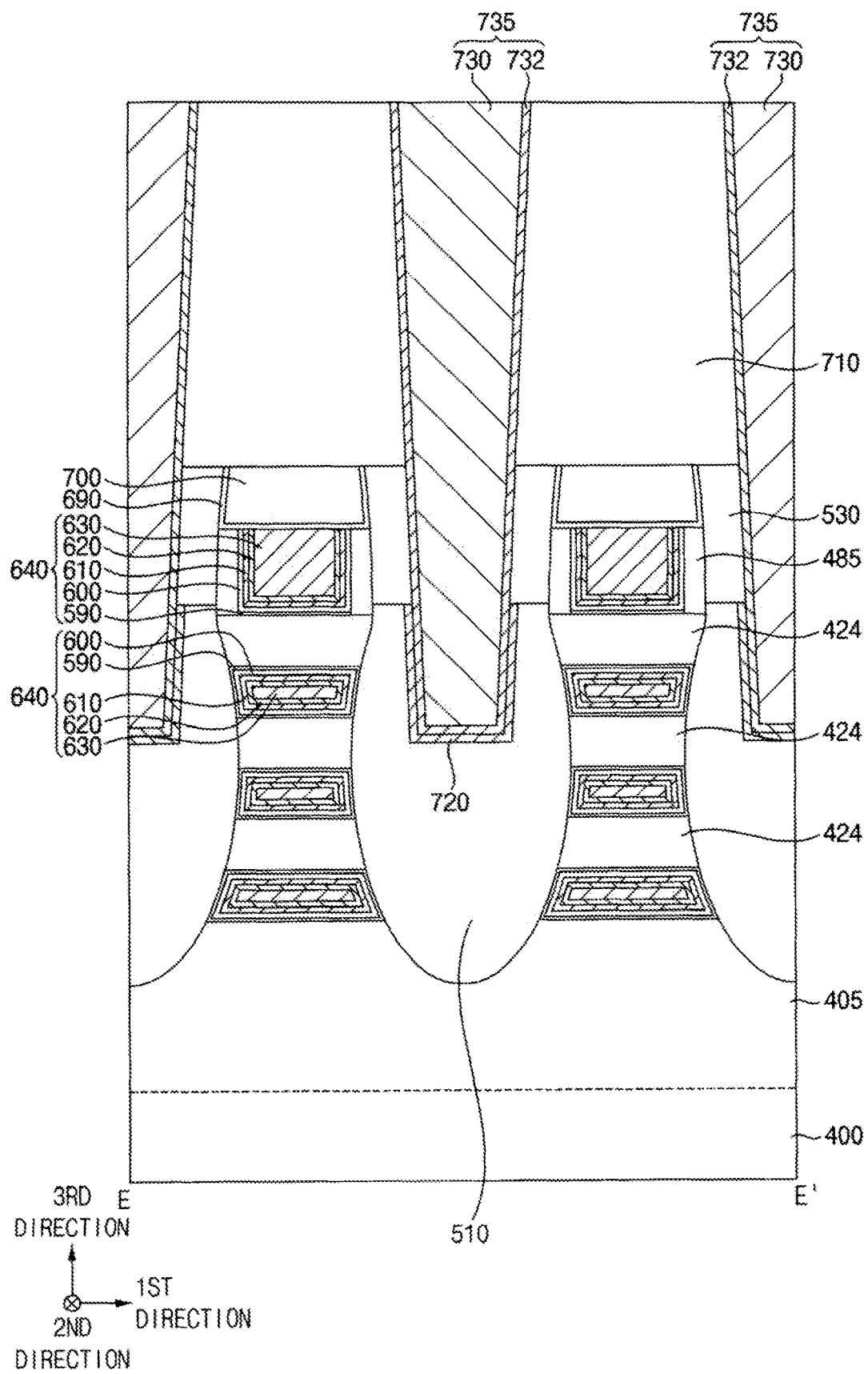

Referring to FIG. 45, processes substantially the same as or similar to those illustrated with reference to FIGS. 19 and 20 may be performed, so that a second insulating interlayer 710 may be formed on the first insulating interlayer 530, the polishing stop pattern 690, and the capping layer 700, and a first contact plug 735 may be formed through the first and second insulating interlayers 530 and 710 to contact an upper surface of the source/drain layer 510.

Before forming the first contact plug 735, a silicidation process may be further performed to form a metal silicide pattern 720 on the upper surface of the source/drain layer 510.

Figure 46:
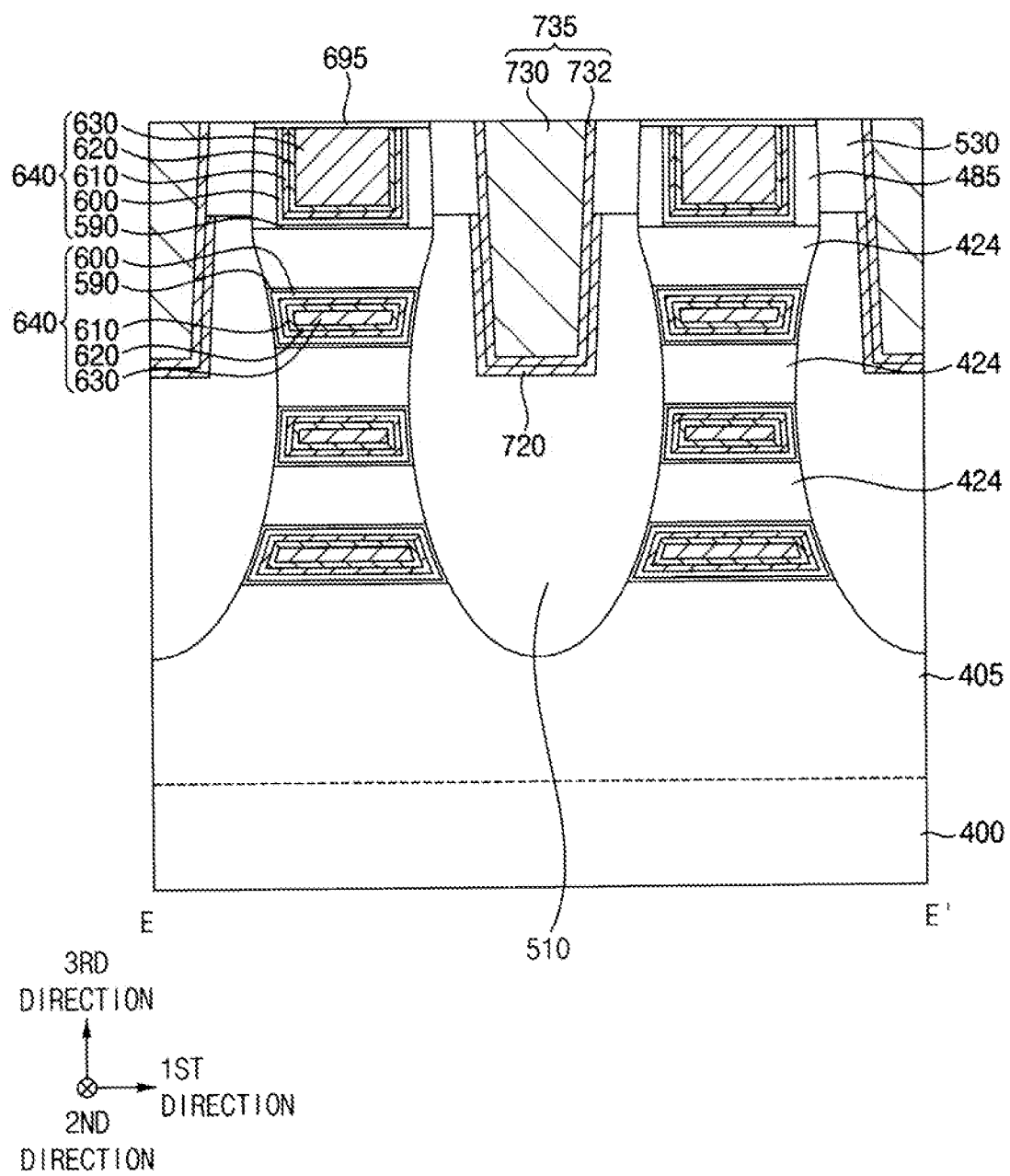

Referring to FIG. 46, processes substantially the same as or similar to those illustrated with reference to FIGS. 21 and 22 may be performed, so that a CMP process may be performed until an upper surface of a first portion of the polishing stop pattern 690 is exposed to remove the second insulating interlayer 710, the capping layer 700, and upper portion of the first contact plug 735 and an upper portion of the first insulating interlayer 530, and a remaining portion of the first portion of the polishing stop pattern 690 may form a polishing stop pattern 695.

Referring to FIGS. 30 to 32, processes substantially the same as or similar to those illustrated with reference to FIGS. 1 to 4 may be performed, so that an etch stop layer 740 and a third insulating interlayer 750 may be sequentially formed on the polishing stop pattern 695, the first contact plug 735 and the first insulating interlayer 530, and a second contact plug 765 extending through the etch stop layer 740 and the third insulating interlayer 750 to contact an upper surface of the first contact plug 735 and a third contact plug 775 extending through the third insulating interlayer 750, the etch stop layer 740 and the polishing stop pattern 695 to contact an upper surface of the gate electrode structure may be formed. The semiconductor device may be manufactured by the above processes.

Figure 47:
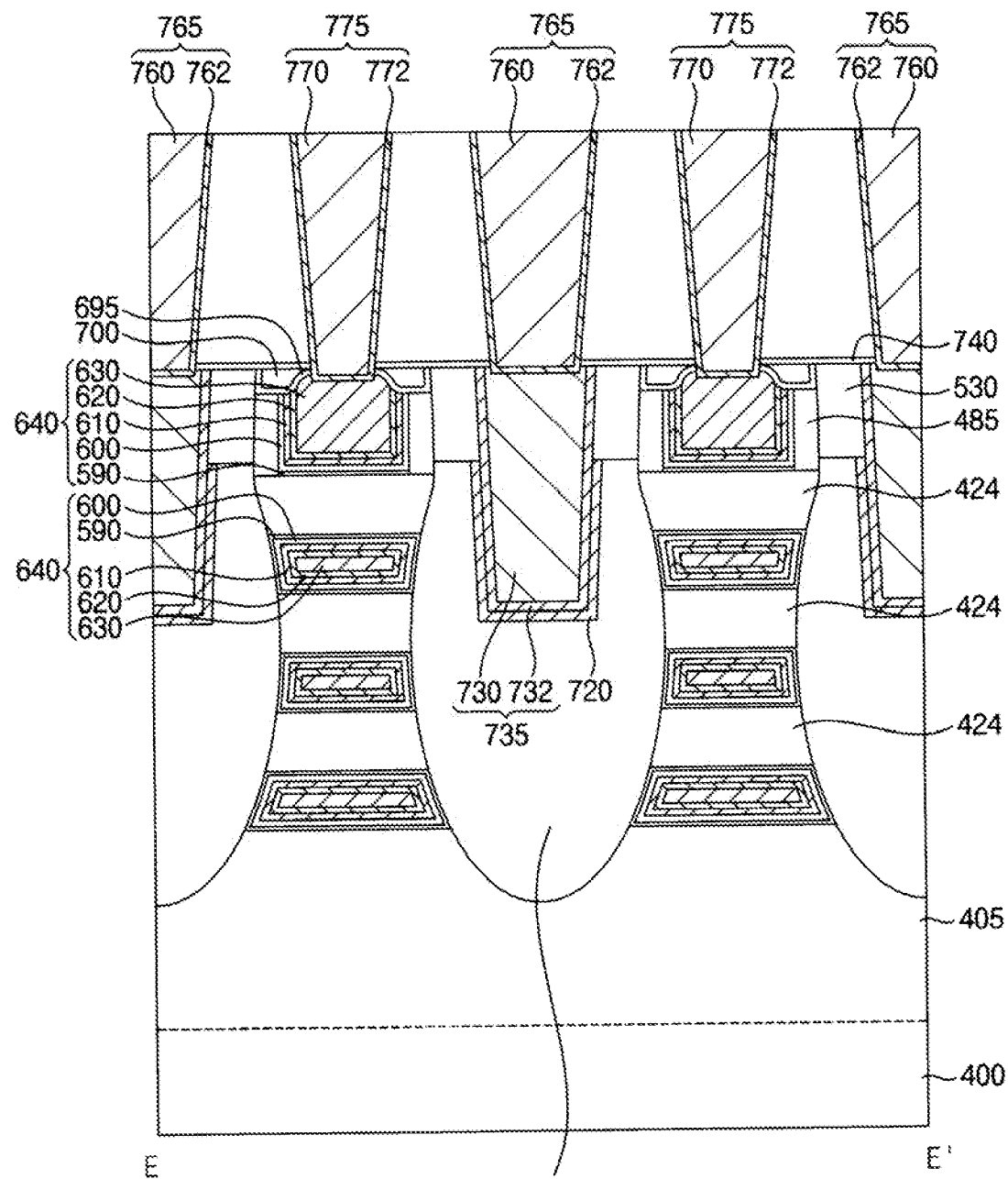
FIG. 47 is a cross-sectional view of a semiconductor device in accordance with example embodiments.

FIG. 47 is a cross-sectional view of a semiconductor device in accordance with example embodiments. FIG. 47 is a cross-sectional view taken along a line E-E' of FIG. 30.

Referring to FIG. 47, the semiconductor device may include the first gate structure 640, the polishing stop pattern 695, and the capping layer 700 that may be similar to the first gate structure 270, the polishing stop pattern 295 and the capping layer 300, respectively, shown in FIG. 23.

In an implementation, an upper surface of the second gate electrode 630 in the first gate structure 640 may be higher than upper surfaces of other portions of the first gate structure 640 and an upper surface of the gate spacer 485, and the polishing stop pattern 695 on the first gate structure 640 may include a first portion and a second portion extending in the third direction from an end in the first direction of the first portion. An upper surface of a central portion of the first portion of the polishing stop pattern 695 may be higher than an upper surface of an edge portion of the first portion of the polishing stop pattern 695, and an upper surface of the second portion of the polishing stop pattern 695 may be substantially coplanar with the upper surface of the central portion of the first portion of the polishing stop pattern 695.

The capping layer 300 may be formed on the polishing stop pattern 695, and an upper surface of the capping layer 300 may be substantially coplanar with the upper surface of the central portion of the first portion of the polishing stop pattern 695 or the upper surface of the second portion of the polishing stop pattern 695.

In an implementation, the first gate structure 640 and a second gate structure may be formed on first and second regions, respectively, of the substrate 400 as in the semiconductor device shown in FIG. 26 or FIG. 29, and the polishing stop pattern 695 and the capping layer 700 may be formed on the first gate structure 640 and the second gate structure.

Figure 48:
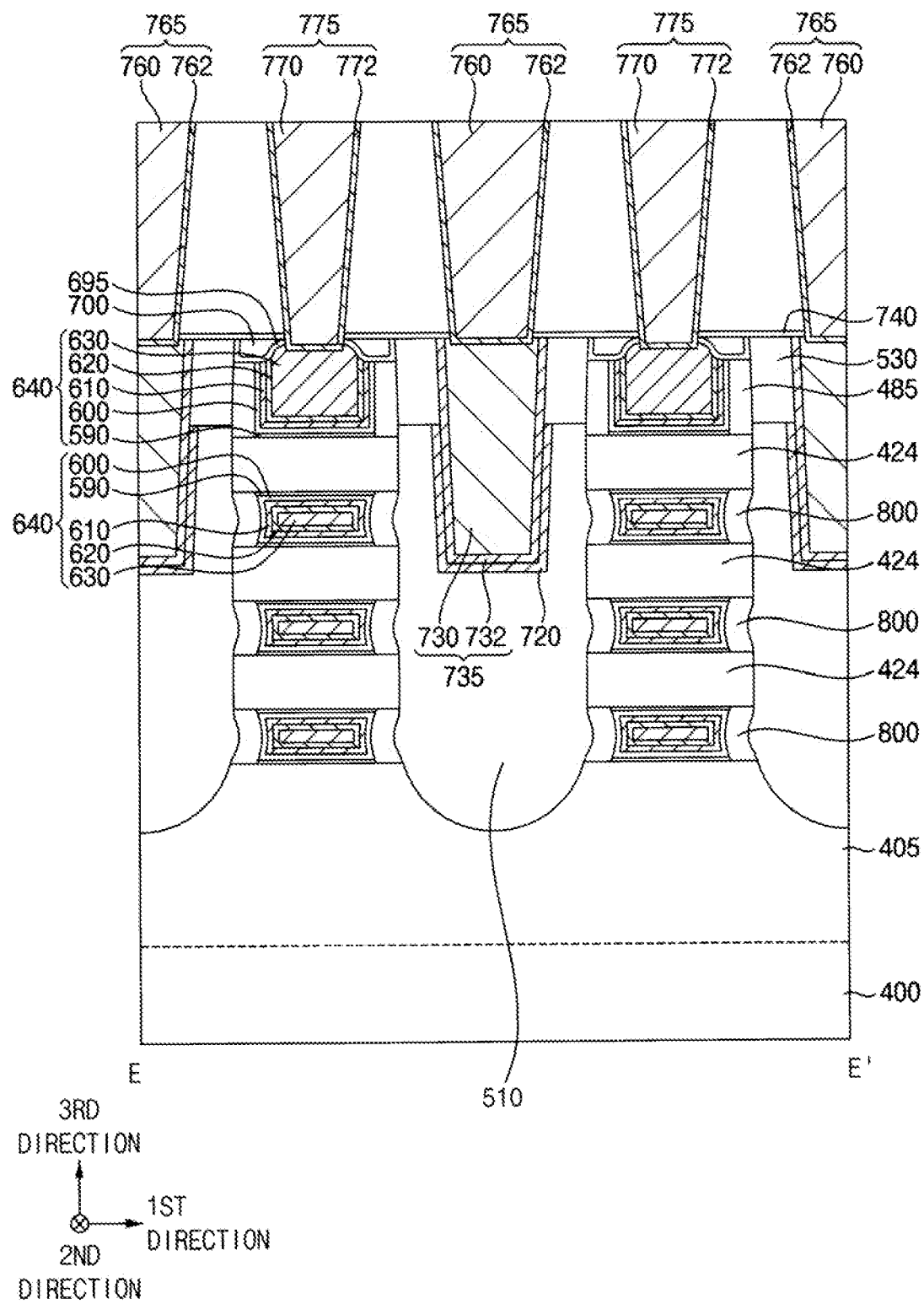
FIG. 48 is a cross-sectional view of a semiconductor device in accordance with example embodiments.

FIG. 48 is a cross-sectional view of a semiconductor device in accordance with example embodiments. FIG. 48 is a cross-sectional view taken along a line E-E' of FIG. 30.

Referring to FIG. 48, the semiconductor device may further include an inner spacer 800 between the source/drain layer 510 and the first gate structure 640.

The inner spacer 800 may be between the semiconductor patterns 424 spaced apart from each other in the third direction and between the active pattern 405 and a lowermost one of the semiconductor patterns 424, and may contact a lower sidewall of the first gate structure 640. Thus, the first gate structure 640 may not directly contact the source/drain layer 510.

The inner spacer 800 may have various shapes, e.g., may include a cross-section in the first direction having a horseshoe shape. The inner spacer 800 may include a nitride, e.g., silicon nitride.

The semiconductor device may be used in various types of memory devices and/or systems including contact plugs. In an implementation, the semiconductor device may be applied to contact plugs in a logic device such as a central processing unit (CPU), an application processor (AP), or the like. In an implementation, the semiconductor device may be applied to contact plugs in a peripheral circuit region or a cell region used in a volatile memory device such as a DRAM device, an SRAM device, or the like, or in a non-volatile memory device such as a flash memory device, a PRAM device, an MRAM device, an RRAM device, or the like.

By way of summation and review, in order for the metal gate electrode and the contact plug to not be electrically shorted by misalignment, the capping layer may have a thick thickness. The vertical thickness of the contact plug may increase, which could cause the increase of parasitic capacitance and resistance.

One or more embodiments may provide a semiconductor device having a contact plug.

One or more embodiments may provide a semiconductor device having enhanced characteristics.

In the semiconductor device in accordance with example embodiments, the parasitic capacitance by the contact plugs and the insulating interlayer therebetween may be reduced, and the resistance of the contact plugs may be reduced. Accordingly, an RC-delay of electrical signals through the contact plugs may be reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A semiconductor device, comprising:
 a substrate;
 a gate structure on the substrate;
 a gate spacer on a sidewall of the gate structure; and
 a polishing stop pattern on the gate structure and the gate spacer, the polishing stop pattern including:
  a first portion covering an upper surface of the gate structure and an upper surface of the gate spacer; and
  a second portion extending from the first portion in a vertical direction substantially perpendicular to and away from an upper surface of the substrate; and
 a capping layer on the polishing stop pattern,
 wherein:
 an upper surface of a central portion of the first portion of the polishing stop pattern is higher than an upper surface of an edge portion of the first portion thereof,
 the upper surface of the central portion of the first portion of the polishing stop pattern is substantially coplanar with an upper surface of the second portion thereof, and an upper surface of the capping layer is substantially coplanar with the upper surface of the central portion of the first portion of the polishing stop pattern or the upper surface of the second portion of the polishing stop pattern.

2. The semiconductor device as claimed in claim 1, wherein:
the substrate includes a first region and a second region,
the gate structure is a first gate structure on the first region of the substrate,
the gate spacer, the polishing stop pattern, and the capping layer are a first gate spacer, a first polishing stop pattern and a first capping layer, respectively,
the semiconductor device further comprises:
a second gate structure on the second region of the substrate;
a second gate spacer on a sidewall of the second gate structure;
a second polishing stop pattern on the second gate structure and the second gate spacer; and
a second capping layer on the second polishing stop pattern, the second polishing stop pattern including:
a first portion covering an upper surface of the second gate structure and an upper surface of the second gate spacer; and
a second portion extending from the first portion in the vertical direction, and
an upper surface of the second capping layer is substantially coplanar with an upper surface of the second portion of the second polishing stop pattern.

3. The semiconductor device as claimed in claim 1, wherein an upper surface of a central portion of the gate structure contacting the central portion of the first portion of the polishing stop pattern is higher than an upper surface of an edge portion of the gate structure.

4. The semiconductor device as claimed in claim 3, wherein:
the gate structure includes:
a second gate electrode;
a first gate electrode covering a sidewall and a lower surface of the second gate electrode;
a gate barrier covering a sidewall and a lower surface of the first gate electrode; and
a gate insulation pattern covering a sidewall and a lower surface of the gate barrier, and
an upper surface of the second gate electrode is higher than an uppermost surface of each of the first gate electrode, the gate barrier, and the gate insulation pattern.

5. The semiconductor device as claimed in claim 4, wherein:
the second gate electrode includes tungsten,
the first gate electrode includes titanium aluminum carbide, and
the gate barrier includes titanium nitride.

6. The semiconductor device as claimed in claim 1, wherein the polishing stop pattern includes silicon carbide, silicon oxycarbide, silicon carbonitride, silicon oxycarbonitride, or an amorphous carbon layer.

7. The semiconductor device as claimed in claim 1, wherein the polishing stop pattern includes polysilicon or boronitride.

8. The semiconductor device as claimed in claim 1, wherein the polishing stop pattern includes a transition metal.

9. The semiconductor device as claimed in claim 1, further comprising:
a source/drain layer on a portion of the substrate adjacent to the gate structure;
a first insulating interlayer on the source/drain layer, the first insulating interlayer covering a sidewall of the gate spacer and a sidewall of the polishing stop pattern; and
a first contact plug extending through the first insulating interlayer to contact an upper surface of the source/drain layer,
wherein an upper surface of the first contact plug is substantially coplanar with the upper surface of the central portion of the first portion of the polishing stop pattern or the upper surface of the second portion of the polishing stop pattern.

10. The semiconductor device as claimed in claim 9, further comprising an etch stop layer commonly on the polishing stop pattern, the first insulating interlayer, and the first contact plug.

11. The semiconductor device as claimed in claim 10, further comprising:
a second contact plug extending through the etch stop layer to contact an upper surface of the first contact plug; and
a third contact plug extending through the etch stop layer and the polishing stop pattern to contact an upper surface of the gate structure.

12. A semiconductor device, comprising:
a substrate;
a gate structure on the substrate;
a gate spacer on a sidewall of the gate structure; and
a polishing stop pattern on the gate structure and the gate spacer, the polishing stop pattern including:
a first portion covering an upper surface of the gate structure and an upper surface of the gate spacer; and
a second portion extending from the first portion in a vertical direction substantially perpendicular to and away from an upper surface of the substrate,
wherein:
an upper surface of a central portion of the first portion of the polishing stop pattern is higher than an upper surface of an edge portion of the first portion thereof,
the upper surface of the central portion of the first portion of the polishing stop pattern is substantially coplanar with an upper surface of the second portion thereof, and
an upper surface of a central portion of the gate structure contacting the central portion of the first portion of the polishing stop pattern is higher than an upper surface of an edge portion of the gate structure.

* * * * *